(12) United States Patent
Sakata et al.

(10) Patent No.: US 8,450,144 B2
(45) Date of Patent: May 28, 2013

(54) SEMICONDUCTOR DEVICE AND METHOD FOR MANUFACTURING THE SAME

(75) Inventors: Junichiro Sakata, Atsugi (JP); Hideyuki Kishida, Atsugi (JP); Hiroki Ohara, Sagamihara (JP); Toshinari Sasaki, Atsugi (JP); Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 358 days.

(21) Appl. No.: 12/722,795

(22) Filed: Mar. 12, 2010

(65) Prior Publication Data

US 2010/0244020 A1 Sep. 30, 2010

(30) Foreign Application Priority Data

Mar. 26, 2009 (JP) .................. 2009-077386

(51) Int. Cl.
*H01L 21/00* (2006.01)
(52) U.S. Cl.
USPC ...................... 438/104; 257/E21.46
(58) Field of Classification Search
USPC ............... 438/104, 151, 778; 257/E21.46
See application file for complete search history.

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |
| 5,847,410 A | 12/1998 | Nakajima |
| 6,294,274 B1 | 9/2001 | Kawazoe et al. |
| 6,563,174 B2 | 5/2003 | Kawasaki et al. |
| 6,586,346 B1 | 7/2003 | Yamazaki et al. |
| 6,727,522 B1 | 4/2004 | Kawasaki et al. |
| 6,960,812 B2 | 11/2005 | Yamazaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Miyasako, et al. "Ferroelectric-gate thin-film transistors using indium-tin-oxide channel with large charge controllability," Applied Physics Letters, 86, No. 16, 2005, pp. 162902-1-162902-3.

(Continued)

*Primary Examiner* — Colleen Matthews
(74) *Attorney, Agent, or Firm* — Eric J. Robinson; Robinson Intellectual Property Law Office, P.C.

(57) ABSTRACT

An object of an embodiment of the present invention is to provide a semiconductor device provided with a thin film transistor which includes an oxide semiconductor layer and has high electric characteristics. The semiconductor device includes a gate electrode over an insulating surface, an oxide semiconductor layer including silicon oxide, an insulating layer between the gate electrode and the oxide semiconductor layer, and source and drain regions between the oxide semiconductor layer including silicon oxide and source and drain electrode layers. The source and drain regions are formed using a degenerate oxide semiconductor material or a degenerate oxynitride material.

5 Claims, 36 Drawing Sheets

U.S. PATENT DOCUMENTS

| | | |
|---|---|---|
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,301,211 B2 | 11/2007 | Yamazaki et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1* | 3/2007 | Akimoto et al. ............ 438/795 |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0203387 A1 | 8/2008 | Kang et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308796 A1 | 12/2008 | Akimoto et al. |
| 2008/0308797 A1 | 12/2008 | Akimoto et al. |
| 2008/0308804 A1 | 12/2008 | Akimoto et al. |
| 2008/0308805 A1 | 12/2008 | Akimoto et al. |
| 2008/0308806 A1 | 12/2008 | Akimoto et al. |
| 2009/0008639 A1 | 1/2009 | Akimoto et al. |
| 2009/0065771 A1 | 3/2009 | Iwasaki et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0025678 A1 | 2/2010 | Yamazaki et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0295042 A1* | 11/2010 | Yano et al. ............ 257/43 |

FOREIGN PATENT DOCUMENTS

| | | |
|---|---|---|
| JP | 60-198861 | 10/1985 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 03-231472 A | 10/1991 |
| JP | 05-251705 A | 9/1993 |
| JP | 06-032617 * | 2/1994 |
| JP | 08-264794 | 10/1996 |
| JP | 08-264794 A | 10/1996 |
| JP | 11-505377 | 5/1999 |
| JP | 2000-044236 A | 2/2000 |
| JP | 2000-150900 | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 | 4/2004 |
| JP | 2004-273614 A | 9/2004 |
| JP | 2004-273732 A | 9/2004 |
| JP | 2007-096055 | 4/2007 |
| JP | 2007-123861 | 5/2007 |
| JP | 2007-250983 A | 9/2007 |
| WO | WO-2004/114391 | 12/2004 |
| WO | WO-2007/119386 | 10/2007 |

OTHER PUBLICATIONS

Nishii et al., "High-Mobility Field-Effect Transistors Based on Single-Crystalline ZnO Channels," Japanese Journal of Applied Physics, vol. 44, No. 38, 2005, pp. L1193-L1195.

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Hayashi.R et al., "42.1: Invited Paper: Improved Amorphous In-Ga-Zn-O TFTS,", SID Digest '08 : SID International Symposium Digest of Technical Papers, May 20, 2008, vol. 39, pp. 621-624.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Son.K et al., "42.4L: Late-News Paper: 4 Inch QVGA AMOLED Driven by the Threshold Voltage Controlled Amorphous GIZO (Ga2O3-In2O3-ZnO) TFT,", SID Digest '08 : SID International Symposium Digest of Technical Papers, May 20, 2008, vol. 39, pp. 633-636.

Van De Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In-Ga-Zn-O TFTs for Flat Panel Displays,", AM-FPD '08 Digest of Technical Papers, Jul. 2, 2008, pp. 251-252, The Japan Society of Applied Physics.

Nakamura, "Synthesis of Homologous Compound with New Long-Period Structure,", NIRIM Newsletter, Mar. 1, 1995, vol. 150, pp. 1-4.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics), 2006, vol. 45, No. 5B, pp. 4303-4308.

Janotti.A et al., "Native Point Defects in ZnO,", Phys. Rev. B (Physical Review. B), 2007, vol. 76, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGeO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.

Prins et al., "A Ferroelectric Transparent Thin-Film Transistor," Appl. Phys. Lett. (Applied Physics Letters), Jun. 17, 1996, vol. 68, No. 25, pp. 3650-3652.

Nakamura et al., "The Phase Relations in the $In_2O_3$-$Ga_2ZnO_4$-ZnO System at 1350° C.," Journal of Solid State Chemistry, Aug. 1, 1991, vol. 93, No. 2, pp. 298-315.

Kimizuka et al., "Syntheses and Single-Crystal Data of Homologous Compounds, $In_2O_3(ZnO)_m$ ($m$ = 3, 4, and 5), $InGaO_3(ZnO)_3$, and $Ga_2O_3(ZnO)_m$ ($m$ = 7, 8, 9, and 16) in the $In_2O_3$-$ZnGa_2O_4$-ZnO System," Journal of Solid State Chemistry, Apr. 1, 1995, vol. 116, No. 1, pp. 170-178.

Nakamura et al., "Syntheses and crystal structures of new homologous compounds, indium iron zinc oxides ($InFeO_3(ZnO)_m$) ($m$: natural number) and related compounds," Kotai Butsuri (Solid State Physics), 1993, vol. 28, No. 5, pp. 317-327 (with full translation).

Nomura et al., "Thin-Film Transistor Fabricated in Single-Crystalline Transparent Oxide Semiconductor," Science, May 23, 2003, vol. 300, pp. 1269-1272.

Nomura et al., "Room-Temperature Fabrication of Transparent Flexible Thin-Film Transistors Using Amorphous Oxide Semiconductors," Nature, Nov. 25, 2004, vol. 432, pp. 488-492.

Park.J et al., "Amorphous Indium-Gallium-Zinc Oxide TFTs and Their Application for Large Size AMOLED,", AM-FPD '08 Digest of Technical Papers, Jul. 2, 2008, pp. 275-278.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Osada.T et al., "15.2: Development of Driver-Integrated Panel using Amorphous In-Ga-Oxide TFT,", SID Digest '09 : SID International Symposium Digest of Technical Papers, May 31, 2009, pp. 184-187.

Li.C et al., "Modulated Structures of Homologous Compounds $InMO_3(ZnO)_m$ (M=In,Ga; m=Integer) Described by Four Dimensional Superspace Group,", Journal of Solid State Chemistry, 1998, vol. 139, pp. 347-355.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs,", SID Digest '09 : SID International Symposium Digest of Technical Papers, May 31, 2009, pp. 899-902.

Kanno.H et al., "White Stacked Electrophosphorecent Organic Light-Emitting Device Employing $MoO_3$ as a Change-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In-Ga-Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition: The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In-Ga-Zn-Oxide TFTs,", IDW '09 : Proceedings of the 16th International Display Workshops, 2009, pp. 689-692.

Park.J et al., "Amorphous Indium-Gallium-Zinc Oxide TFTs and Their Application for Large Size AMOLED,", AM-FPD '08 Digest of Technical Papers, Jul. 2, 2008, pp. 275-277.

Park.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure for Amorphous In-Ga-Zn-Oxide TFT,", AM-FPD '09 Digest of Technical Papers, Jul. 1, 2009, pp. 41-44.

Osada.T et al., "Development of Driver-Integrated Panel Using Amorphous In-Ga-Zn-Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDs,", Journal of the SID , 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In-Ga-Zn-Oxide TFT,", SID Digest '09 : SID International Symposium Digest of Technical Papers, May 31, 2009, pp. 1110-1112.

Ohara.H et al., "21.3:4.0 In. QVGA AMOLED Display Using In-Ga-Zn-Oxide TFTs With a Novel Passivation Layer,", SID Digest '09 : SID International Symposium Digest of Technical Papers, May 31, 2009, pp. 284-287.

Miyasaka.M, "58.2 Invited Paper : Suftla Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, 2009, pp. 395-398.

Lee.H et al., "Current Status of, Challenges to, and Perspective View of AM-OLED,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Kikuchi.H et al., "Polymer-Stabilized Liquid Crystal Blue Phases,", Nature Materials, Sep. 2, 2002, vol. 1, pp. 64-68.

Kimizuka.N et al., "Spinel, $YbFe_2O_4$, and $Yb_2Fe_3O_7$ Types of Structures for Compounds in the $In_2O_3$ and $Sc_2O_3$-$A_2O_3$-BO Systems [A: Fe, Ga, or Al; B: Mg, Mn, Fe, Ni, Cu, or Zn] at Temperatures Over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Chiang et al., "High mobility transparent thin-film transistors with amorphous zinc tin oxide channel layer", Applied Physics Letters, 86, No. 16, 2005, pp. 013503-1-013503-3.

Minami et al., "Highly Transparent and Conductive Zinc-Stannate Thin Films Prepared by RF Magnetron Sputtering", Jpn. J. Appl. Phys. vol. 33, (1994) pp. L1693-L1696, Part 2, No. 12A, Dec. 1, 1994.

* cited by examiner

Number of atoms: 896
Density: 5.68 g/cm³
a~2.27 nm
b~2.25 nm
c~2.08 nm
$\alpha = \beta = \gamma = 90°$

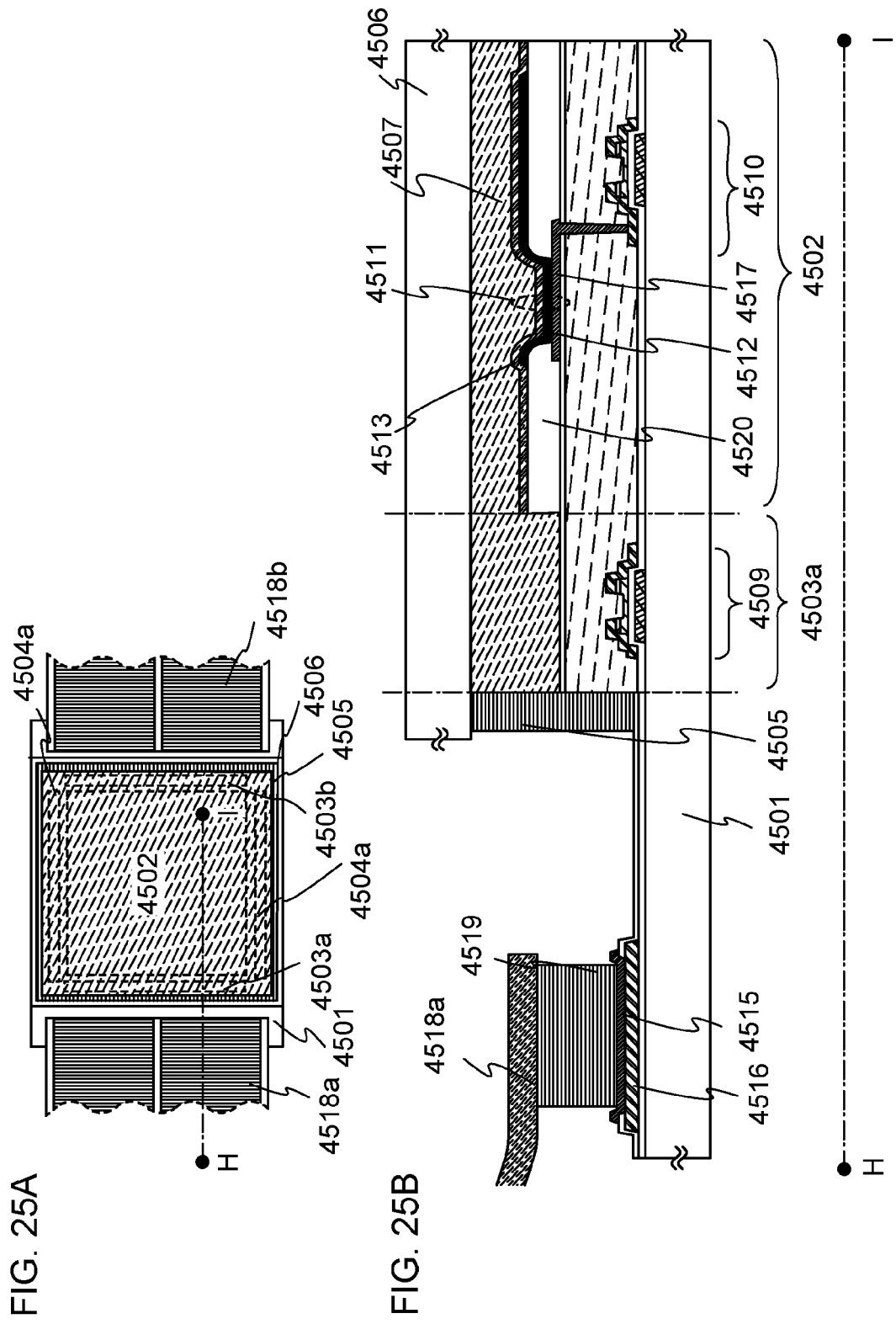

FIG. 29A
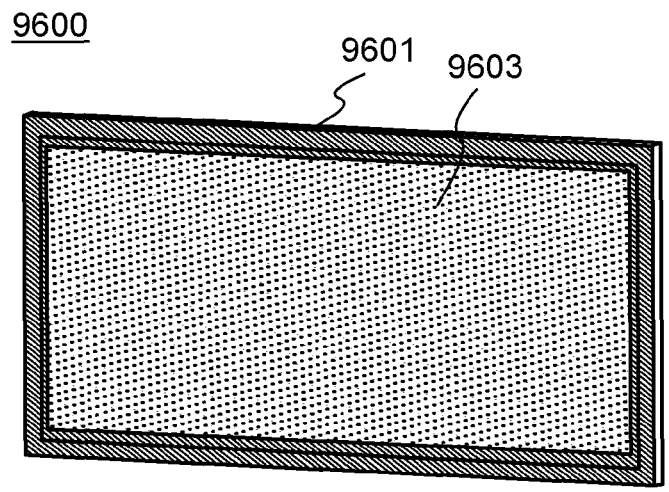
FIG. 29B
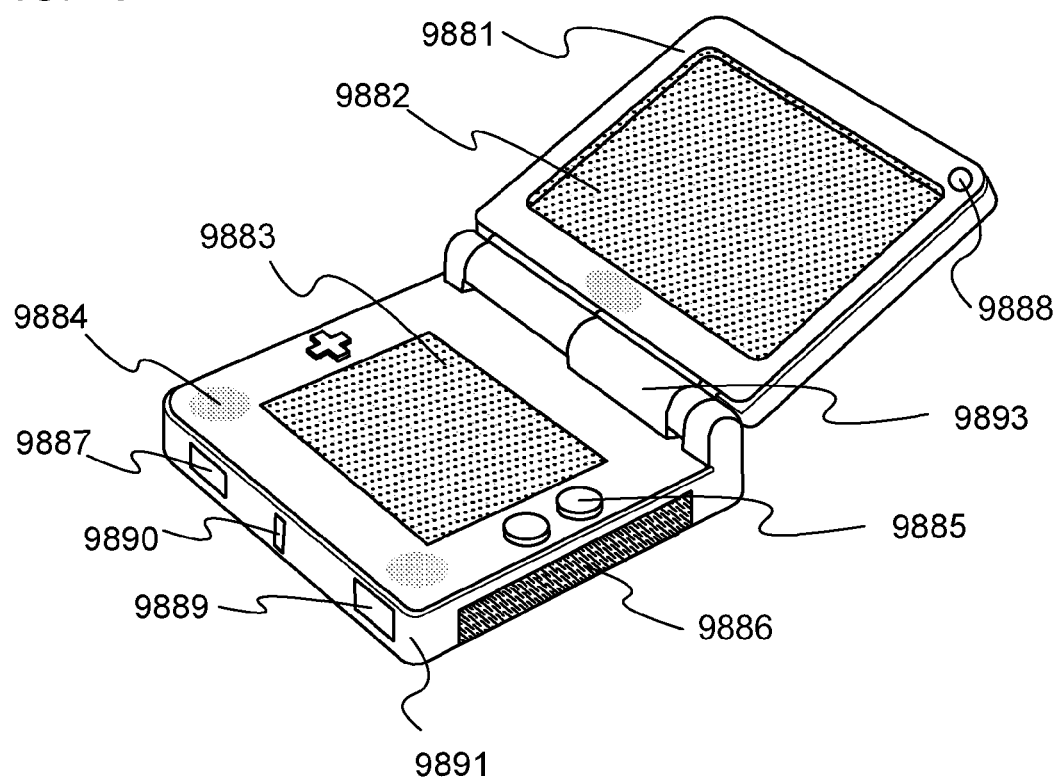

SEMICONDUCTOR DEVICE AND METHOD FOR MANUFACTURING THE SAME

BACKGROUND OF THE INVENTION

1. Field of the Invention

The present invention relates to a semiconductor device having a circuit formed using a thin film transistor (hereinafter, referred to as TFT) and a manufacturing method thereof. For example, the present invention relates to an electro-optical device typified by a liquid crystal display panel, or an electronic device which has a light-emitting display device including an organic light-emitting element as a component.

In this specification, a semiconductor device generally means a device which can function by utilizing semiconductor characteristics, and an electro-optic device, a semiconductor circuit, and electronic equipment are all semiconductor devices.

2. Description of the Related Art

Various metal oxides are used for a variety of applications. Indium oxide is a well-known material and is used as a transparent electrode material which is necessary for liquid crystal displays and the like.

Some metal oxides have semiconductor characteristics. Metal oxides having semiconductor characteristics are a kind of compound semiconductor. The compound semiconductor is a semiconductor formed using two or more kinds of atoms bonded together. In general, metal oxides become insulators. However, it is known that metal oxides become semiconductors depending on the combination of elements included in the metal oxides.

For example, it is known that tungsten oxide, tin oxide, indium oxide, zinc oxide, and the like are metal oxides which have semiconductor characteristics. A thin film transistor in which a transparent semiconductor layer which is formed using such a metal oxide serves as a channel formation region is disclosed (Patent Documents 1 to 4 and Non-Patent Document 1).

Further, not only single-component oxides but also multi-component oxides are known as metal oxides. For example, $InGaO_3(ZnO)_m$ (m is a natural number) which is a homologous compound is a known material (Non-Patent Documents 2 to 4).

Furthermore, it is confirmed that such an In—Ga—Zn-based oxide is applicable to a channel layer of a thin film transistor (Patent Document 5 and Non-Patent Documents 5 and 6).

Further, attention has been drawn to a technique for manufacturing a thin film transistor using an oxide semiconductor, and applying the thin film transistor to an electronic device or an optical device. For example, Patent Document 6 and Patent Document 7 disclose a technique by which a thin film transistor is manufactured using zinc oxide or an In—Ga—Zn—O-based oxide semiconductor as an oxide semiconductor film and such a thin film transistor is used as a switching element or the like of an image display device.

REFERENCE

Patent Documents

[Patent Document 1] Japanese Published Patent Application No. S60-198861
[Patent Document 2] Japanese Published Patent Application No. H8-264794
[Patent Document 3] Japanese Translation of PCT International Application No. H11-505377
[Patent Document 4] Japanese Published Patent Application No. 2000-150900
[Patent Document 5] Japanese Published Patent Application No. 2004-103957
[Patent Document 6] Japanese Published Patent Application No. 2007-123861
[Patent Document 7] Japanese Published Patent Application No. 2007-096055

Non-Patent Document

[Non-Patent Document 1] M. W. Prins, K. O. Grosse-Holz, G. Muller, J. F. M. Cillessen, J. B. Giesbers, R. P. Weening, and R. M. Wolf, "A ferroelectric transparent thin-film transistor", Appl. Phys. Lett., 17 Jun. 1996, Vol. 68, p. 3650-3652
[Non-Patent Document 2] M. Nakamura, N. Kimizuka, and T. Mohri, "The Phase Relations in the $In_2O_3$—$Ga_2ZnO_4$—ZnO System at 1350° C.", J. Solid State Chem., 1991, Vol. 93, p. 298-315
[Non-Patent Document 3] N. Kimizuka, M. Isobe, and M. Nakamura, "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$—$ZnGa_2O_4$—ZnO System", J. Solid State Chem., 1995, Vol. 116, p. 170-178
[Non-Patent Document 4] M. Nakamura, N. Kimizuka, T. Mohri, and M. Isobe, "Syntheses and crystal structures of new homologous compounds, indium iron zinc oxides ($InFeO_3(ZnO)_m$) (m=natural number) and related compounds", KOTAI BUTSURI (SOLID STATE PHYSICS), 1993, Vol. 28, No. 5, p. 317-327
[Non-Patent Document 5] K. Nomura, H. Ohta, K. Ueda, T. Kamiya, M. Hirano, and H. Hosono, "Thin-film transistor fabricated in single-crystalline transparent oxide semiconductor", SCIENCE, 2003, Vol. 300, p. 1269-1272
[Non-Patent Document 6] K. Nomura, H. Ohta, A. Takagi, T. Kamiya, M. Hirano, and H. Hosono, "Room-temperature fabrication of transparent flexible thin-film transistors using amorphous oxide semiconductors", NATURE, 2004, Vol. 432, p. 488-492

SUMMARY OF THE INVENTION

An object of an embodiment of the present invention is to provide a semiconductor device including a thin film transistor which includes an oxide semiconductor layer and has high electric characteristics.

In order to realize an amorphous oxide semiconductor layer, a thin film transistor which includes an oxide semiconductor layer including silicon oxide or silicon oxynitride is provided. Typically, an oxide semiconductor layer is formed using an oxide semiconductor target including silicon oxide at 2.5 wt % to 20 wt % inclusive, preferably, at 7.5 wt % to 12.5 wt % inclusive, and silicon oxide ($SiO_x$) which hinders crystallization is added to the oxide semiconductor layer, whereby the thin film transistor is obtained, whose gate threshold voltage at which a channel is formed is positive and as close to 0 V as possible.

An embodiment of the present invention disclosed in this specification is a semiconductor device including a gate electrode over an insulating surface, an oxide semiconductor layer including silicon oxide, an insulating layer between the gate electrode and the oxide semiconductor layer, and source and drain regions between the oxide semiconductor layer including silicon oxide and source and drain electrode layers. In the semiconductor device, the source and drain regions are formed using a degenerate oxide semiconductor material or a degenerate oxynitride material.

The oxide semiconductor layer including silicon oxide is formed using a Zn—O-based oxide semiconductor, an In—Ga—Zn—O-based oxide semiconductor, an In—Sn—Zn—O-based oxide semiconductor, a Ga—Sn—Zn—O-based oxide semiconductor, an In—Zn—O-based oxide semiconductor, a Sn—Zn—O-based oxide semiconductor, an In—Sn—O-based oxide semiconductor, or a Ga—Zn—O-based oxide semiconductor.

In order to reduce contact resistance with source and drain electrode layers which are formed from a metal material with low electric resistance, the source and drain regions are formed between the source and drain electrode layers and the oxide semiconductor layer including silicon oxide.

In addition, in order to form an ohmic contact, the source or drain region (a buffer layer) whose carrier concentration is higher than that of the oxide semiconductor layer is intentionally formed between the oxide semiconductor layer and the source electrode layer (or the drain electrode layer). Note that the source and drain regions have n-type conductivity and can be referred to as $n^+$ regions. In the case where the source and drain regions are referred to as the $n^+$ regions ($N^+$-type regions), the oxide semiconductor layer which is made to function as a channel formation region can also be referred to as an i-type region (an I-type region) in contrast to the $n^+$ regions. An NI junction is formed by provision of the source and drain regions, so that a semiconductor device provided with a thin film transistor having a short channel length of 5 μm or less and high field effect mobility can be obtained.

Further, the source and drain regions (also referred to as the $N^+$-type regions, $n^+$ layers, or buffer layers) are preferably formed using a degenerate oxide semiconductor. The degenerate oxide semiconductor preferably transmits light. The oxide semiconductor layer is formed using a Zn—O-based oxide semiconductor, an In—Ga—Zn—O-based oxide semiconductor, an In—Zn—O-based oxide semiconductor, a Sn—Zn—O-based oxide semiconductor, an In—Sn—O-based oxide semiconductor, an Al—Zn—O-based oxide semiconductor or a Ga—Zn—O-based oxide semiconductor. Alternatively, the source and drain regions may be formed using a Zn—O-based non-single-crystal film including nitrogen, i.e., a Zn—O—N-based non-single-crystal film (also referred to as a ZnON film); or an In—Ga—Zn—O-based non-single-crystal film including nitrogen, i.e., an In—Ga—Zn—O—N-based non-single-crystal film (also referred to as an IGZON film). Further alternatively, the source and drain regions may be formed using a Ga—Zn—O-based non-single-crystal film; or a Ga—Zn—O-based non-single-crystal film including nitrogen, i.e., a Ga—Zn—O—N-based non-single-crystal film. Further alternatively, the source and drain regions may be formed using an Al—Zn—O-based non-single-crystal film; or an Al—Zn—O-based non-single-crystal film including nitrogen, i.e., an Al—Zn—O—N-based non-single-crystal film. Note that each of the Ga—Zn—O-based oxide semiconductor and the Ga—Zn—O—N-based oxide semiconductor preferably includes gallium at 1 wt % to 10 wt % inclusive, and each of the Al—Zn—O-based oxide semiconductor and the Al—Zn—O—N-based oxide semiconductor preferably includes aluminum at 1 wt % to 10 wt % inclusive. Further alternatively, a Zn—O—N-based non-single-crystal film, which includes nitrogen, or a Sn—Zn—O—N-based non-single-crystal film, which includes nitrogen, may be used.

As a material of the source and drain electrode layers, there are an element selected from Al, Cr, Ta, Ti, Mo, and W, an alloy including any of the elements as a component, an alloy film including a combination of any of the elements, and the like. Alternatively, indium tin oxide, indium tin oxide including silicon oxide, aluminum doped zinc oxide (AZO) or gallium doped zinc oxide (GZO) can be used.

Note that the oxide semiconductor layer including silicon oxide is formed by a sputtering method using an oxide semiconductor target including silicon oxide at 2.5 wt % to 20 wt % inclusive.

In particular, in the case where the source or drain region (the buffer layer) whose carrier concentration is higher than that of the oxide semiconductor layer is intentionally provided between the oxide semiconductor layer and the source electrode layer (or the drain electrode layer), there is a possibility that the buffer layer is also damaged by an electric charge caused by formation of plasma and resistance of the buffer layer is increased, so that the buffer layer cannot exhibit its own function.

Further, there is a possibility that characteristics of the oxide semiconductor layer are changed or reliability thereof is reduced due to reaction of the oxide semiconductor layer with moisture, hydrogen ions, $OH^-$ (also referred to as an OH group) or the like.

Thus, a resin layer having good flatness is formed as a first protective insulating film covering the oxide semiconductor layer, and then a second protective insulating film is formed over the resin layer by a sputtering method or a plasma CVD method under a low power condition. In this manner, different protective insulating films are stacked, whereby a semiconductor device having long-term reliability, in which plasma damage to the oxide semiconductor layer is reduced and sealing property is greatly high can be obtained.

Further, a second gate electrode covers the oxide semiconductor layer, so that the second gate electrode has a blocking function against moisture, hydrogen ions, $OH^-$, or the like. In the case where a conductive film which blocks light is used as the second gate electrode, the second gate electrode has an effect of preventing electric characteristics of the thin film transistor from changing due to photosensitivity of the oxide semiconductor and has an effect of stabilizing the electric characteristics of the thin film transistor.

An embodiment of the present invention, which realizes the above structure is a method for manufacturing a semiconductor device, including the steps of: forming a gate electrode over an insulating surface; forming an insulating layer over the gate electrode; forming an oxide semiconductor layer including silicon oxide over that insulating layer by a sputtering method using a first oxide semiconductor target including silicon oxide at 2.5 wt % to 20 wt % inclusive; and forming an oxynitride layer over the oxide semiconductor layer including silicon oxide in an atmosphere including nitrogen using a second oxide semiconductor target.

In the manufacturing method, a channel-etch type thin film transistor is manufactured in such a manner that part of the oxynitride layer, which overlaps with the gate electrode layer is removed after formation of the oxynitride layer so that part of the oxide semiconductor layer including silicon oxide is exposed.

The thin film transistor of the present invention is not limited to the channel-etch type thin film transistor, but a bottom-gate type thin film transistor, a bottom-contact type thin film transistor, or a top-gate type thin film transistor can be formed.

Another embodiment of the present invention is a method for manufacturing a top-gate thin film transistor, including the steps of: forming an oxide semiconductor layer over an insulating surface by a sputtering method using a first oxide semiconductor target including silicon oxide at 2.5 wt % to 20 wt % inclusive; forming an oxynitride layer over the oxide semiconductor layer including silicon oxide by a sputtering method using a second oxide semiconductor target in an atmosphere including nitrogen; forming an insulating layer covering the oxynitride layer; and forming a gate electrode over the insulating layer.

In each of the above manufacturing methods, the oxynitride layer is used as source and drain regions which are provided between source and drain electrode layers and the oxide semiconductor layer including silicon oxide in order to reduce contact resistance with the source and drain electrode layers formed using a metal material with low electric resistance value.

In addition, in the case where ions, in particular, hydrogen radicals are included in plasma at the time of generation of the plasma after formation of the oxide semiconductor layer, there is a possibility that a surface of the oxide semiconductor layer, which is exposed to plasma, is damaged. Further, there is a possibility that the oxide semiconductor layer is also damaged by an electric charge at the time of generation of plasma performed after formation of the oxide semiconductor layer.

In particular, in the case where the buffer layer whose carrier concentration is higher than that of the oxide semiconductor layer (the source or drain region) is intentionally provided between the oxide semiconductor layer and the source electrode layer (or the drain electrode layer), the buffer layer is also damaged by an electric charge caused by formation of plasma and resistance of the buffer layer is increased, so that there is a possibility that the buffer layer cannot exhibit its own function.

Further, there is a possibility that characteristics of the oxide semiconductor layer are changed or reliability thereof is reduced due to reaction of the oxide semiconductor layer and moisture, hydrogen ions, OH$^-$ or the like.

Thus, a resin layer having good flatness is formed as a first protective insulating film covering the oxide semiconductor layer, and then a second protective insulating film formed by a sputtering method or a plasma CVD method under a low power condition is formed over the resin layer. In this manner, different protective insulating films are stacked, whereby a semiconductor device having long-term reliability, in which plasma damage to the oxide semiconductor layer is reduced and sealing property is greatly high can be obtained.

Further, a second gate electrode covers the oxide semiconductor layer, so that the second gate electrode also has a blocking function against moisture, hydrogen ions, OH$^-$, or the like. In the case where a conductive film which blocks light is used as the second gate electrode, the second gate electrode has an effect of preventing electric characteristics of the thin film transistor from changing due to photosensitivity of the oxide semiconductor and stabilizing the electric characteristics of the thin film transistor.

Further, a base film is preferably formed over the insulating surface of a glass substrate or the like. For example, a silicon nitride film or a silicon nitride oxide film is provided. In this case, these films can be function as an etching stopper which prevents the glass substrate from being etched when a first gate electrode is selectively etched so that a top surface thereof has a desired shape. In addition, the base film has a blocking function against moisture, hydrogen ions, OH$^-$, or the like. In this manner, when the films having a blocking function against moisture, hydrogen ions, OH$^-$, or the like are provided to lie over, below, and around the oxide semiconductor layer, a semiconductor device having a still higher sealing property and long-term reliability can be obtained.

A term indicating a direction such as "on", "over", "under", "below", "side", "horizontal", or "perpendicular" in this specification is based on the assumption that a device is provided over a substrate surface.

An object of the present invention is to realize a semiconductor device including a thin film transistor which includes an oxide semiconductor layer including silicon oxide and has excellent electric characteristics.

BRIEF DESCRIPTION OF THE DRAWINGS

FIGS. 25A and 25B are a top view and a cross-sectional view of a semiconductor device illustrating an embodiment of the present invention;

FIGS. 26A-1 and 26A-2 are top views and FIG. 26B is a cross-sectional view of a semiconductor device illustrating an embodiment of the present invention;

FIGS. 29A and 29B each illustrate an electronic appliance of an embodiment of the present invention;

DETAILED DESCRIPTION OF THE INVENTION

Hereinafter, embodiments of the present invention will be described in detail with reference to the accompanying drawings. However, the present invention is not limited to the description below, and it is easily understood by those skilled in the art that modes and details disclosed herein can be modified in various ways without departing from the spirit and the scope of the present invention. Therefore, the present invention is not construed as being limited to description of the embodiments.

Embodiment 1

Figure 1A:
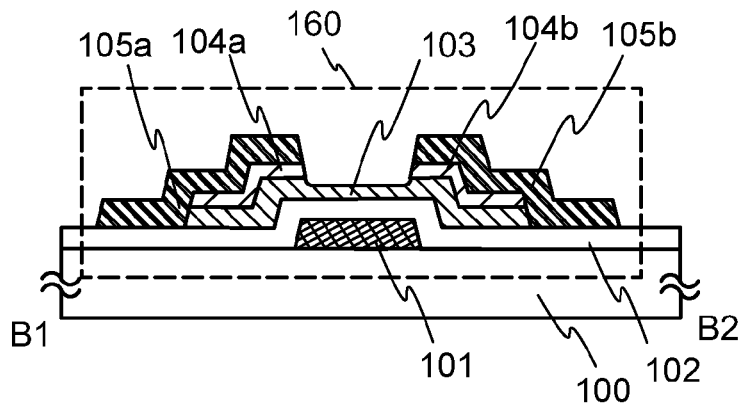
FIGS. 1A to 1C are cross-sectional views and a top view each illustrating an embodiment of the present invention.
Figure 1B:
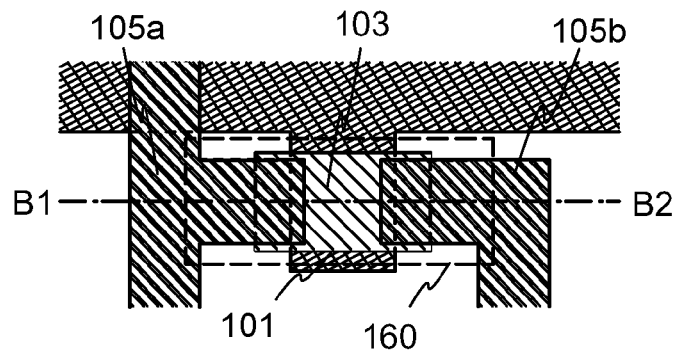
Figure 1C:
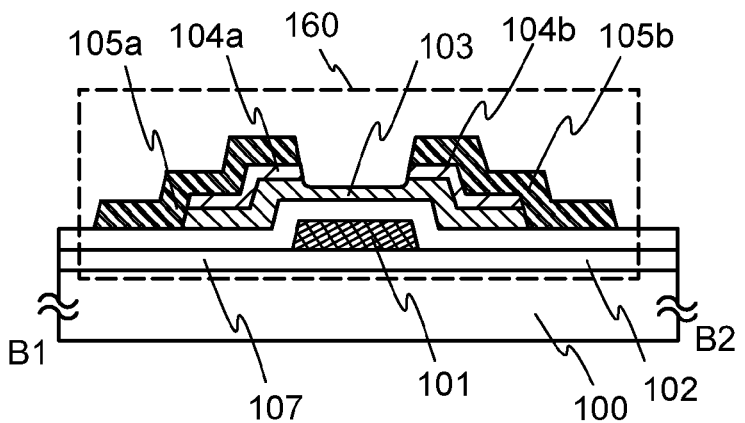

This embodiment describes an example of a thin film transistor using an oxide semiconductor layer including silicon oxide with reference to FIGS. 1A, 1B, and 1C.

FIG. 1A illustrates a thin film transistor 160 which is one type of a bottom-gate structure, and is a cross-sectional view of a structure called a channel-etch type. FIG. 1B illustrates an example of a top view of the thin film transistor whose cross section taken along line B1-B2 corresponds to FIG. 1A.

The thin film transistor 160 illustrated in FIG. 1A includes a gate electrode layer 101 over a substrate 100, a gate insulating layer 102 over the gate electrode layer 101, and an oxide semiconductor layer 103 including silicon oxide which is over the gate insulating layer 102 and overlaps with the gate electrode layer 101. In addition, source and drain electrode layers 105a and 105b which overlap with part of the oxide semiconductor layer 103 including silicon oxide are provided, and source and drain regions 104a and 104b are provided between part of the oxide semiconductor layer 103 including silicon oxide and the source and drain electrode layers 105a and 105b. In addition, an insulating film 107 functioning as a base insulating film may be provided over the substrate 100 as illustrated in FIG. 1C. The insulating film 107 can be formed with a single layer or a stacked layer using a silicon nitride film, a silicon oxynitride film, an aluminum oxide film, an aluminum nitride film, an aluminum oxynitride film, or an aluminum nitride oxide film.

The gate electrode layer 101 can be formed with a single layer or a stacked layer using a metal material such as aluminum, copper, molybdenum, titanium, chromium, tantalum, tungsten, neodymium, or scandium; an alloy material which includes any of these materials as its component; or a nitride which includes any of the materials as a component. The gate electrode layer 101 is preferably formed using a low-resistance conductive material such as aluminum or copper; however, since the low-resistance conductive material has disadvantages such as low heat resistance or a tendency to be corroded, it is preferably used in combination with a conductive material having heat resistance. As the heat-resistant conductive material, molybdenum, titanium, chromium, tantalum, tungsten, neodymium, scandium, or the like is used.

For example, as a stacked-layer structure of the gate electrode layer 101, a two-layer structure in which a molybdenum layer is stacked over an aluminum layer, a two-layer structure in which a molybdenum layer is stacked over a copper layer, a two-layer structure in which a titanium nitride layer or a tantalum nitride layer is stacked over a copper layer, or a two-layer structure in which a molybdenum layer and a titanium nitride layer are stacked is preferable. Alternatively, a three-layer structure in which a tungsten layer or a tungsten nitride layer, an aluminum-silicon alloy layer or an aluminum-titanium alloy layer, and a titanium nitride layer or a titanium layer are stacked is preferable.

The gate insulating layer 102 including silicon oxide is formed by a plasma CVD method or a sputtering method. The gate insulating layer 102 can be formed with a single layer or a stacked layer using any of a silicon oxide layer, a silicon nitride layer, a silicon oxynitride layer, and a silicon nitride oxide layer by a CVD method, a sputtering method, or the like. Alternatively, the gate insulating layer 102 can be formed using a silicon oxide layer by a CVD method using an organosilane gas. The gate insulating layer 102 may be formed with a single layer or a two or more layers. For example, by forming the gate insulating film in contact with the substrate 100, using a silicon nitride film or a silicon nitride oxide film, adhesion between the substrate 100 and the gate insulating layer is increased, and in the case where a glass substrate is used as the substrate 100, an impurity can be prevented from diffusing into the semiconductor layer from the substrate and further, the gate electrode layer can be prevented from being oxidized. That is to say, film peeling can be prevented, and electric characteristics of the thin film transistor which is formed later can be improved.

The oxide semiconductor layer 103 including silicon oxide can be formed using a Zn—O-based non-single-crystal film, an In—Ga—Zn—O-based non-single-crystal film, an In—Sn—Zn—O-based, Ga—Sn—Zn—O-based, In—Zn—O-based, Sn—Zn—O-based, In—Sn—O-based, or Ga—Zn—O-based oxide semiconductor.

The oxide semiconductor layer 103 is formed using an oxide semiconductor target including silicon oxide at 2.5 wt % to 20 wt % inclusive, preferably at 7.5 wt % to 12.5 wt % inclusive. In this embodiment, the oxide semiconductor layer 103 including silicon oxide is formed by a sputtering method using an oxide semiconductor target (ZnO) including silicon oxide at 10 wt %.

The source and drain regions 104a and 104b are preferably formed using a degenerate oxide semiconductor. The degenerate oxide semiconductor preferably transmits light. The source and drain regions 104a and 104b are formed using an oxide semiconductor layer which does not include silicon oxide, for example, a Zn—O-based oxide semiconductor, an In—Ga—Zn—O-based oxide semiconductor, an In—Zn—O-based oxide semiconductor, a Sn—Zn—O-based oxide semiconductor, an In—Sn—O-based oxide semiconductor, an Al—Zn—O-based oxide semiconductor, or a Ga—Zn—O-based oxide semiconductor. Alternatively, the source and drain regions 104a and 104b may be formed using a Zn—O-based non-single-crystal film including nitrogen, i.e., a Zn—O—N-based non-single-crystal film (also referred to as a ZnON film); or an In—Ga—Zn—O-based non-single-crystal film including nitrogen, i.e., an In—Ga—Zn—O—N-based non-single-crystal film (also referred to as an IGZON film). Further alternatively, the source and drain regions 104a and 104b may be formed using a Ga—Zn—O-based non-single-crystal film; or a Ga—Zn—O-based non-single-crystal film including nitrogen, i.e., a Ga—Zn—O—N-based non-single-crystal film. Further alternatively, the source and drain regions 104a and 104b may be formed from an Al—Zn—O-based non-single-crystal film; or an Al—Zn—O-based non-single-crystal film including nitrogen, i.e., an Al—Zn—O—N-based non-single-crystal film. Note that each of the Al—Zn—O-based oxide semiconductor and the Al—Zn—O—N-based oxide semiconductor preferably includes aluminum at 1 wt % to 10 wt % inclusive, and each of the Ga—Zn—O-based oxide semiconductor and the Ga—Zn—O—N-based oxide semiconductor preferably includes gallium at 1 wt % to 10 wt % inclusive. Further alternatively, a Zn—O—N-based non-single-crystal film, which includes nitrogen, or a Sn—Zn—O—N-based non-single-crystal film, which includes nitrogen, may be used.

In this embodiment, the source and drain regions 104a and 104b are formed using an oxynitride material. The oxynitride material is obtained as follows: sputtering is performed in an atmosphere including a nitrogen gas, with use of an oxide semiconductor target (ZnO) including zinc (Zn), so that an oxynitride film including zinc is formed; and the oxynitride film including zinc is subjected to heat treatment.

The source and drain regions 104a and 104b do not include Si, which is a major different point from the oxide semiconductor layer 103 including silicon oxide. In the source and drain regions 104a and 104b, in some cases, crystal grains are generated immediately after the film formation or crystal grains are generated in the case where heat treatment is performed after film formation. On the other hand, in the oxide semiconductor layer 103 including silicon oxide, the crystallization temperature of the film is high because of inclusion of silicon oxide. Thus, for example, even when heat treatment is performed at a temperature at which the source and drain regions 104a and 104b are partly crystallized, the oxide semiconductor layer 103 including silicon oxide can keep an amorphous state. Note that the source and drain regions 104a and 104b are referred to as $n^+$ regions or buffer layers.

In addition, in order to form an ohmic contact, the source or drain region (a buffer layer) whose carrier concentration is higher than that of the oxide semiconductor layer is intentionally formed between the oxide semiconductor layer and the source electrode layer (or the drain electrode layer). Note that the source and drain regions have n-type conductivity and can be referred to as $n^+$ regions. In the case where the source and drain regions are referred to as the $n^+$ regions ($N^+$-type regions), the oxide semiconductor layer which is made to function as a channel formation region can also be referred to as an i-type region (1-type region) in contrast to the $n^+$ regions. An NI junction is formed by provision of the source and drain regions, so that a semiconductor device provided with a thin film transistor having a short channel length of 5 μm or less and high field effect mobility can be obtained.

The source and drain electrode layers 105a and 105b are formed using any of an element selected from Al, Cr, Ta, Ti, Mo, and W, an alloy including any of the elements as a component, an alloy film including a combination of any of the elements, and the like. Alternatively, indium tin oxide (ITO), indium tin oxide including silicon oxide, aluminum doped zinc oxide (AZO), or gallium doped zinc oxide (GZO) can be used. By adding an element to be a trivalent ion such as $Al_2O_3$ or $Ga_2O_3$ to zinc oxide by a small amount (for example, at a few wt %), the resistance of the zinc oxide can be lowered.

The source and drain regions 104a and 104b enable contact resistance with the source and drain electrode layers 105a and 105b formed from a metal material with low electric resistance to be reduced. Accordingly, by providing the source and drain regions 104a and 104b, the thin film transistor 160 with higher electric characteristics is realized.

A protective insulating layer which covers and is in contact with the oxide semiconductor layer 103 including silicon oxide and the source and drain electrode layers 105a and 105b may be formed. Further, the protective insulating layer can be formed with a single layer or a stacked layer using any of a silicon nitride film, a silicon oxide film, a silicon oxynitride film, and the like, which is formed by a sputtering method or the like.

This embodiment describes an example of the thin film transistor using the oxide semiconductor layer including silicon oxide. Instead of the oxide semiconductor layer including silicon oxide, an oxide semiconductor layer including silicon oxynitride may be used.

Embodiment 2

Figure 2A:
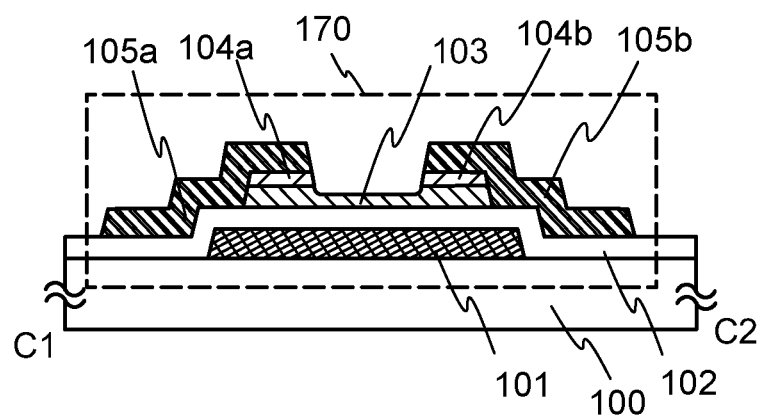
FIGS. 2A and 2B are a cross-sectional view and a top view, which illustrate an embodiment of the present invention.
Figure 2B:
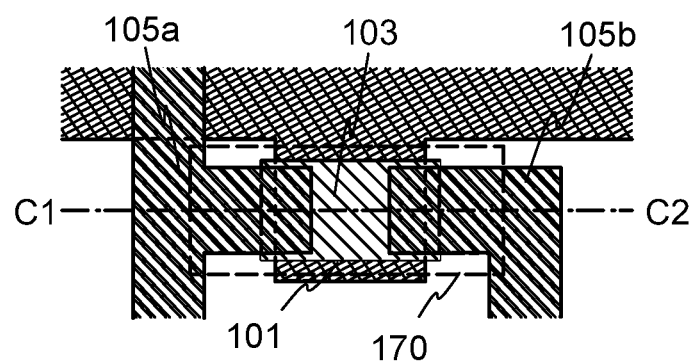

This embodiment describes an example of a thin film transistor which is different in the width of a gate electrode from that of Embodiment 1 with reference to FIGS. 2A and 2B.

FIG. 2A illustrates a thin film transistor 170 which is one type of a bottom-gate structure, and is an example of a cross-sectional view of a structure called a channel-etch type. FIG. 2B is an example of a top view of the thin film transistor whose cross section taken along dotted line C1-C2 corresponds to FIG. 2A.

In the thin film transistor 170 illustrated in FIG. 2A, a gate electrode layer 101 is provided over a substrate 100, a gate insulating layer 102 is provided over the gate electrode layer 101, an oxide semiconductor layer 103 is provided over the gate insulating layer 102, and source and drain electrode layers 105a and 105b are provided over the oxide semiconductor layer 103. Between part of the oxide semiconductor layer 103 including silicon oxide and the source and drain electrode layers 105a and 105b, source and drain regions 104a and 104b are provided. Note that a protective insulating layer covering the oxide semiconductor layer 103 and the source and drain electrode layers 105a and 105b may be formed.

In this embodiment, over the gate insulating layer 102, the oxide semiconductor layer 103 including oxide silicon (also referred to as a first oxide semiconductor layer) and a second oxide semiconductor layer (or an oxynitride layer) are stacked. Note that because part of the second oxide semiconductor layer, which is provided over a region which functions as a channel in the oxide semiconductor layer 103 including silicon oxide is removed by etching, the second oxide semiconductor layer is not provided over the region. Note that the second oxide semiconductor layer (or the oxynitride layer) functions as a buffer layer, an $n^+$ region, and source and drain regions. In FIG. 2A, the second oxide semiconductor layer is illustrated as the source and drain regions 104a and 104b.

In this embodiment, the oxide semiconductor layer 103 including silicon oxide is formed using an oxide semiconductor target including zinc (Zn), in which silicon oxide ($SiO_2$) is included at 2.5 wt % to 20 wt % inclusive, preferably at 7.5 wt % to 12.5 wt % inclusive. Inclusion of silicon oxide in an oxide semiconductor facilitates amorphization of an oxide semiconductor film to be formed. In addition, in the case where the oxide semiconductor film is subjected to heat treatment, the oxide semiconductor film can be prevented from being crystallized.

Structure Change caused by inclusion of $SiO_2$ in an oxide semiconductor including zinc (Zn), which is so-called ZnO, was calculated by the classical molecular dynamics simulation. An empirical potential which characterizes the interaction between atoms is defined in the classical molecular dynamics method, so that force that acts on each atom is evaluated. When Newton's equation of motion is solved numerically by applying the classical dynamic law on each atom, motion of atoms (time evolution) can be deterministically tracked.

Calculation models and calculation conditions are described below. Note that in this calculation, the Born-Mayer-Huggins potential was used.

Figure 7:
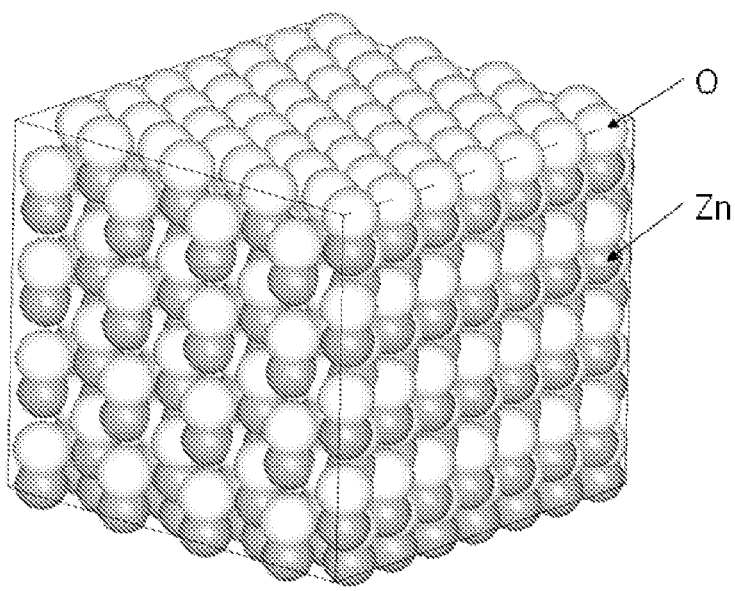
FIG. 7 illustrates a model of a single crystal structure of ZnO.
Figure 8A:
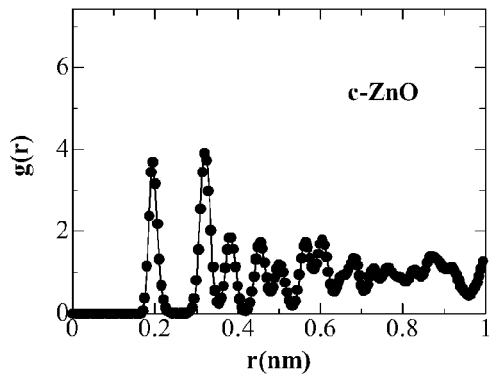
FIGS. 8A to 8E are graphs each showing a radical distribution function g(r) of a model.
Figure 8B:
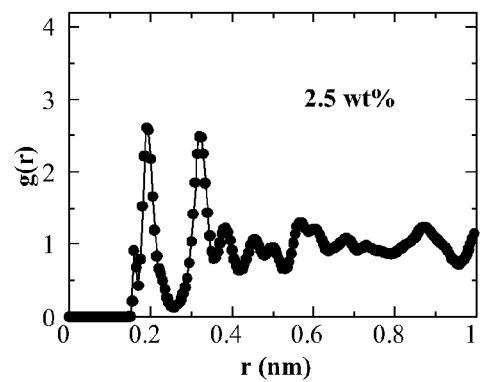
Figure 8C:
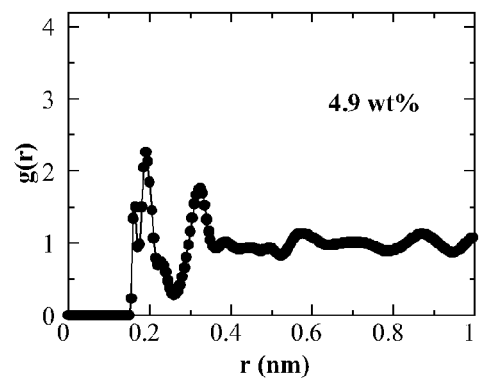
Figure 8D:
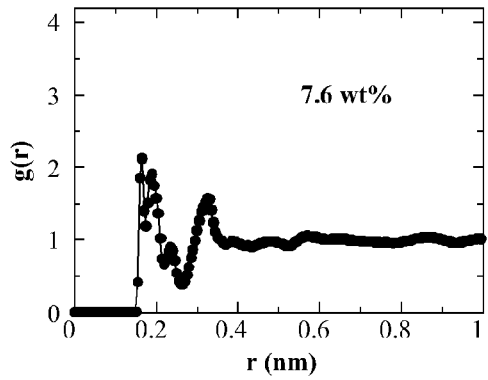
Figure 8E:
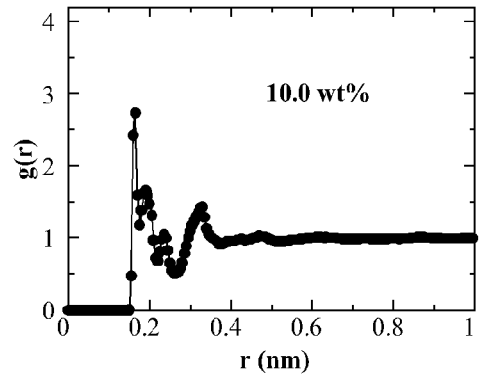
Figure 9A:
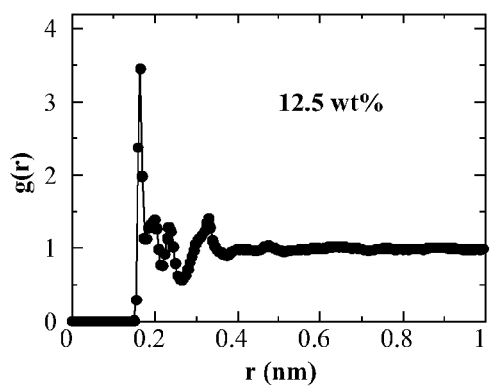
FIGS. 9A to 9D are graphs each showing a radical distribution function g(r) of a model.
Figure 9B:
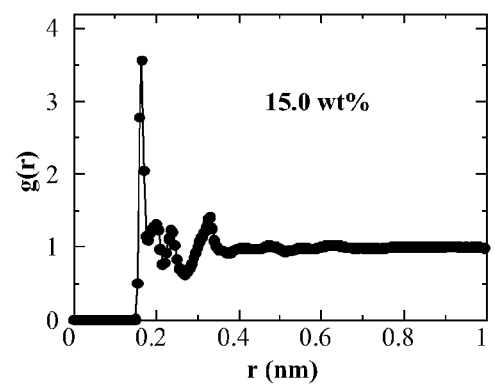
Figure 9C:
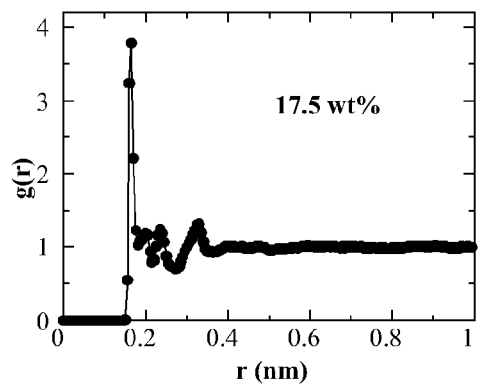
Figure 9D:
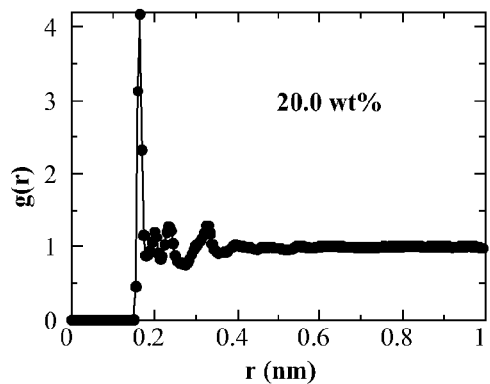

A calculation model is a ZnO single crystal structure of 896 atoms (see FIG. 7). In this structure, Zn was replaced with Si and O. Considering electric charge in each atom (Zn: +2, O: −2, Si: +4), three Zn atoms were replaced with two Si atoms and one O atom. The amount of replacement was defined as the following formula and structures in the cases of the amounts of replacement of 2.5 wt %, 4.9 wt %, 7.6 wt %, 10.0 wt %, 12.5 wt %, 15.0 wt %, and 20.0 wt % were formed. The structure in which Zn is replaced with Si and O is referred to as a ZnO replacement structure.

$$Xwt\% = \frac{\text{mass of Si or O with which Zn is replaced } (g)}{\text{mass of a structure after replacement of Zn with Si or O } (g)} \times 100 \quad \text{[FORMULA 1]}$$

At a temperature of 350° C., structural relaxation was performed at a fixed pressure (1 atm) for 400 psec (time step of 0.2 fsec×2000000 steps) with the classical molecular dynamics simulation. Then, the radial distribution functions g(r) of the eight structures were calculated. Note that the radial distribution function g(r) is a function representing the probability density of atoms existing at a distance of r from one atom. As the correlation between atoms disappears, g(r) becomes closer to 1.

FIGS. 8A to 8E and FIGS. 9A to 9D show the radial distribution functions g(r) of the calculation models, which are obtained by performing the classical molecular dynamics simulation on the eight calculation model for 400 psec.

In FIGS. 8A to 8E and FIGS. 9A to 9D, when the radial distribution functions g(r) of the calculation models are compared with each other, it can be found that in the case of the single crystal model (see FIG. 8A), and in the cases where the amounts of replacement are 2.5 wt % to 7.6 wt % (see FIGS. 8B to 8D), there is peak also at a long distance, which shows existence of a long-range order. When the amount of replacement is 10 wt % or more (see FIG. 8E, and FIGS. 9A to 9D), there is no peaks at 0.6 nm or more, which shows nonexistence of long-range order. From the above, it can be considered that the model is made amorphous when the amount of replacement is 10 wt % or more.

Figure 10A:
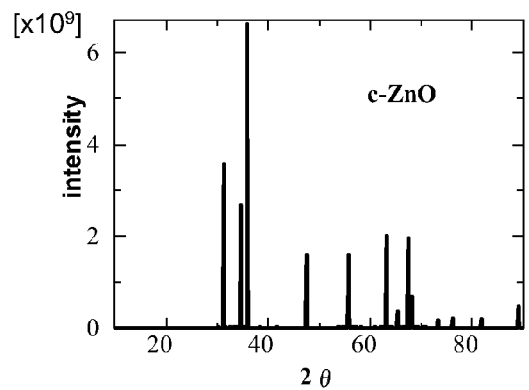
FIGS. 10A to 10E are graphs each showing a result by simulation of XRD of a model.
Figure 10B:
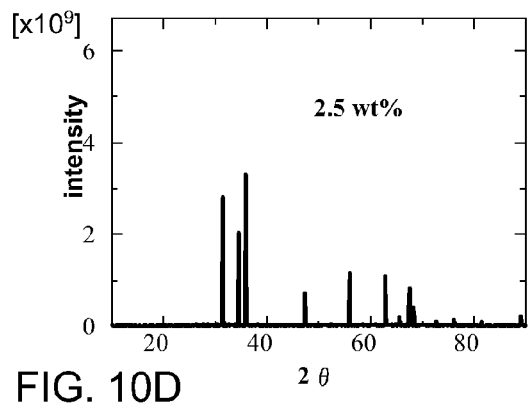
Figure 10C:
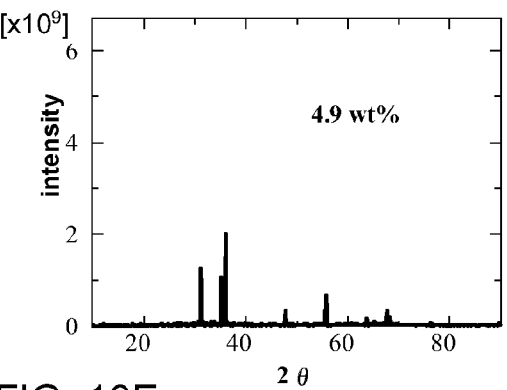
Figure 10D:
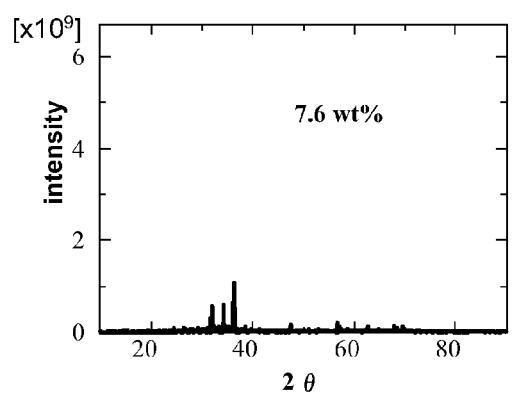
Figure 10E:
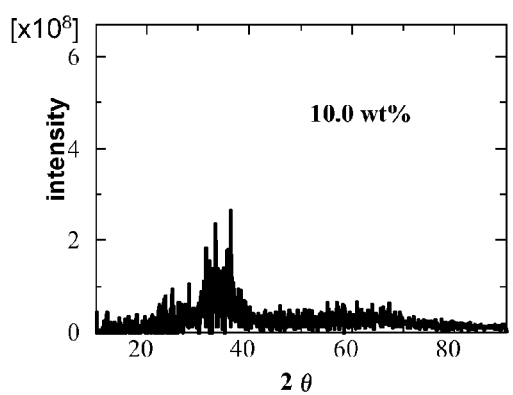
Figure 11A:
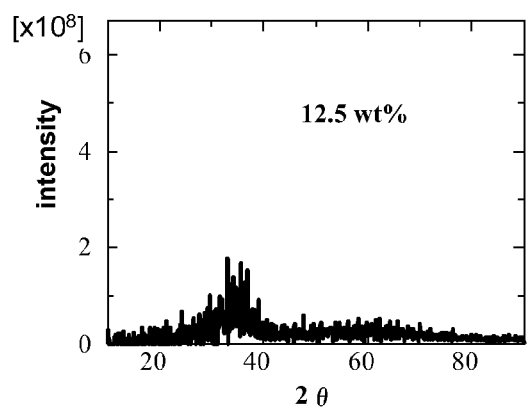
FIGS. 11A to 11D are graphs each showing a result by simulation of XRD of a model.
Figure 11B:
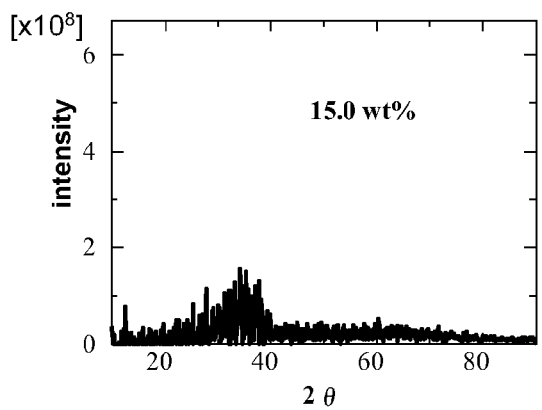
Figure 11C:
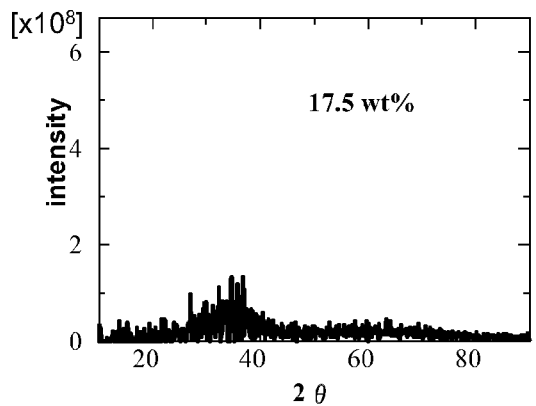
Figure 11D:
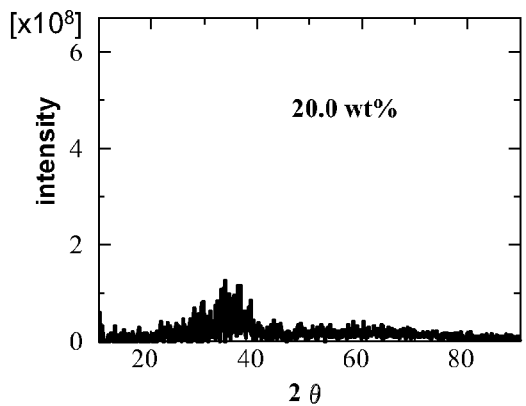

The classical molecular dynamics simulation was performed on the eight calculation model for 400 psec, and final structures of the calculation models were obtained. FIGS. 10A to 10E and FIGS. 11A to 11D show results obtained by simulation of XRD performed on the final structures of the eight calculation models. Note that a wavelength of X-ray for this calculation is 0.154138 nm (Cu Kα). FIG. 10A shows a result of calculation of the ZnO single crystal structure.

When the results of respective calculation models by simulation of XRD are compared with each other in FIGS. 10A to 10E and FIGS. 11A to 11D, it can be found that intensity of a peak of the amount of replacement becomes weaker as the amount of replacement is increased from 2.5 wt % (see FIG. 10B), as compared to the case of the ZnO single crystal structure. Accordingly, it can be considered that destruction of the single crystal structure as a whole and amorphization begins at 2.5 wt % of the amount of replacement. In addition, it is found that peaks are seen at 7.6 wt % or less of the amount of replacement (see FIGS. 10C and 10D) and broad peaks are seen at 10 wt % or more of the amount of replacement (FIG. 10E and FIGS. 11A to 11D). Accordingly, amorphization is substantially completed when the amount of replacement is 10 wt % or more.

The above calculation results suggest that inclusion of $SiO_2$ in ZnO facilitates amorphization of ZnO. Actually, a ZnO thin film including $SiO_2$, which is obtained by a sputtering method is an amorphous semiconductor film just after its formation. The above calculation results show that inclusion of $SiO_2$ interrupts crystallization of ZnO even when heat treatment is performed, so that an amorphous structure can be kept.

Instead of a Zn—O-based non-single-crystal film, the oxide semiconductor layer 103 including silicon oxide can be formed using an In—Ga—Zn—O-based non-single-crystal film, an In—Sn—Zn—O-based, Ga—Sn—Zn—O-based, In—Zn—O-based, Sn—Zn—O-based, In—Sn—O-based, or Ga—Zn—O-based oxide semiconductor.

In addition, the source and drain regions 104a and 104b are preferably formed using a degenerate oxide semiconductor. The degenerate oxide semiconductor preferably transmits light. Further, as the source and drain regions 104a and 104b, an oxide semiconductor layer which does not include silicon oxide, for example, a Zn—O-based oxide semiconductor, an In—Ga—Zn—O-based oxide semiconductor, an In—Zn—O-based oxide semiconductor, a Sn—Zn—O-based oxide semiconductor, an In—Sn—O-based oxide semiconductor, an Al—Zn—O-based oxide semiconductor, or a Ga—Zn—O-based oxide semiconductor may be used. Alternatively, the source and drain regions 104a and 104b may be formed using an In—Ga—Zn—O-based non-single-crystal film including nitrogen, that is, an In—Ga—Zn—O—N-based non-single-crystal film (also referred to as an IGZON film). Further alternatively, the source and drain regions 104a and 104b may be formed using a Ga—Zn—O-based non-single-crystal film; or a Ga—Zn—O-based non-single-crystal film including nitrogen, that is, a Ga—Zn—O—N-based non-single-crystal film. Further alternatively, the source and drain regions 104a and 104b may be formed using an Al—Zn—O-based non-single-crystal film; or an Al—Zn—O-based non-single-crystal film including nitrogen, that is, an Al—Zn—O—N-based non-single-crystal film. Note that each of the Al—Zn—O-based oxide semiconductor and the Al—Zn—O—N-based oxide semiconductor preferably includes aluminum at 1 wt % to 10 wt % inclusive, and each of the Ga—Zn—O-based oxide semiconductor and the Ga—Zn—O—N-based oxide semiconductor preferably includes gallium at 1 wt % to 10 wt % inclusive. Further alternatively, a Zn—O—

N-based non-single-crystal film, which includes nitrogen, or a Sn—Zn—O—N-based non-single-crystal film, which includes nitrogen, may be used.

In this embodiment, the source and drain regions 104a and 104b are formed using an oxynitride material. The oxynitride material is obtained as follows: sputtering is performed in an atmosphere including a nitrogen gas using an oxide semiconductor target (ZnO) including zinc (Zn), so that a Zn—O—N-based non-single-crystal film is formed; and the Zn—O—N-based non-single-crystal film is subjected to heat treatment.

The source and drain electrode layers 105a and 105b are formed using any of an element selected from Al, Cr, Ta, Ti, Mo, and W, an alloy including any of the elements as a component, an alloy film including a combination of any of the elements, and the like. Alternatively, indium tin oxide (ITO), indium tin oxide including silicon oxide ($SiO_x$), aluminum doped zinc oxide (AZO), or gallium doped zinc oxide (GZO) can be used.

An example of manufacturing a display device using the above thin film transistor 170 as a switching element of a pixel portion is described below with reference to FIG. 3.

First, the gate electrode layer 101 is provided over the substrate 100 having an insulating surface. A glass substrate is used as the substrate 100 having an insulating surface. The gate electrode layer 101 can be formed with a single layer or a stacked layer using a metal material such as molybdenum, titanium, chromium, tantalum, tungsten, aluminum, copper, neodymium, or scandium, or an alloy material which includes any of the materials as a main component. Note that when the gate electrode layer 101 is formed, a capacitor wiring 108 of the pixel portion and a first terminal 121 of a terminal portion are formed together. Note that an insulating film functioning as a base insulating film may be formed over the substrate 100. The insulating film can also be formed with a single layer or a stacked layer using a silicon nitride film, a silicon oxynitride film, an aluminum oxide film, an aluminum nitride film, an aluminum oxynitride film, or an aluminum nitride oxide film For example, as a two-layer structure of the gate electrode layer 101, the following structures are preferable: a two-layer structure in which a molybdenum layer is stacked over an aluminum layer, a two-layer structure in which a molybdenum layer is stacked over a copper layer, a two-layer structure in which a titanium nitride layer or a tantalum nitride layer is stacked over a copper layer, and a two-layer structure in which a titanium nitride layer and a molybdenum layer are stacked. Alternatively, a stack including a copper layer including Ca and a copper oxide layer including Ca thereover, which serves as a barrier layer, or a stack including a copper layer including Mg and a copper oxide layer including Mg thereover, which serves as a barrier layer, can be employed. As a three-layer structure, a stack of a tungsten layer or a tungsten nitride layer, a layer of an alloy of aluminum and silicon or an alloy of aluminum and titanium, and a titanium nitride layer or a titanium layer is preferable.

Next, the gate insulating layer 102 covering the gate electrode layer 101 is formed. The gate insulating layer 102 is formed to a thickness of 50 nm to 400 nm by a sputtering method, a PCVD method, or the like.

For example, as the gate insulating layer 102, a silicon oxide film is formed to a thickness of 100 nm by a sputtering method. Needless to say, the gate insulating layer 102 is not limited to such a silicon oxide film, and other insulating films such as a silicon oxynitride film, a silicon nitride film, an aluminum oxide film, an aluminum nitride film, an aluminum oxynitride film, or a tantalum oxide film may be used to form a single-layer structure or a stacked-layer structure. In a case of forming a stack of layers, for example, a silicon nitride film may be formed by a PCVD method and then a silicon oxide film may be formed thereover by a sputtering method. When a silicon oxynitride film, a silicon nitride film, or the like is used as the gate insulating layer 102, an impurity from the glass substrate, sodium for example, can be blocked from diffusing into and entering an oxide semiconductor to be formed thereover later.

Next, an oxide semiconductor film including silicon oxide is formed over the gate insulating layer 102. Here, formation is performed with use of an oxide semiconductor target including zinc (Zn), in which silicon oxide ($SiO_2$) is included at 10 wt %. Inclusion of silicon oxide in an oxide semiconductor facilitates amorphization of an oxide semiconductor film to be formed. In addition, when heat treatment is performed in a process after formation of the oxide semiconductor film, the oxide semiconductor film including silicon oxide can be prevented from being crystallized.

Then, an oxynitride film which does not include silicon oxide is formed over the oxide semiconductor film including silicon oxide by a sputtering method. Here, sputtering is performed in an atmosphere including a nitrogen gas using an oxide semiconductor target (ZnO) including zinc (Zn), so that a Zn—O—N-based non-single-crystal film is formed.

Examples of a sputtering method include an RF sputtering method in which a high-frequency power source is used as a sputtering power source, a DC sputtering method, and a pulsed DC sputtering method in which a bias is applied in a pulsed manner.

In addition, there is also a multi-source sputtering apparatus in which a plurality of targets of different materials can be set. With the multi-source sputtering apparatus, films of different materials can be formed to be stacked in the same chamber, or a film of plural kinds of materials can be formed by electric discharge at the same time in the same chamber.

In addition, there are a sputtering apparatus provided with a magnet system inside the chamber and used for a magnetron sputtering, and a sputtering apparatus used for an ECR sputtering in which plasma generated with the use of microwaves is used without using glow discharge.

Furthermore, as a deposition method by sputtering, there are also a reactive sputtering method in which a target substance and a sputtering gas component are chemically reacted with each other during deposition to form a thin compound film thereof, and a bias sputtering in which a voltage is also applied to a substrate during deposition.

Next, a photolithography step is performed. A resist mask is formed, and the Zn—O—N-based non-single-crystal film (the oxynitride film) is selectively etched. Then, with use of the same mask, the Zn—O-based non-single-crystal film (the oxide semiconductor film) including silicon oxide is selectively etched. The resist mask is removed after the etching.

Next, a photolithography step is performed and a new resist mask is formed. Unnecessary portions (part of the gate insulating layer) are removed by etching, so that a contact hole reaching an electrode layer or a wiring formed from the same material as the gate electrode layer is formed. The contact hole is provided for direct connection with a conductive film to be formed later. For example, a contact hole is formed when a thin film transistor whose gate electrode layer is in direct contact with the source or drain electrode layer in the driver circuit portion is formed, or when a terminal that is electrically connected to a gate wiring of a terminal portion is formed. Note that an example in which a contact hole is formed by a photolithography step for direct connection with the conductive film to be formed later is described here without particular limitation. The contact hole reaching the gate electrode layer may be formed later in a step of forming a contact hole for connection with a pixel electrode and the same material as the pixel electrode may be used for electrical connection. In the case where electrical connection is performed with use of the same material as the pixel electrode, one mask can be reduced.

Then, a conductive film formed from a metal material is formed over the Zn—O—N-based non-single-crystal film (the oxynitride film) by a sputtering method or a vacuum evaporation method.

As a material for the conductive film, an element selected from Al, Cr, Ta, Ti, Mo, and W; an alloy including any of the elements as a component; an alloy film including a combination of any of the elements; and the like can be given. Further, in the case of performing heat treatment at 200° C. to 600° C. later, the conductive film preferably has heat resistance against such heat treatment. Further, for heat treatment at 200° C. to 600° C., the conductive film preferably has heat resistance for such heat treatment. Since use of Al alone brings disadvantages such as low heat resistance and a tendency to be corroded, aluminum is used in combination with a conductive material having heat resistance. As the conductive material having heat resistance which is used in combination with Al, any of the following materials may be used: an element selected from titanium (Ti), tantalum (Ta), tungsten (W), molybdenum (Mo), chromium (Cr), and neodymium (Nd), scandium (Sc), an alloy including any of the elements as a component, an alloy film including the elements in combination, and a nitride including any of the elements as a component. Alternatively, indium tin oxide (ITO), indium tin oxide including silicon oxide ($SiO_x$), zinc oxide including aluminum (AZO), or zinc oxide including gallium (GZO) can also be used. By adding an element to be a trivalent ion such as $Al_2O_3$ or $Ga_2O_3$ to zinc oxide by a small amount (for example, at a few wt %), the resistance of the zinc oxide can be lowered.

In this embodiment, the conductive film has a single-layer structure of a titanium film. Further, the conductive film may have a two-layer structure, and a titanium film may be stacked over an aluminum film. Still alternatively, the conductive film may have a three-layer structure including a Ti film, an aluminum film including Nd (Al—Nd) which is stacked on the Ti film, and a Ti film formed on these films. The conductive film may have a single-layer structure of an aluminum film including silicon.

Next, a photolithography step is performed and a resist mask is formed. Then, unnecessary portions are removed by etching, so that the source and drain electrode layers 105a and 105b and the source and drain regions 104a and 104b are formed in the pixel portion and source and drain electrode layers and source and drain regions are formed in the driver circuit portion. Wet etching or dry etching is employed as an etching method at this time. For example, when an aluminum film or an aluminum-alloy film is used as the conductive film, wet etching using a mixed solution of phosphoric acid, acetic acid, and nitric acid can be carried out. Here, the conductive film of the Ti film is etched by wet etching to form the source and drain electrode layers, and the Zn—O—N-based non-single-crystal film is etched to form a first buffer layer (the source or drain region 104a) and a second buffer layer (the source or drain region 104b). In this etching step, an exposed region of the oxide semiconductor film including silicon oxide is also partly etched, so that the oxide semiconductor layer 103 including silicon oxide is formed.

In the photolithography step, a second terminal 122 formed from the same material as the source and drain electrode layers 105a and 105b remains in the terminal portion. Note that the second terminal 122 is electrically connected to a source wiring (the source wiring including the source and drain electrode layers 105a and 105b).

Through the above steps, the thin film transistor 170 in which the oxide semiconductor layer 103 including silicon oxide serves as a channel formation region can be formed in the pixel portion.

In the terminal portion, the connection electrode 120 is directly connected to the first terminal 121 in the terminal portion through the contact hole formed in the gate insulating film. Note that although not illustrated in this embodiment, a source or drain wiring of the thin film transistor of the driver circuit is directly connected to the gate electrode through the same steps as the above steps.

Next, heat treatment is preferably performed at 200° C. to 600° C., typically 300° C. to 500° C. (the heat treatment may be annealing with light). Here, heat treatment is performed in a nitrogen atmosphere in a furnace at 350° C. for 1 hour. Through this heat treatment, rearrangement at the atomic level occurs in the Zn—O-based non-single-crystal film including silicon oxide. In addition, the oxide semiconductor layer 103 including silicon oxide can be prevented from being crystallized in heat treatment because of inclusion of silicon oxide; thus the oxide semiconductor layer 103 can keep an amorphous structure. Note that there is no particular limitation on when to perform the heat treatment, as long as it is performed after the Zn—O—N-based non-single-crystal film is formed. For example, the heat treatment may be performed after a pixel electrode is formed.

Next, the resist mask is removed, and a protective insulating layer 106 is formed to cover the thin film transistor 170.

Next, a photolithography step is performed and a resist mask is formed. Then, the protective insulating layer 106 is etched, so that a contact hole reaching the source or drain electrode layer 105b is formed. In addition, by the etching here, a contact hole reaching the second terminal 122 and a contact hole reaching the connection electrode 120 are formed.

Next, the resist mask is removed, and then a transparent conductive film is formed. The transparent conductive film is formed using indium oxide ($In_2O_3$), indium tin oxide ($In_2O_3$-$SaO_2$, abbreviated as ITO), or the like by a sputtering method, a vacuum evaporation method, or the like. Such a material is etched with a hydrochloric acid-based solution. However, since etching of ITO especially tends to leave residue, an alloy of indium oxide and zinc oxide ($In_2O_3$—ZnO) may be used in order to improve etching processability. AZO or GZO may be used.

Next, a photolithography step is performed and a resist mask is formed. Then, unnecessary portions are removed by etching, so that a pixel electrode layer 110 is formed. In this photolithography step, a storage capacitor is formed by the capacitor wiring 108 and the pixel electrode layer 110 using the gate insulating layer 102 and the protective insulating layer 106 in the capacitor portion as dielectrics. In addition, in this photolithography step, the first terminal and the second terminal are covered with the resist mask, and transparent conductive films 128 and 129 are left in the terminal portion. The transparent conductive films 128 and 129 function as electrodes or wirings connected to an FPC. The transparent conductive film 128 formed over the connection electrode 120 which is directly connected to the first terminal 121 is a connection terminal electrode which functions as an input terminal of the gate wiring. The transparent conductive film 129 formed over the second terminal 122 is a connection terminal electrode which functions as an input terminal of the source wiring.

This embodiment describes an example in which the storage capacitor is formed by the capacitor wiring 108 and the pixel electrode layer 110 by using the gate insulating layer 102 and the protective insulating layer 106 as dielectrics is described; however, there is no particular limitation. A structure may also be employed, in which an electrode formed using the same material as the source and drain electrodes is provided above a capacitor wiring and a storage capacitor is formed by the electrode and the capacitor wiring with the gate insulating layer 102 interposed therebetween as a dielectric, and the electrode and the pixel electrode layer 110 are electrically connected.

Then, the resist mask is removed. A cross-sectional view at this stage is illustrated in FIG. 3. Note that, a top view of the thin film transistor 170 in the pixel portion at this stage corresponds to FIG. 4.

Figure 3:
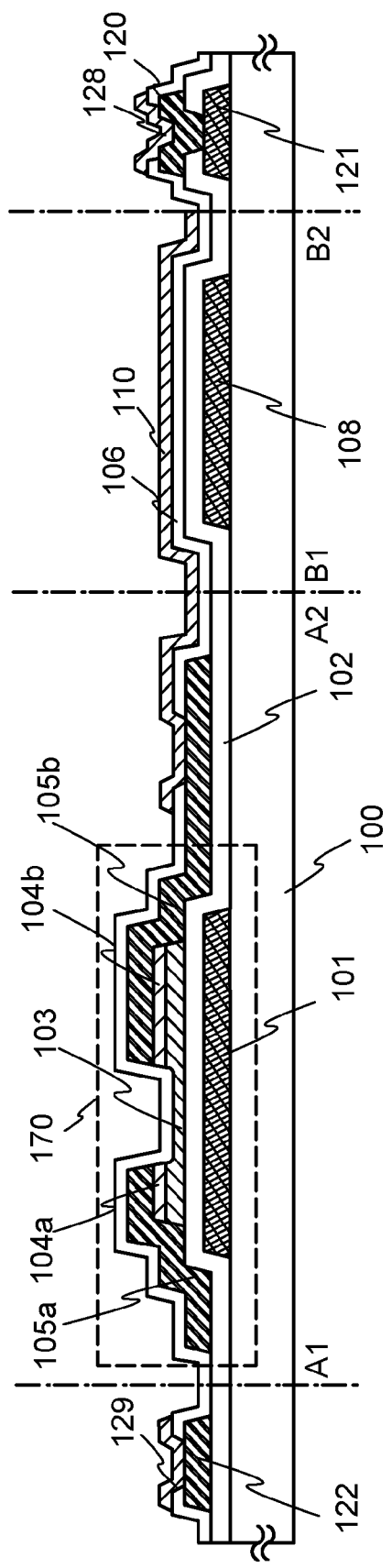
FIG. 3 is a cross-sectional view illustrating an embodiment of the present invention.
Figure 4:
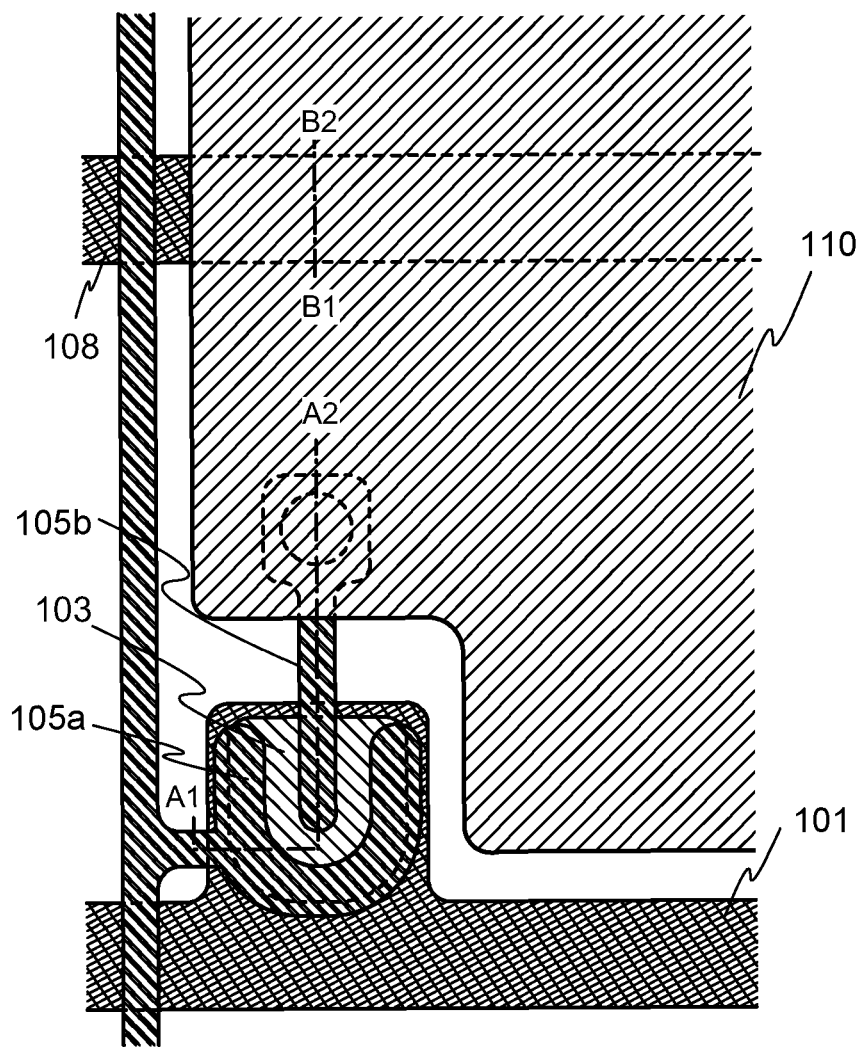
FIG. 4 is a top view illustrating an embodiment of the present invention.

A cross-sectional view taken along line A1-A2 and line B1-B2 of FIG. 4 corresponds to FIG. 3. FIG. 3 illustrates a cross-sectional structure of the thin film transistor 170 in the pixel portion, a cross-sectional structure of a capacitor portion in the pixel portion, and a cross-sectional structure of the terminal portion.

Figures 1, 5A:
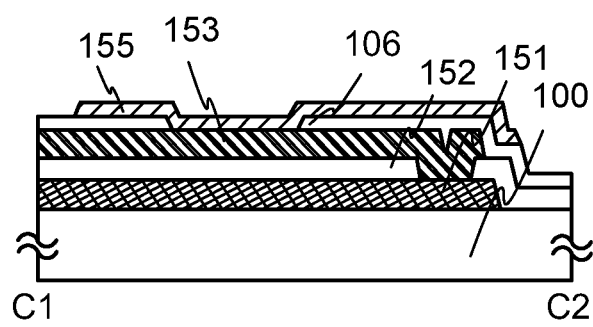
FIGS. 5A-1 and 5A-2 and FIGS. 5B-1 and 5B-2 are cross-sectional views and top views, which illustrate an embodiment of the present invention.
Figures 2, 5A:
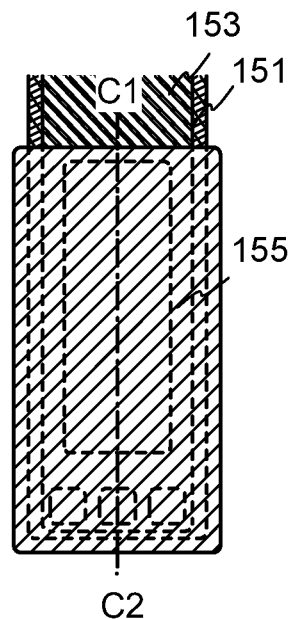

FIGS. 5A-1 and 5A-2 respectively illustrate a cross-sectional view and a top view of a gate wiring terminal portion at this stage. FIG. 5A-1 is a cross-sectional view taken along line C1-C2 of FIG. 5A-2. In FIG. 5A-1, a transparent conductive film 155 formed over the protective insulating layer 106 is a connection terminal electrode which functions as an input terminal. In the terminal portion in FIG. 5A-1, a first terminal 151 formed using the same material as the material of the gate wiring and a connection electrode 153 formed using the same material as the material of the source wiring overlap each other with a gate insulating layer 152 interposed therebetween and are electrically connected through the transparent conductive film 155.

Figures 1, 5B:
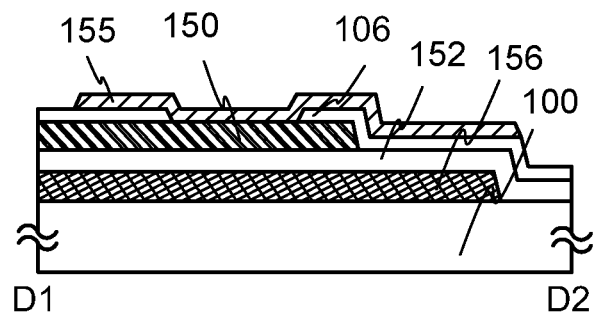
Figures 2, 5B:
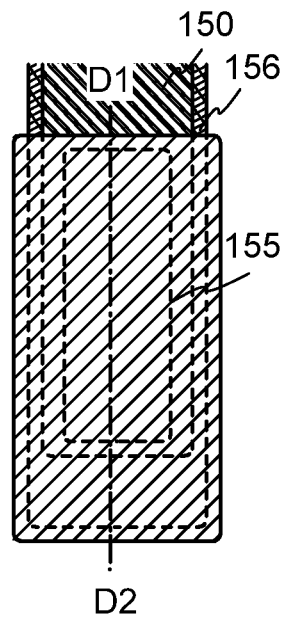

FIGS. 5B-1 and 5B-2 are a cross-sectional view and a top view of a source wiring terminal portion, respectively. FIG. 5B-1 corresponds to the cross-sectional view taken along line D1-D2 in FIG. 5B-2. In FIG. 5B-1, a transparent conductive film 155 formed over the protective insulating film 106 is a connection terminal electrode functioning as an input terminal. Furthermore, in FIG. 5B-1, in the terminal portion, an electrode 156 formed from the same material as the gate wiring is located below and overlapped with a second terminal 150, which is electrically connected to the source wiring, with the gate insulating layer 152 interposed therebetween. The electrode 156 is not electrically connected to the second terminal 150, and a capacitor to prevent noise or static electricity can be formed when the potential of the electrode 156 is set to a potential different from that of the second terminal 150, such as floating, GND, or 0 V. The second terminal 150 is electrically connected to the transparent conductive film 155 with the protective insulating layer 106 interposed therebetween.

A plurality of gate wirings, source wirings, and capacitor wirings are provided depending on the pixel density. Also in the terminal portion, the first terminal at the same potential as the gate wiring, the second terminal at the same potential as the source wiring, the third terminal at the same potential as the capacitor wiring, and the like are each arranged in plurality. The number of each of the terminals may be any number, and the number of the terminals may be determined by a practitioner as appropriate.

Thus, the pixel portion which includes the thin film transistor 170 including an oxide semiconductor layer including silicon oxide and the storage capacitor, and the terminal portion can be manufactured. In addition, a driver circuit can be formed over the same substrate.

In the case of manufacturing an active matrix liquid crystal display device, an active matrix substrate and a counter substrate provided with a counter electrode are bonded to each other with a liquid crystal layer interposed therebetween. Note that a common electrode electrically connected to the counter electrode on the counter substrate is provided over the active matrix substrate, and a terminal electrically connected to the common electrode is provided in the terminal portion. This terminal is provided so that the common electrode is fixed to a predetermined potential such as GND or 0 V.

Figure 6:
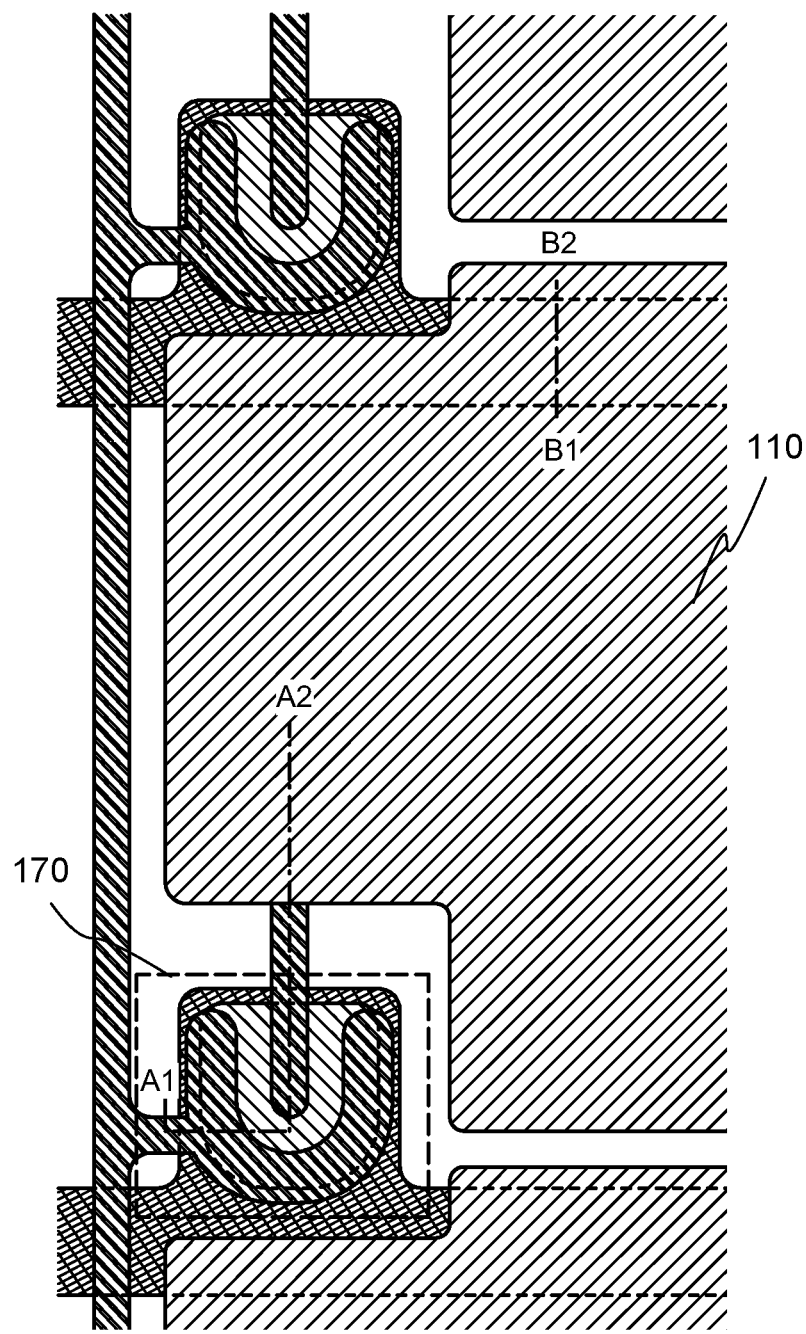
FIG. 6 is a top view illustrating an embodiment of the present invention.

Further, in this embodiment, a pixel structure is not limited to that of FIG. 4. An example of a top view different from FIG. 4 is illustrated in FIG. 6. FIG. 6 illustrates an example in which a capacitor wiring is not provided but a protective insulating film and a gate insulating layer are sandwiched between a pixel electrode and a gate wiring of an adjacent pixel to form a storage capacitor. In that case, a capacitor wiring and a third terminal which is connected to the capacitor wiring can be omitted. Note that in FIG. 6, the same portions as those in FIG. 4 are denoted by the same reference numerals.

In an active matrix liquid crystal display device, pixel electrodes arranged in a matrix form are driven to form a display pattern on a screen. Specifically, voltage is applied between a selected pixel electrode and a counter electrode corresponding to the pixel electrode, so that a liquid crystal layer provided between the pixel electrode and the counter electrode is optically modulated and this optical modulation is recognized as a display pattern by an observer.

In displaying moving images, a liquid crystal display device has a problem that a long response time of liquid crystal molecules themselves causes afterimages or blurring of moving images. In order to improve the moving-image characteristics of a liquid crystal display device, a driving method called black insertion is employed in which black is displayed on the whole screen every other frame period.

Alternatively, a driving method called double-frame rate driving may be employed in which a vertical synchronizing frequency is 1.5 times or more, preferably, 2 times or more as high as a usual vertical synchronizing frequency, whereby the moving-image characteristics are improved.

Further alternatively, in order to improve the moving-image characteristics of a liquid crystal display device, a driving method may be employed, in which a plurality of LEDs (light-emitting diodes) or a plurality of EL light sources are used to form a surface light source as a backlight, and each light source of the surface light source is independently driven in a pulsed manner in one frame period. As the surface light source, three or more kinds of LEDs may be used and an LED emitting white light may be used. Since a plurality of LEDs can be controlled independently, the light emission timing of LEDs can be synchronized with the timing at which a liquid crystal layer is optically modulated. According to this driving method, LEDs can be partly turned off; therefore, an effect of reducing power consumption can be obtained particularly in the case of displaying an image having a large part on which black is displayed.

By combining these driving methods, the display characteristics of a liquid crystal display device, such as moving-image characteristics, can be improved as compared to those of conventional liquid crystal display devices.

In addition, according to this embodiment, a display device having high electrical properties and high reliability can be provided at low costs.

This embodiment mode can be arbitrarily combined with Embodiment Mode 1.

Embodiment 3

This embodiment describes an example in which exposure using a multi-tone mask is performed in order to reduce the number of masks.

In addition, this embodiment describes an example in which indium that is a rare metal the amount of production of which is limited is not used in the composition of an oxide semiconductor layer. In addition, this embodiment describes an example in which gallium that is one kind of rare metal is also not used as a compositional element of an oxide semiconductor layer.

Note that a multi-tone mask can perform three levels of light exposure to obtain an exposed portion, a half-exposed portion, and an unexposed portion. Light has a plurality of intensity levels after passing through a multi-tone mask. One-time light exposure and development process can form a resist mask with regions of plural thicknesses (typically, two kinds of thicknesses) to be formed. Accordingly, by using a multi-tone mask, the number of photomasks can be reduced.

As typical examples of a multi-tone mask, there are a gray-tone mask, a half-tone mask, and the like.

A gray-tone mask includes a substrate having a light-transmitting property, and a light-blocking portion and a diffraction grating which are formed thereover. The light transmittance of the light-shielding portion is 0%. In contrast, the light transmittance of the diffraction grating can be controlled by setting an interval between light-transmitting portions in slit forms, dot forms, or mesh forms to an interval less than or equal to the resolution limit of light used for the exposure. Note that the diffraction grating can be in a regular slit form, a regular dot form, or a regular mesh form, or in an irregular slit form, an irregular dot form, or an irregular mesh form.

A half-tone mask includes a substrate having a light-transmitting property, and a semi-light-transmitting portion and a light-blocking portion which are formed thereover. The transflective portion can be formed using MoSiN, MoSi, MoSiO, MoSiON, CrSi, or the like. The light-shielding portion can be formed using a light-shielding material which absorbs light, such as chromium or chromium oxide. When the half-tone mask is irradiated with light for exposure, the light transmittance of the light-blocking portion is 0% and the light transmittance of a region where the light-blocking portion and the semi-light-transmitting portion are not provided is 100%. The light transmittance of the semi-light-transmitting portion can be controlled in the range of from 10% to 70%. The light transmittance of the transflective portion can be controlled by controlling the material used for the transflective portion.

FIGS. 12A to 12E correspond to cross-sectional views illustrating steps for manufacturing a thin film transistor 360.

Figure 12A:
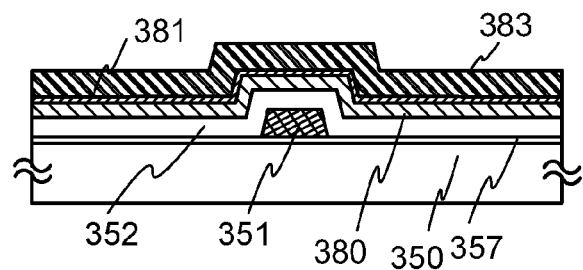
FIGS. 12A to 12E are cross-sectional views illustrating manufacturing steps of an embodiment of the present invention.

In FIG. 12A, an insulating film 357 is provided over a substrate 350 and a gate electrode layer 351 is provided thereover. In this embodiment, a silicon oxide film (having a thickness of 100 nm) is used as the insulating film 357. Over the gate electrode layer 351, a gate insulating layer 352, an oxide semiconductor film 380 including silicon oxide, an oxynitride film 381, and a conductive film 383 are stacked in this order. In this embodiment, an oxide semiconductor which does not include indium and gallium, typically a Zn—O-based oxide semiconductor, or a Sn—Zn—O-based oxide semiconductor is used as the oxide semiconductor film 380 including silicon oxide. In this embodiment, a Zn—O-based oxide semiconductor formed by a sputtering method is used as the oxide semiconductor film 380 including silicon oxide. In addition, a Zn—O—N-based oxynitride material which does not include silicon oxide is used as the oxynitride film 381.

Next, a mask 384 is formed over the gate insulating layer 352, the oxide semiconductor film 380 including silicon oxide, the oxynitride film 381, and the conductive film 383.

This embodiment describes an example in which light exposure using a multi-tone (high-tone) mask is performed for forming the mask 384.

Figure 12B:
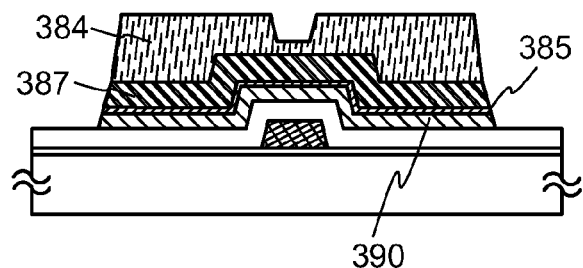
Figure 12C:
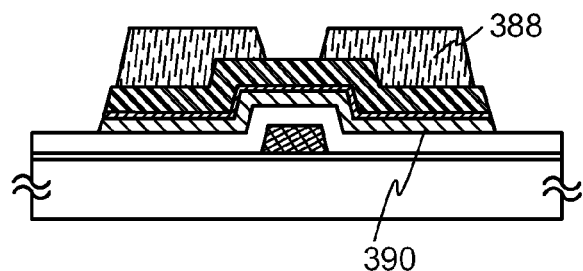

The light exposure is performed using the multi-tone mask through which light has a plurality of intensity levels, and then development is performed, whereby the mask 384 having regions with different levels of thickness can be formed as shown in FIG. 12B. The number of light-exposure masks can be reduced by using a multi-tone mask.

Next, a first etching step is performed using the mask 384 and the oxide semiconductor film 380 including silicon oxide, the oxynitride film 381, and the conductive film 383 are etched into an island shape. Accordingly, a patterned oxide semiconductor layer 390 including silicon oxide, a patterned oxynitride layer 385, and a patterned conductive layer 387 can be formed (see FIG. 12B).

Then, the resist mask 384 is subjected to ashing. As a result, the area and thickness of the mask are reduced. At this time, the resist of the mask in a region with a small thickness (a region overlapping with part of the gate electrode layer 351) is removed, and divided masks 388 can be formed (see FIG. 12C).

Figure 12D:
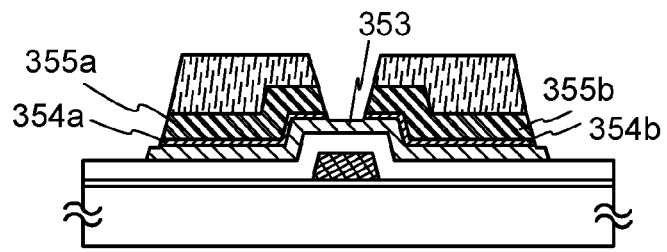

A second etching step is performed using the masks 388, and the oxynitride layer 385 and the conductive layer 387 are etched, so that an oxide semiconductor layer 353 including silicon oxide, source and drain regions 354a and 354b, and source and drain electrode layers 355a and 355b are formed (see FIG. 12D). Note that the oxide semiconductor layer 353 including silicon oxide is partly etched to become an oxide semiconductor layer having a groove (depression) and also having an end portion which is partly etched and exposed to outside.

When the first etching step is performed on the oxynitride film 381 and the conductive film 383 by dry etching, the oxynitride film 381 and the conductive film 383 are etched anisotropically, which makes the end portions of the mask 384 and the end portions of the oxynitride layer 385 and the conductive layer 387 to be aligned with each other so as to become continuous.

Similarly, when the second etching step is performed on the oxynitride layer 385 and the conductive layer 387 by dry etching, the oxynitride layer 385 and the conductive layer 387 are etched anisotropically, which makes the end portions of the masks 388, an end portion of the depression, end portions in the etched region of the oxide semiconductor layer 353 including silicon oxide, end portions of the source and drain regions 354a and 354b, and end portions of the source and drain electrode layers 355a and 355b to be aligned with each other so as to become continuous.

This embodiment describes the case where the oxide semiconductor layer 353 including silicon oxide and the source and drain electrode layers 355a and 355b have the same tapered angle at the respective end portions and are stacked so that the end portions are continuous. However, since the etching rates thereof are different depending on the etching condition and the materials of the oxide semiconductor layer and the conductive layer, the tapered angles may be different and the end portions is not necessarily continuous.

Then, the mask 388 is removed.

Figure 12E:
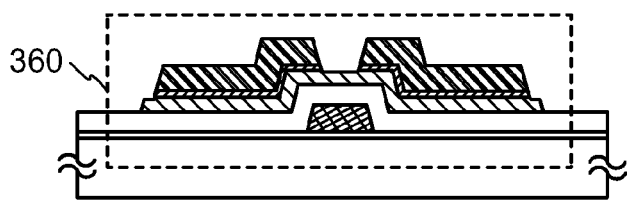

Next, heating is performed at 200° C. to 600° C. in an atmosphere including oxygen (see FIG. 12E). The oxide semiconductor layer 353 includes silicon oxide which interrupts crystallization; thus, the oxide semiconductor layer including silicon oxide can keep the amorphous state even after heating at 200° C. to 600° C.

Through the above process, the channel-etch type thin film transistor 360 in which the oxide semiconductor layer 353 including silicon oxide is provided can be manufactured.

The use of a resist mask having regions of plural thicknesses (typically, two kinds of thicknesses) formed with use of a multi-tone mask as in this embodiment enables the number of resist masks to be reduced; therefore, the process can be simplified and cost can be reduced.

Further, indium and gallium are not used in the oxide semiconductor layer including silicon oxide or the oxynitride layer as described in this embodiment, thereby reducing the cost for a target of an oxide semiconductor, which leads to cost reduction.

Accordingly, a semiconductor device can be manufactured at low cost with high productivity.

Embodiment 4

Figure 13A:
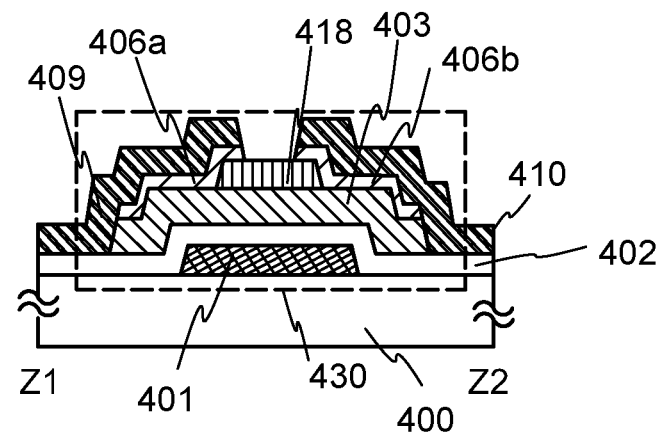
FIGS. 13A and 13B are a cross-sectional view and a top view which illustrate an embodiment of the present invention.
Figure 13B:
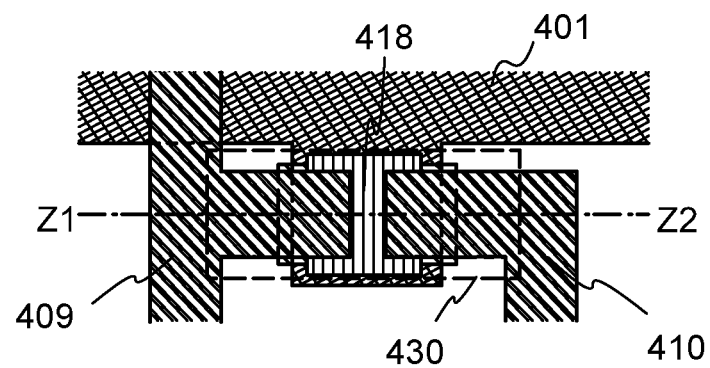

This embodiment describes an example of a channel stop type thin film transistor 430 using FIGS. 13A and 13B. FIG. 13B illustrates an example of a top view of a thin film transistor, cross-sectional view taken along dotted line Z1-Z2 of which corresponds to FIG. 13A. Described is an example in which an oxide semiconductor material which does not include indium is used in an oxide semiconductor layer in the thin film transistor 430.

In FIG. 13A, a gate electrode 401 is provided over a substrate 400. Then, over a gate insulating layer 402 covering the gate electrode 401, an oxide semiconductor layer 403 including silicon oxide is provided.

In this embodiment, a Zn—O-based oxide semiconductor formed by a sputtering method is used as the oxide semiconductor layer 403 including silicon oxide. In this embodiment, the oxide semiconductor layer 403 including silicon oxide is formed using an oxide semiconductor which does not include indium, typically, a Zn—O-based, Ga—Sn—Zn—O-based, Ga—Zn—O-based, Sn—Zn—O-based, or Ga—Sn—O-based oxide semiconductor which does not include indium.

Next, a channel protective layer 418 is provided in contact with and over the oxide semiconductor layer 403 including silicon oxide. The channel protective layer 418 is provided, so that damage to a channel formation region of the oxide semiconductor layer 403 including silicon oxide (for example, reduction in thickness due to plasma or an etchant in etching, or oxidation) can be prevented in the manufacturing process. Accordingly, the reliability of the thin film transistor 430 can be improved.

The channel protective layer 418 can be formed using an inorganic material (such as silicon oxide, silicon nitride, silicon oxynitride, or silicon nitride oxide). As a method for forming the channel protective layer 418, a vapor deposition method such as a plasma CVD method or a thermal CVD method or a sputtering method can be used. After the formation of the channel protective layer 418, the shape thereof is processed by etching. In this embodiment, a silicon oxide film is formed by a sputtering method and processed by etching using a mask formed by photolithography, so that the channel protective layer 418 is formed.

Next, source and drain regions 406a and 406b are formed over the channel protective layer 418 and the oxide semiconductor layer 403 including silicon oxide. In this embodiment, the source and drain regions 406a and 406b are formed using a Ga—Zn—O—N-based non-single-crystal film is used. Alternatively, the source and drain regions 406a and 406b may be formed using a Zn—O-based non-single-crystal film including nitrogen, i.e., a Zn—O—N non-single-crystal film.

Next, a first wiring 409 is formed over the source or drain region 406a and a second wiring 410 is formed over the source or drain region 406b. The first wiring 409 and the second wiring 410 are formed using an element selected from Al, Cr, Ta, Ti, Mo, and W, an alloy including any of the elements as a component, an alloy film including a combination of any of the elements, or the like. Alternatively, indium tin oxide (ITO), zinc oxide including aluminum (AZO: aluminum doped zinc oxide), or zinc oxide including gallium (GZO: gallium doped zinc oxide) can be used. By adding an element to be a trivalent ion such as $Al_2O_3$ or $Ga_2O_3$ to zinc oxide by a small amount (for example, at a few wt %), the resistance of the zinc oxide can be lowered.

By the provision of the source and drain regions 406a and 406b, the first wiring 409 and the second wiring 410 which are metal layers can have a good junction with the oxide semiconductor layer 403 including silicon oxide, so that stable operation can be performed in terms of heat in comparison with a Schottky junction. In addition, it is effective that the source and drain regions 406a and 406b are provided in order that carriers of a channel are supplied (on the source side), that carriers of a channel are absorbed stably (on the drain side), or that a resistive component is not produced in an interface between a wiring and an oxide semiconductor layer.

Next, heat treatment is preferably performed at 200° C. to 600° C., typically, 300° C. to 500° C. Here, heat treatment is performed in air in a furnace at 350° C. for 1 hour. Through this heat treatment, rearrangement at the atomic level occurs in the oxide semiconductor layer 403 including silicon oxide. Because strain which inhibits carrier movement is released by the heat treatment, the heat treatment (the heat treatment may annealing with light) is important. In addition, silicon oxide included in the oxide semiconductor layer 403 can prevent the oxide semiconductor layer 403 from being crystallized in heat treatment; thus, a large part of the oxide semiconductor layer 403 can keep the amorphous structure. There is no particular limitation on when to perform the heat treatment as long as it is performed after the formation of the oxide semiconductor layer 403 including silicon oxide; for example, it can be performed after the formation of a pixel electrode.

Further, indium is not used in the oxide semiconductor layer as is in this embodiment, which leads to no use of indium that might be depleted as a material.

This embodiment can be implemented in an appropriate combination with any of the structures described in the other embodiments.

Embodiment 5

Figure 14A:
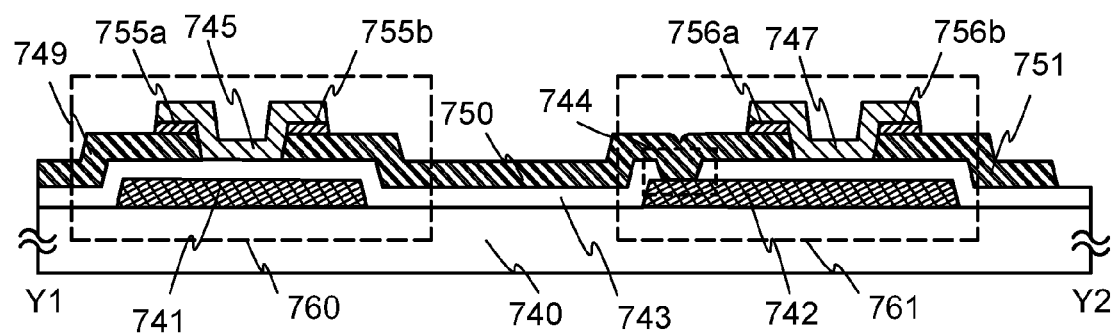
FIGS. 14A and 14B are a cross-sectional view and a top view which illustrate an embodiment of the present invention.
Figure 14B:
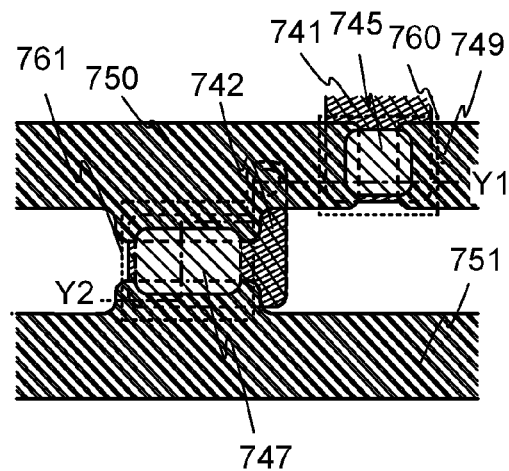

This embodiment describes an example in which an inverter circuit is formed using two n-channel thin film transistors 760 and 761 with reference to FIGS. 14A and 14B. This embodiment describes an example in which gallium is not included in each oxide semiconductor layer of the thin film transistors 760 and 761.

The driver circuit for driving a pixel portion is formed using an inverter circuit, a capacitor, a resistor, and the like. When the inverter circuit is formed using two n-channel TFTs in combination, there are an inverter circuit having a combination of an enhancement type transistor and a depletion type transistor (hereinafter, referred to as an EDMOS circuit) and an inverter circuit having a combination of two enhancement type TFTs (hereinafter, referred to as an EEMOS circuit). Note that an n-channel TFT whose threshold voltage is positive is referred to as an enhancement type transistor, and an n-channel TFT whose threshold voltage is negative is referred to as a depletion type transistor, throughout this specification.

The pixel portion and the driver circuit are formed over one substrate. In the pixel portion, on and off of voltage application to a pixel electrode are switched using enhancement type transistors arranged in a matrix.

FIG. 14A illustrates a cross-sectional structure of the inverter circuit of the driver circuit. In FIG. 14A, a first gate electrode 741 and a second gate electrode 742 are provided over a substrate 740. The first gate electrode 741 and the second gate electrode 742 each can be formed with a single layer or a stacked layer using any of a metal material such as molybdenum, titanium, chromium, tantalum, tungsten, aluminum, copper, neodymium, or scandium, or an alloy material including any of the materials as a main component.

Further, a first wiring 749, a second wiring 750, and a third wiring 751 are provided over a gate insulating layer 743 that covers the first gate electrode 741 and the second gate electrode 742. The second wiring 750 is directly connected to the second gate electrode 742 through a contact hole 744 formed in the gate insulating layer 743.

Further, a source or drain region 755a is formed over the first wiring 749, a source or drain region 755b and a source or drain region 756a are formed over the second wiring 750, and a source or drain region 756b is formed over the third wiring 751. In this embodiment, the source and drain regions 755a and 755b and the source and drain regions 756a and 756b are formed using a Zn—O—N-based non-single-crystal film which does not include silicon oxide. Alternatively, the source and drain regions 755a and 755b and the source and drain regions 756a and 756b may be formed using an In—Zn—O—N-based non-single-crystal film including nitrogen may be used.

Further, a first oxide semiconductor layer 745 including silicon oxide is provided in a position which overlaps with the first gate electrode 741 and which is over the first and second wirings 749 and 750 with the source and drain regions to 755a and 755b interposed therebetween. A second oxide semiconductor layer 747 including silicon oxide is provided in a position which overlaps with the second gate electrode 742 and which is over the second and third wirings 750 and 751 with the source and drain regions 756a and 756b interposed therebetween.

In this embodiment, the first oxide semiconductor layer 745 including silicon oxide and the second oxide semiconductor layer 747 including silicon oxide are formed using a Zn—O-based oxide semiconductor by a sputtering method. For the first oxide semiconductor layer 745 including silicon oxide and the second oxide semiconductor layer 747 including silicon oxide, an oxide semiconductor which does not contain gallium, typically, an In—Sn—Zn—O-based, In—Zn—O-based, In—Sn—O-based, Sn—Zn—O-based, or Zn—O-based oxide semiconductor, which does not include gallium, is used.

The first thin film transistor 760 includes the first gate electrode 741 and the first oxide semiconductor layer 745 including silicon oxide which overlaps with the first gate electrode 741 with the gate insulating layer 743 interposed therebetween. The first wiring 749 is a power supply line at a ground potential (a ground power supply line). This power supply line at a ground potential may be a power supply line to which a negative voltage VDL is applied (a negative power supply line).

The second thin film transistor 761 includes the second gate electrode 742 and the second oxide semiconductor layer 747 including silicon oxide which overlaps with the second gate electrode 742 with the gate insulating layer 743 interposed therebetween. The third wiring 751 is a power supply line to which a positive voltage VDD is applied (a positive power supply line).

As illustrated in FIG. 14A, the second wiring 750 which is electrically connected to both the first oxide semiconductor layer 745 including silicon oxide and the second oxide semiconductor layer 747 including silicon oxide is directly connected to the second gate electrode 742 of the second thin film transistor 761 through the contact hole 744 formed in the gate insulating layer 743. Direct connection between the second wiring 750 and the second gate electrode 742 can provide good contact and reduce the contact resistance. In comparison with the case where the second gate electrode 742 and the second wiring 750 are connected to each other with a conductive film, for example, a transparent conductive film, interposed therebetween, reduction in the number of contact holes and reduction in an area occupied by the driver circuit in accordance with the reduction in the number of contact holes can be achieved.

A top view of the inverter circuit of the driver circuit is illustrated in FIG. 14B. A cross section taken along dotted line Y1-Y2 in FIG. 14B corresponds to FIG. 14A.

As in this embodiment, gallium is not used in the oxide semiconductor layer, which leads to no use of gallium which is a high cost material.

This embodiment can be implemented in an appropriate combination with any of the structures described in the other embodiments.

Embodiment 6

Figure 15A:
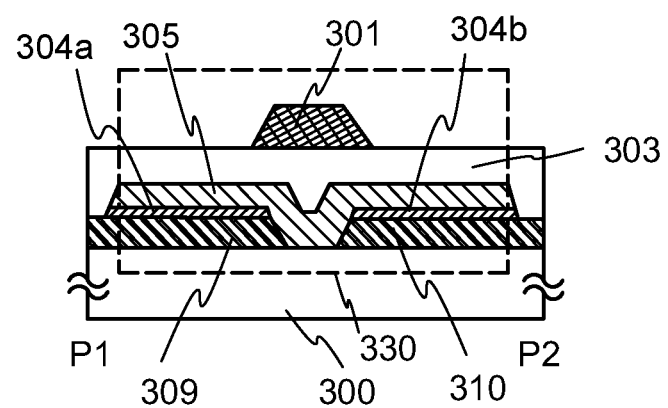
FIGS. 15A and 15B are a cross-sectional view and a top view which illustrate an embodiment of the present invention.
Figure 15B:
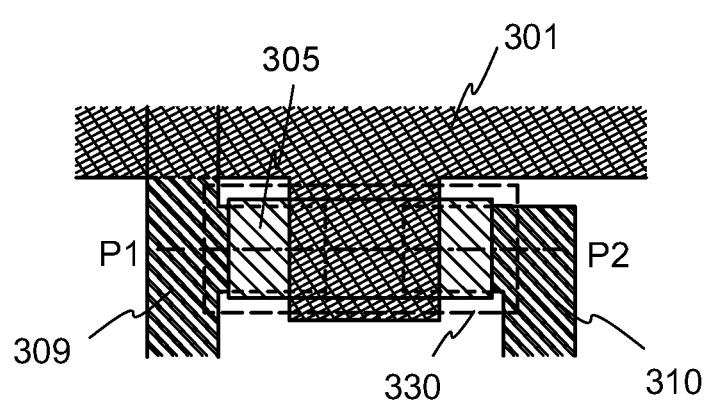

This embodiment describes an example of a top-gate type thin film transistor 330 with reference to FIGS. 15A and 15B. FIG. 15B illustrates an example of a top view of a thin film transistor, a cross-sectional view along dotted line P1-P2 of which corresponds to FIG. 15A.

In FIG. 15A, over a substrate 300, a conductive film and an oxynitride film are stacked, and etching is performed, so that a first wiring 309 and a second wiring 310 are formed and oxynitride layers 304a and 304b are formed thereover. The first wiring 309 and the second wiring 310 function as source and drain electrodes. The oxynitride layers 304a and 304b function as source and drain regions and are formed using an In—Ga—Zn—O—N-based non-single-crystal film.

Next, an oxide semiconductor layer 305 including silicon oxide ($SiO_x$) is formed to cover an exposed region of the substrate 300 and the oxynitride layers 304a and 304b. In this embodiment, a Zn—O-based oxide semiconductor including silicon oxide is used as the oxide semiconductor layer including silicon oxide.

Next, a gate insulating layer 303 covering the second oxide semiconductor layer 305, the first wiring 309, and the second wiring 310 is formed.

Next, heat treatment is preferably performed at 200° C. to 600° C., typically, 300° C. to 500° C. Here, heat treatment is performed in air in a furnace at 350° C. for 1 hour. Through this heat treatment, rearrangement at the atomic level occurs in the oxide semiconductor layer 305 including silicon oxide. Because strain which inhibits carrier movement is released by the heat treatment, the heat treatment (the heat treatment may annealing with light) is important.

Next, a gate electrode 301 is provided in a position which is over the gate insulating layer 303 and overlaps with a region where the oxide semiconductor layer 305 including silicon oxide is in contact with the substrate 300.

Through the above process, the top-gate type thin film transistor 330 can be manufactured.

This embodiment can be implemented in an appropriate combination with any of the structures described in the other embodiments.

Embodiment 7

Figure 16A:
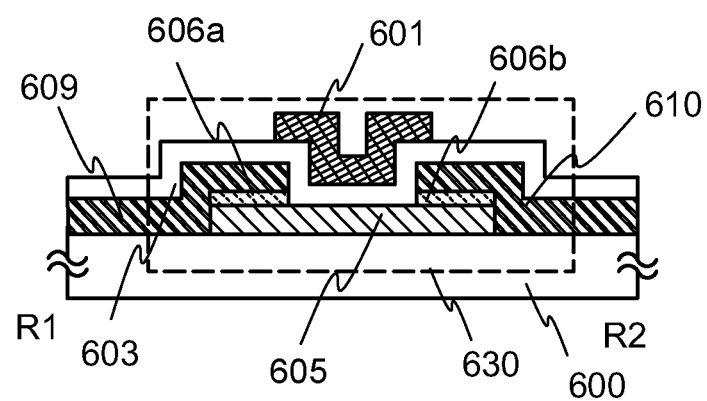
FIGS. 16A and 16B are a cross-sectional view and a top view which illustrate an embodiment of the present invention.
Figure 16B:
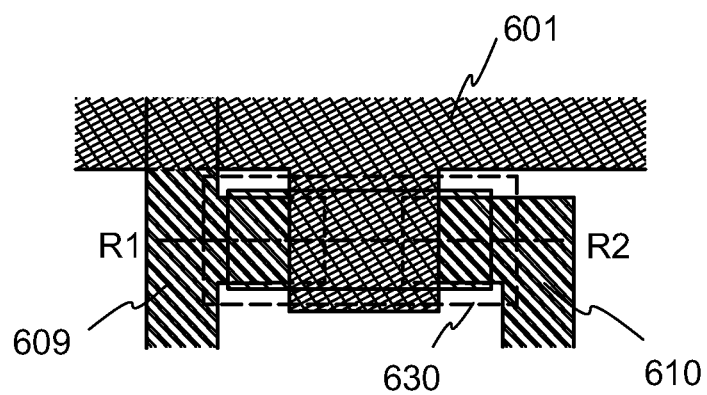

This embodiment describes an example of a top-gate type thin film transistor 630 with reference to FIGS. 16A and 16B. FIG. 16B illustrates an example of a top view of a thin film transistor, a cross-sectional view along dotted line R1-R2 of which corresponds to FIG. 16A.

In FIG. 16A, an oxide semiconductor layer 605 including silicon oxide is formed over a substrate 600. In this embodiment, the oxide semiconductor layer 605 is formed using a Zn—O-based oxide semiconductor including silicon oxide.

Next, source and drain regions 606a and 606b are formed over the oxide semiconductor layer 605. In this embodiment, the source and drain regions 606a and 606b are formed using a Ga—Zn—O-based non-single-crystal film. Alternatively, the source and drain regions 606a and 606b may be formed using a Ga—Zn—O-based non-single-crystal film including nitrogen, i.e., a Ga—Zn—O—N-based non-single-crystal film (also called a GZON film).

Next, a first wiring 609 and a second wiring 610 are formed over the source and drain regions 606a and 606b. Note that the first and second wirings 609 and 610 function as source and drain electrodes.

Then, a gate insulating layer 603 is formed over the first and second wirings 609 and 610.

Next, a gate electrode 601 is provided in a position which is over the gate insulating layer 603 and overlaps with a region where the oxide semiconductor layer 605 is in contact with the gate insulating layer 603.

Next, heat treatment is preferably performed at 200° C. to 600° C., typically, 300° C. to 500° C. Here, heat treatment is performed in air in a furnace at 350° C. for 1 hour. Through this heat treatment, rearrangement at the atomic level occurs in the oxide semiconductor layer 605. Because strain which inhibits carrier movement is released by the heat treatment, the heat treatment (the heat treatment may be annealing with light) is important.

Through the above process, the top-gate type thin film transistor 630 can be manufactured.

Embodiment 8

Figure 31A:
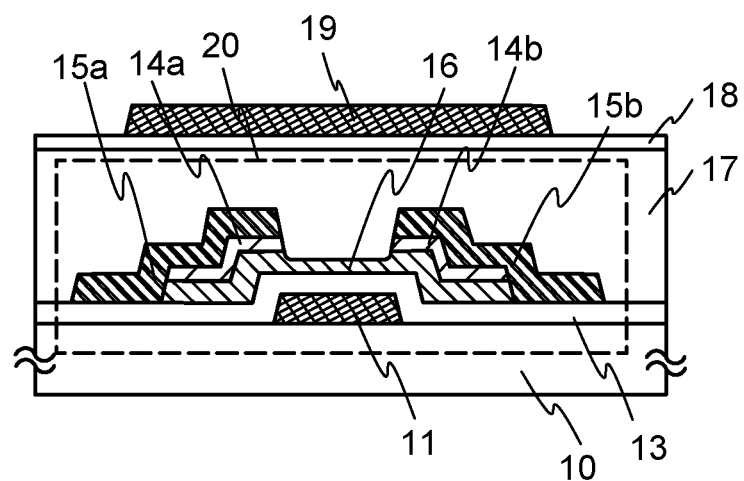
FIGS. 31A and 31B are cross-sectional views each illustrating an embodiment of the present invention.

FIG. 31A is an example of a cross sectional view of a thin film transistor in which an oxide semiconductor layer is sandwiched between two gate electrodes provided over and below the oxide semiconductor layer. This embodiment describes an example of a manufacturing method by which thin film transistors used for a pixel portion and a driver circuit are provided over a substrate having an insulating surface.

First, a first gate electrode layer 11 is formed over a substrate 10 having an insulating surface. As the substrate 10 having an insulating surface, any glass substrate used in the electronics industry (also called an alkali-free glass substrate) such as an aluminosilicate glass substrate, an aluminoborosilicate glass substrate, or a barium borosilicate glass substrate, a plastic substrate with heat resistance which can withstand a process temperature in this manufacturing process, or the like can be used. In the case where the substrate 10 is mother glass, the substrate may have any of the following sizes: the first generation (320 mm×400 mm), the second generation (400 mm×500 mm), the third generation (550 mm×650 mm), the fourth generation (680 mm×880 mm or 730 mm×920 mm), the fifth generation (1000 mm×1200 mm or 1100 mm×1250 mm), the sixth generation (1500 mm×1800 mm), the seventh generation (1900 mm×2200 mm), the eighth generation (2160 mm×2460 mm), the ninth generation (2400 mm×2800 mm or 2450 mm×3050 mm), the tenth generation (2950 mm×3400 mm), and the like.

In addition, the material of the first gate electrode layer 11 can be formed with a single layer or a stacked layer using a metal material such as molybdenum, titanium, chromium, tantalum, tungsten, aluminum, copper, neodymium, or scandium, or an alloy material including any of the materials as a component. After the conductive layer is formed over the entire surface of the substrate 10, a photolithography step is performed and a resist mask is formed over the conductive layer. Then, unnecessary portions are removed by etching to form wirings and electrodes (a gate wiring including the first gate electrode layer 11, a capacitor wiring, a terminal electrode, and the like). In this embodiment, a single layer of tungsten having a thickness of 100 nm is used.

For example, in the case where the first gate electrode layer 11 has a stacked-layer structure, the following structures are preferable: a two-layer structure of an aluminum layer and a molybdenum layer stacked thereover, a two-layer structure of a copper layer and a molybdenum layer stacked thereover, a two-layer structure of a copper layer and a titanium nitride layer or a tantalum nitride layer stacked thereover, and a two-layer structure of a titanium nitride layer and a molybdenum layer. Alternatively, a stack including a copper layer including Ca and a copper oxide layer including Ca thereover, which serves as a barrier layer; or a stack including a copper layer including Mg and a copper oxide layer including Mg thereover, which serves as a barrier layer; can be employed. Further alternatively, as a three-layer structure, a stack of a tungsten layer or a tungsten nitride layer, a layer of an alloy of aluminum and silicon or an alloy of aluminum and titanium, and a titanium nitride layer or a titanium layer is preferable.

Next, the resist mask is removed and then a gate insulating layer 13 covering the first gate electrode layer 11 is formed. The gate insulating layer 13 is formed to a thickness of 50 nm to 400 nm by a sputtering method, a PCVD method, or the like. The gate insulating layer 13 is formed to have a single-layer structure or a stacked-layer structure using an inorganic insulating film such as a silicon oxide film, a silicon oxynitride film, a silicon nitride oxide film, a silicon nitride film, or a tantalum oxide film. The gate insulating layer 13 can be formed using a silicon oxide layer by a CVD method using an organosilane gas. As an organosilane gas, a silicon-containing compound such as tetraethoxysilane (TEOS) (chemical formula: $Si(OC_2H_5)_4$), tetramethylsilane (TMS) (chemical formula: $Si(CH_3)_4$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), or trisdimethylaminosilane (chemical formula: $SiH(N(CH_3)_2)_3$) can be used.

In this embodiment, the gate insulating layer 13 having a thickness of 100 nm is formed over the first gate electrode layer 11 as follows: a monosilane gas ($SiH_4$), nitrous oxide ($N_2O$), and a rare gas are introduced into a chamber of a high-density plasma apparatus as source gases, and high density plasma is generated under a pressure of 10 Pa to 30 Pa. In this embodiment, the high-density plasma apparatus refers to an apparatus which can realize a plasma density of $1 \times 10^{11}$/$cm^3$ or more. For example, plasma is generated by applying a microwave power of 3 kW to 6 kW so that the insulating film is formed. When the insulating film is formed, the flow ratio of the monosilane gas ($SiH_4$) to the nitrous oxide ($N_2O$) which are introduced into the chamber is in the range of 1:10 to 1:200. In addition, as the rare gas which is introduced into the chamber, helium, argon, krypton, xenon, or the like can be used. In particular, argon, which is inexpensive, is preferably used.

In addition, since the gate insulating layer 13 formed by using the high-density plasma apparatus can have a uniform thickness, the gate insulating layer 13 has excellent step coverage. Further, the thickness of an insulating film formed by using the high-density plasma apparatus can be controlled precisely.

The insulating film obtained by the high-density plasma apparatus is greatly different from an insulating film formed by using a conventional parallel plate PCVD apparatus. The insulating film obtained by the high-density plasma apparatus has an etching rate which is lower than that of the insulating film formed by using the conventional parallel plate PCVD apparatus by 10% or more or 20% or more in the case where the etching rates with the same etchant are compared to each other. Thus, it can be said that the insulating film obtained by using the high-density plasma apparatus is a dense film.

Next, an oxide semiconductor film is formed over the gate insulating layer 13. The thickness of the oxide semiconductor film is at least 30 nm or more, preferably 60 nm or more and 150 nm or less. In this embodiment, a first Zn—O-based non-single-crystal film is formed as the oxide semiconductor film. In this embodiment, the first Zn—O-based non-single-crystal film is formed under the condition where a target is an oxide semiconductor target (ZnO) including zinc (Zn) with a diameter of 8 inches, the distance between the substrate and the target is set at 170 mm, the pressure is set at 0.4 Pa, and the direct current (DC) power supply is set at 0.5 kW in an argon atmosphere or an oxygen atmosphere. Note that a pulse direct current (DC) power supply is preferable because dust can be reduced and the film thickness can be uniform.

Note that in the case where a large-area glass substrate is used, manufacturing in which one large target material is attached to one large backing plate is difficult and costly. Therefore, the target material is divided and bonded to a backing plate. The target is formed by attaching the target material to a backing plate (a plate for attaching a target material thereto) and vacuum packing. In formation of the first Zn—O-based non-single-crystal film, in order to obtain excellent electrical characteristics of a thin film transistor, it is preferable that the backing plate including the target material attached thereto is set in a sputtering apparatus while being kept away from moisture and the like in the air as much as possible. It is preferable that the target material is kept away from moisture and the like in the air as much as possible not only at the time of setting the target material to the sputtering apparatus, but also during the period up to vacuum-packing, during which manufacturing the target, bonding the target materials to the backing plate, and the like are performed.

In the case where the Zn—O-based oxide semiconductor film is formed by a sputtering method, the oxide semiconductor target including Zn may include an insulating impurity such as silicon oxide. Inclusion of the insulating impurity in the oxide semiconductor facilitates amorphization of the oxide semiconductor film to be formed. In addition, when the oxide semiconductor layer is subjected to heat treatment in a later step, crystallization due to the heat treatment can be suppressed.

Next, an oxide semiconductor film (in this embodiment, a second Zn—O-based non-single-crystal film) which has lower resistance than the first Zn—O-based non-single-crystal film is formed by a sputtering method without exposure to the air. In this embodiment, an oxynitride film including zinc is formed using an oxide semiconductor target (ZnO) including zinc (Zn) in an atmosphere including a nitrogen gas by a sputtering method. This oxynitride film becomes an oxide semiconductor film which has lower resistance than the first Zn—O-based non-single-crystal by heat treatment performed later.

Next, a photolithography step is performed and a resist mask is formed over the second Zn—O-based non-single-crystal film. Then, the first and the second Zn—O-based non-single-crystal films are etched. Note that etching here is not limited to wet etching and dry etching may also be performed.

Next, the resist mask is removed and then a conductive film formed from a metal material is formed over the first and the second Zn—O-based non-single-crystal films by a sputtering method or a vacuum evaporation method. As a material for the conductive film, an element selected from Al, Cr, Ta, Ti, Mo, and W; an alloy including any of the elements as a component; an alloy film including a combination of any of the elements; and the like can be given. Further, in the case where heat treatment is performed at 200 to 600° C., the conductive film preferably has heat resistance for such heat treatment. Since use of Al alone brings disadvantages such as low heat resistance and a tendency to be corroded, Al is used in combination with a conductive material having heat resistance. As the conductive material having heat resistance which is used in combination with Al, any of the following materials may be used: an element selected from titanium (Ti), tantalum (Ta), tungsten (W), molybdenum (Mo), chromium (Cr), neodymium (Nd), and scandium (Sc), an alloy including any of the elements as a component, an alloy film including a combination of any of the elements, and a nitride including any of the elements as a component.

Here, as the conductive film, a conductive film in which an Al film and a Ti film are stacked is used. Alternatively, the conductive film may be a single layer of a titanium film. Still alternatively, the conductive film may have a three-layer structure including a Ti film, an aluminum film including Nd (Al—Nd) which is stacked on the Ti film, and a Ti film formed on these films. The conductive film may have a single-layer structure of an aluminum film including silicon.

Next, a photolithography step is performed and a resist mask is formed over the conductive film. Then, unnecessary portions are removed by etching, so that source and drain electrode layers 15a and 15b are formed. Wet etching or dry etching is employed as an etching method at this time. Here, dry etching is employed using a mixed gas of $SiCl_4$, $Cl_2$, and $BCl_3$ as a reactive gas to etch the conductive film in which the Ti film and the Al film are stacked. Thus, the source and drain electrode layers 15a and 15b are formed. In addition, in this etching, the second Zn—O-based non-single-crystal film is selectively etched using the same resist mask to form source and drain regions 14a and 14b, and part of the first Zn—O-based non-single-crystal film is exposed.

Through the above etching step using the resist mask, the exposed first Zn—O-based non-single-crystal film is selectively etched. As a result, an oxide semiconductor layer 16 including a region which has a smaller thickness than a region overlapping with the source electrode layer 15a or the drain electrode layer 15b is formed. The source and drain electrode layers 15a and 15b, the source and drain regions 14a and 14b, and the exposed first Zn—O-based non-single-crystal film are etched in one step. Therefore, edge portions of the source and drain electrode layers 15a and 15b and the source and drain regions 14a and 14b are aligned and continuous as illustrated in FIG. 1A. Note that the etching of the source and drain electrode layers 15a and 15b, the source and drain regions 14a and 14b, the exposed first Zn—O-based non-single-crystal film is not limited to the one-time etching. Alternatively, the etching may be performed in a plurality of steps.

After the resist mask is removed, heat treatment at 200° C. to 600° C., typically 300° C. to 500° C., is preferably performed. In this case, heat treatment is performed in a furnace at 350° C. for 1 hour in a nitrogen atmosphere including oxygen. Through this heat treatment, rearrangement at the atomic level occurs in the first Zn—O-based non-single-crystal film. Because strain which inhibits carrier movement is released by the heat treatment, the heat treatment (the heat treatment may be annealing with light) is important. In addition, resistance of the second Zn—O-based non-single-crystal film is lowered and the source and drain regions 14a and 14b having low resistance are formed. There is no particular limitation on when to perform the heat treatment as long as it is performed after the formation of the second Zn—O-based non-single-crystal film.

Next, a resin layer 17 is formed to a thickness of 0.5 μm to 3 μm, which covers the source and drain electrode layers 15a and 15b and the oxide semiconductor layer 16 including the region having a small thickness. As a photosensitive or non-photosensitive organic material for the resin layer 17, polyimide, acrylic, polyamide, polyimideamide, resist, benzocyclobutene, or a stack of any of the materials is used. Here, photosensitive polyimide is formed by a coating method for the purpose of reduction of the number of steps. Exposure, development, and baking are performed and the resin layer 17 formed form polyimide having a thickness of 1.5 μm whose surface is flat is formed. The resin layer 17 functions as a first protective insulating layer which protects the oxide semiconductor layer 16 including the region having a small thickness and the source and drain regions 14a and 14b from plasma damage in a later step of formation of a second protective insulating layer. The resin layer 17 as the first protective insulating layer, which covers and contact the exposed region having a small thickness of the oxide semiconductor layer 16, also has a function of blocking moisture, hydrogen, or the like from entering the oxide semiconductor layer 16. The resin layer can be formed without a pinhole and is good in terms of step coverage because the resin layer can be formed to have a flat surface regardless of unevenness of a surface over which the resin layer is formed.

In addition, before formation of the resin layer 17, the exposed region having a small thickness of the oxide semiconductor layer 16 may be subjected to oxygen radical treatment. By the oxygen radical treatment, an exposed surface and its vicinity of the oxide semiconductor layer can be modified into an oxygen-excess region. Oxygen radicals may be produced in a plasma generation apparatus with the use of a gas including oxygen, or in an ozone generation apparatus. By exposing a thin film to the produced oxygen radicals or oxygen, the surface of the film can be modified. The radical treatment is not limited to one using oxygen radicals, and may be performed using argon and oxygen radicals. The treatment using argon and oxygen radicals is treatment in which an argon gas and an oxygen gas are introduced to generate plasma, thereby modifying a surface of a thin film.

Then, a second protective insulating layer 18 is formed to a thickness of 50 nm to 400 nm by a PCVD method or a sputtering method under a low power condition (or at a low substrate temperature of lower than 200° C., preferably a room temperature to 100° C.). Alternatively, the second protective insulating layer 18 may be formed under a low power condition using a high-density plasma apparatus. The second protective insulating layer 18 obtained by a high-density plasma apparatus can be denser than that obtained by using a PCVD method. The second protective insulating layer 18, which is formed using a silicon nitride film, a silicon oxynitride film, or a silicon nitride oxygen film, blocks moisture, hydrogen ions, OH⁻, or the like. Here, a silicon nitride film having a thickness of 200 nm is formed by a PCVD method under the following conditions: the flow rate of a silane gas is 35 sccm, the flow rate of ammonia ($NH_3$) is 300 sccm, and the flow rate of a hydrogen gas is 800 sccm; the pressure is 60 Pa, the RF electric power is 300 W; and the power frequency is 13.56 MHz. These films have a function of blocking moisture, hydrogen, OH⁻, or the like. When a second gate electrode is selectively etched so as to have a top surface having a desired shape, the second protective insulating film can function as an etching stopper. In addition, in this case, the first protective insulating film and the second protective insulating film function as a second gate insulating layer.

Further, in the above structure, the region having a small thickness of the oxide semiconductor layer is a channel formation region overlapping with the first gate electrode and the second gate electrode. In the region with a small thickness of the oxide semiconductor layer, a region on the second gate electrode side is referred to as a back channel. When film formation using plasma including moisture, hydrogen, OH⁻, or the like is performed to form a film in contact with the back channel, electric charge is accumulated and negative charge or OH⁻ of the plasma enters an oxygen-deficiency-type defect portion in a buffer layer. As a result, there is a possibility that an NI junction, which is intended to be formed, is not formed. A lack of oxygen in the oxide semiconductor layer increases Zn which is easy to receive negative charges in the oxide semiconductor layer. When negative charge of the plasma enters the oxygen-deficiency-type defect portion, the buffer layer (an N⁺ region) is changed to an N-type region and further, changed to an N⁻ region or an I-type region. As a result, an NI junction provided at an interface of the buffer layer disappears. This possibly causes disappearance of a depletion layer and an unstable value of Vg-Id characteristics of a thin film transistor.

After a conductive layer is formed, a photolithography step is performed and a resist mask is formed over the conductive layer. Then, unnecessary portions are removed by etching and wirings and electrodes (wirings including a second gate electrode layer 19 and the like) are formed. When the second gate electrode layer 19 is selectively etched so as to have a top surface having a desired shape, the second protective insulating layer 18 can function as an etching stopper.

As the conductive layer formed over the second protective insulating layer 18, a metal material (an element selected from aluminum (Al), copper (Cu), titanium (Ti), tantalum (Ta), tungsten (W), molybdenum (Mo), chromium (Cr), neodymium (Nd), and scandium (Sc), or an alloy including any of the elements as a component) can be used. These films have a light-blocking property, and therefore can block light to the oxide semiconductor layer.

In the cross section of FIG. 31A, the width of the second gate electrode layer 19 is larger than that of the first gate electrode layer 11 and larger than that of the oxide semiconductor layer. It is effective that light is blocked by increasing the width of the second gate electrode layer 19 than that of the oxide semiconductor layer so that the second gate electrode layer 19 covers the top surface of the oxide semiconductor layer. Since the region having a small thickness of the oxide semiconductor layer 16 is not covered with the source electrode or the drain electrode, there is a possibility that the electric characteristics of the thin film transistor are changed due to light irradiation. Since the Zn—O-based non-single-crystal film formed by a sputtering method is sensitive to light having a wavelength of 450 nm or less, provision of the second gate electrode layer 19, which is a light-blocking layer blocking light having a wavelength of 450 nm or less, is useful.

Alternatively, the conductive layer formed over the second protective insulating layer 18 can be formed using a light-transmitting conductive material such as indium oxide including tungsten oxide, indium zinc oxide including tungsten oxide, indium oxide including titanium oxide, indium tin oxide including titanium oxide, indium tin oxide (hereinafter referred to as ITO), indium zinc oxide, or indium tin oxide to which silicon oxide is added. In the case of using a light-transmitting conductive material, when the same material as that used for a pixel electrode is used, the gate electrode and the pixel electrode can be formed using the same photomask. When the second gate electrode and the pixel electrode are formed using the same material, the number of steps can be reduced. In addition, in the case where the second gate electrode is formed using a light-transmitting conductive material, it is preferable that a light-blocking layer for shielding the oxide semiconductor layer 16 including the region having a small thickness from light is separately formed so as to overlap the region with a small thickness of the oxide semiconductor layer 16. A material having a light transmittance of at least less than 50%, preferably less than 20% at a wavelength of 400 nm to 450 nm is used for the light-blocking layer. For example, a metal film of chromium or titanium nitride or a black resin can be used as a material of the light-blocking layer. In the case of using a black resin for blocking light, as the light intensity is higher, the film of the black resin needs to be thicker. Therefore, in the case where the film of the black resin needs to be thin, a metal film which has a high light-blocking property and can be subjected to a fine etching process and can be thinned is preferably used.

Through the above process, a thin film transistor 20 illustrated in FIG. 31A can be obtained.

A general photomask is used for the photolithography step in an example described in the above. When a resist mask having a plurality of thicknesses (typically, two kinds of thicknesses), which is formed by a photolithography step using a multi-tone mask, is used, the number of resist masks can be reduced and therefore the process can be simplified and cost can be reduced.

In addition, when the second gate electrode layer 19 and the first gate electrode layer 11 are electrically connected to each other in order that the second gate electrode layer 19 and the first gate electrode layer 11 have the same potential, before the second gate electrode layer 19 is formed over the second protective insulating layer 18, a photolithography step is performed, a resist mask is formed over the second protective insulating layer 18, and unnecessary portions are removed by etching, so that an opening reaching the first gate electrode layer 11 is formed.

Note that in the case where the second gate electrode layer 19 and the first gate electrode layer 11 have different potential, the opening for electrical connection of the second gate electrode layer 19 and the first gate electrode layer 11 is not required.

Figure 31B:
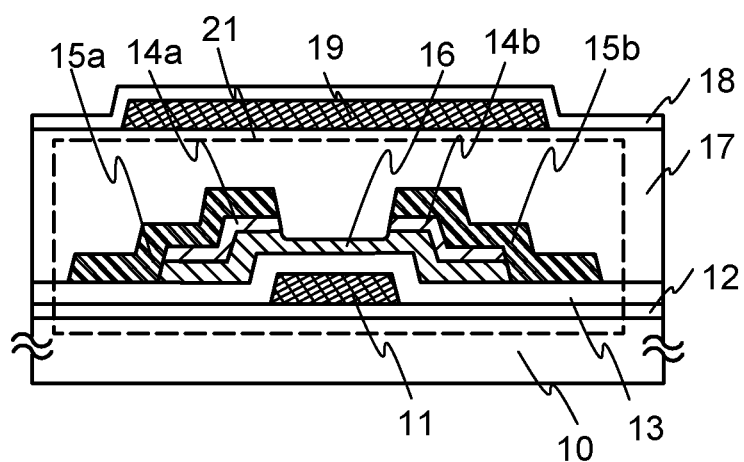

FIG. 31B is partly different from FIG. 31A. In FIG. 31B, the same portions as those of FIG. 31A other than different portions are denoted by the same reference numerals.

FIG. 31B illustrates an example in which the second gate electrode layer 19 and the second protective insulating layer 18 are formed in an order different from FIG. 31A.

As illustrated in FIG. 31B, the second gate electrode layer 19 of a thin film transistor 21 is formed over and in contact with the resin layer 17 that is the first protective insulating film and provided between the resin layer 17 and the second protective insulating layer 18. The second gate insulating layer of the thin film transistor 20 in FIG. 31A is a stack of the resin layer 17 and the second protective insulating layer 18, whereas the second gate insulating layer of the thin film transistor 21 is the resin layer 17 alone. In the case where the second gate electrode layer 19 is provided between the resin layer 17 and the second protective insulating layer 18, the second gate electrode layer 19 as well as the resin layer 17 has an effect of reducing plasma damage to the oxide semiconductor layer 16.

In addition, FIG. 31B illustrates an example in which a base insulating layer 12 is provided between the first gate electrode layer 11 and the substrate 10. In the case where a silicon oxynitride film, a silicon nitride oxide film, or a silicon nitride film, or the like having a thickness of 50 nm to 200 nm is used as the base insulating layer 12, the base insulating layer 12 can block an impurity from the glass substrate, sodium for example, from diffusing into and entering an oxide semiconductor to be formed later over the base insulating layer 12. In addition, in the case where the base insulating layer 12 is provided, the substrate 10 can be prevented from being etched in the etching step for forming the first gate electrode layer 11.

Further, an example of the channel-etch type thin film transistor which is one kind of an inverted-staggered thin film transistor is described in the above structure; however, there is no particular limitation on the structure of the thin film transistor. For example, a bottom-contact thin film transistor may be employed. An oxide semiconductor layer of a bottom-contact structure is formed after source and drain electrodes are formed by selectively etching a conductive film; therefore, the number of steps after formation of the oxide semiconductor layer is small and the number of exposure of the oxide semiconductor layer to plasma is also small as compared to the case of a channel-etch TFT. As the number of exposure to plasma is small, plasma damage to the oxide semiconductor layer can be reduced.

This embodiment can be implemented in an appropriate combination with any of the structures described in the other embodiments.

Embodiment 9

Figure 32A:
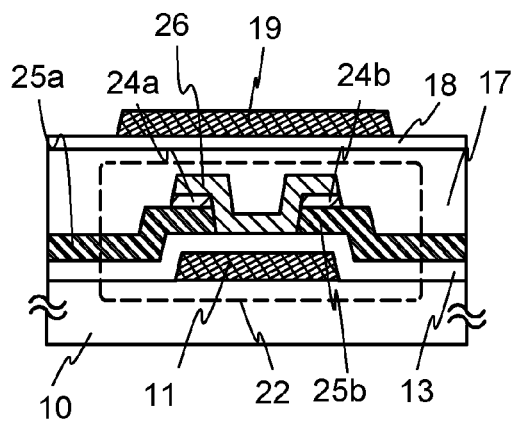
FIGS. 32A to 32D are cross-sectional views each illustrating an embodiment of the present invention.

FIG. 32A is an example of a cross sectional view of a thin film transistor in which an oxide semiconductor layer is sandwiched between two gate electrodes provided over and below the oxide semiconductor layer. This embodiment describes an example of a manufacturing method by which thin film transistors used for a pixel portion and a driver circuit are provided over a substrate having an insulating surface.

The same steps as Embodiment 8 are employed from formation of a first gate electrode layer 11 over a substrate 10 having an insulating surface up to formation of a gate insulating layer 13 covering the first gate electrode layer 11. Therefore, detailed description is omitted and the same portions as those of FIG. 31A are denoted by the same reference numerals.

A conductive film is formed from a metal material over the gate insulating layer 13 by a sputtering method or a vacuum evaporation method. In this embodiment, a three-layer structure of a Ti film, an aluminum film including Nd, and a Ti film formed by a sputtering method is employed. As a material for the conductive film, an element selected from Al, Cr, Ta, Ti, Mo, and W; an alloy including any of the elements as a component; an alloy film including a combination of any of the elements; and the like can be given. Further, the conductive film may have a two-layer structure, and a titanium film may be stacked over an aluminum film. Alternatively, the conductive film may have a single-layer structure of an aluminum film including silicon or a single-layer structure of a titanium film.

Then, an oxide semiconductor film (a buffer layer) having low resistance is formed by a sputtering method without exposure to the air. There is no particular limitation on a material film of the buffer layer as long as it has lower resistance than an oxide semiconductor layer 26 formed later. As the buffer layer, an oxynitride film including zinc is formed over the conductive film. The oxynitride film including zinc is obtained by using an oxide semiconductor target (ZnO) including zinc (Zn) in an atmosphere including a nitrogen gas by a sputtering method. In this embodiment, the buffer layer is formed to a thickness of 10 nm using an oxide semiconductor target (ZnO) under the following conditions: the flow rate of Ar is 72 sccm, the flow rate of oxygen is 3 sccm, the electric power is 3.2 kw, and the pressure is 0.16 Pa. Note that in order to reduce plasma damage to the buffer layer, the electric power may be reduced to 1 kw at the formation.

Examples of a sputtering method include an RF sputtering method in which a high-frequency power source is used as a sputtering power source, a DC sputtering method, and a pulsed DC sputtering method in which a bias is applied in a pulsed manner. An RF sputtering method is mainly used in the case where an insulating film is formed, and a DC sputtering method is mainly used in the case where a metal film is formed.

In addition, there is also a multi-source sputtering apparatus in which a plurality of targets of different materials can be set. With the multi-source sputtering apparatus, films of different materials can be formed to be stacked in the same chamber, or a film of plural kinds of materials can be formed by electric discharge at the same time in the same chamber.

In addition, there are a sputtering apparatus provided with a magnet system inside the chamber and used for a magnetron sputtering, and a sputtering apparatus used for an ECR sputtering in which plasma generated with the use of microwaves is used without using glow discharge.

Furthermore, as a deposition method by sputtering, there are also a reactive sputtering method in which a target substance and a sputtering gas component are chemically reacted with each other during deposition to form a thin compound film thereof, and a bias sputtering in which a voltage is also applied to a substrate during deposition.

The target is formed by attaching a target material to a backing plate (a plate for attaching a target material thereto). As for the attachment of the target material to the backing plate, the target material may be divided and attached to one backing plate. A case where four target materials are attached to one backing plate is referred to as four divisions. Further, a case where nine target materials are attached to one backing plate is referred to as nine divisions. There is no particular limitation of the number of divisions of target materials. When the target material is divided, warpage of the target material can be relaxed in the attachment of the target material to the backing plate. In particular, when the thin film is formed over a large substrate, such divided target materials can be suitably used for a target which is upsized in accordance with the size of the large substrate. Needless to say, one target material may be attached to one backing plate.

Next, a photolithography step is performed to form a resist mask over the buffer layer, and unnecessary portions are removed by etching to form source and drain electrode layers 25a and 25b. The buffer layer whose top surface has the same shape as the source and drain electrode layers 25a and 25b remains over the source and drain electrode layers 25a and 25b. After that, the resist mask is removed.

Next, an oxide semiconductor film having a thickness of 5 nm to 200 nm is formed. In this embodiment, the oxide semiconductor film is formed to a thickness of 50 nm using an oxide semiconductor target (ZnO) including silicon oxide ($SiO_x$) and zinc (Zn) under the following formation conditions: the flow rate of Ar is 50 sccm, the flow rate of oxygen is 20 sccm, the electric power is 1 kw, and the pressure is 0.22 Pa.

In addition, before the oxide semiconductor film is formed, plasma treatment for removing dust attached to surfaces of the source and drain electrode layers 25a and 25b and the gate insulating layer is preferably performed. For example, the plasma treatment is performed on the exposed source and drain electrode layers 25a and 25b and the exposed gate insulating layer by performing reverse sputtering in which plasma is generated by an RF power supply by introduction of an argon gas.

Next, a photolithography step is performed to form a resist mask over the oxide semiconductor film, and unnecessary portions are removed by etching to form the oxide semiconductor layer 26. In addition, the buffer layer is selectively etched using the same resist mask and source and drain regions 24a and 24b are formed.

Then, after the resist mask is removed, heat treatment at 200° C. to 600° C., typically 300° C. to 500° C., is preferably performed. Here, heat treatment is performed in a furnace at 350° C. for 1 hour in a nitrogen atmosphere including oxygen. Through this heat treatment, rearrangement at the atomic level occurs in the Zn—O-based non-single-crystal film. Because strain which inhibits carrier movement is released by the heat treatment, the heat treatment (the heat treatment may be annealing with light) is important.

A resin layer 17 covering the source and drain electrode layers 25a and 25b and the oxide semiconductor layer 26 is formed to a thickness in the range of 5 μm to 3 μm. As a photosensitive or non-photosensitive organic material for the resin layer 17, polyimide, acrylic, polyamide, polyimideamide, resist, benzocyclobutene, or a stack of any of these materials is used.

Note that steps after formation of the resin layer 17 are the same as those of Embodiment 8 and therefore, are described briefly here.

Then, a second protective insulating layer 18 is formed to a thickness of 50 nm to 400 nm by a PCVD method or a sputtering method under a low power condition (or at a low substrate temperature of lower than 200° C., preferably a room temperature to 100° C.). Alternatively, the second protective insulating layer 18 may be formed under a low power condition using a high-density plasma apparatus.

After a conductive layer is formed, a photolithography step is performed and a resist mask is formed over the conductive layer. Then, unnecessary portions are removed by etching and wirings and electrodes (wirings including a second gate electrode layer 19 and the like) are formed.

Through the above process, a thin film transistor 22 illustrated in FIG. 32A can be obtained.

Figure 32B:
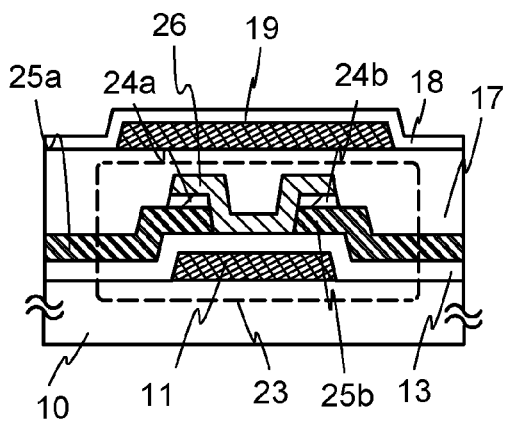

FIG. 32B is partly different from FIG. 32A. In FIG. 32B, the same portions as those of FIG. 32A other than different portions are denoted by the same reference numerals.

FIG. 32B illustrates an example in which the second gate electrode layer 19 and the second protective insulating layer 18 are formed in an order different from FIG. 32A.

As illustrated in FIG. 32B, the second gate electrode layer 19 of a thin film transistor 23 is formed over and in contact with the resin layer 17 that is the first protective insulating film and provided between the resin layer 17 and the second protective insulating layer 18. In the case where the second gate electrode layer 19 is provided between the resin layer 17 and the second protective insulating layer 18, the second gate electrode layer 19 as well as the resin layer 17 has an effect of reducing plasma damage to the oxide semiconductor layer 26.

Figure 32C:
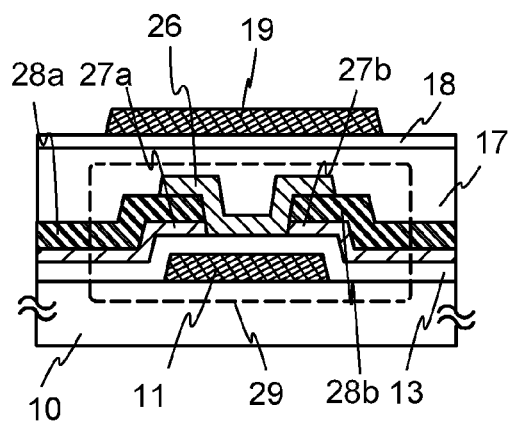

FIG. 32C is partly different from FIG. 32A. In FIG. 32C, the same portions as those of FIG. 32A other than different portions are denoted by the same reference numerals.

FIG. 32C illustrates an example which differs from FIG. 32A in positional relation between source and drain regions 27a and 27b and source and drain electrode layers 28a and 28b. The source and drain regions 27a and 27b are provided below the source and drain electrode layers 28a and 28b. The source and drain electrode layers 28a and 28b have an effect of reducing plasma damage to the source and drain regions 27a and 27b.

In other words, as a blocking layer for reducing plasma damage to the source and drain regions 27a and 27b, three layers (the source and drain electrode layers 28a and 28b, the resin layer 17, and the second gate electrode layer 19) are formed over the source and drain regions 27a and 27b; therefore, plasma damage to the source and drain regions 27a and 27b is further reduced.

As for a thin film transistor 29 illustrated in FIG. 32C, an oxide semiconductor film having low resistance is formed over and in contact with the gate insulating layer 13 and a conductive film is formed thereover. After that, the oxide semiconductor film having low resistivity is etched using the same resist mask as that used for selectively etching the conductive film. Therefore, top surfaces of the source and drain regions 27a and 27b which are formed by etching the oxide semiconductor film having low resistance have approximately the same shape as top surfaces of the source and drain electrode layers 28a and 28b which are formed over the source and drain regions 27a and 27b. The top surfaces and side surfaces of the source and drain electrode layers 28a and 28b are formed in contact with the oxide semiconductor layer 26.

Figure 32D:
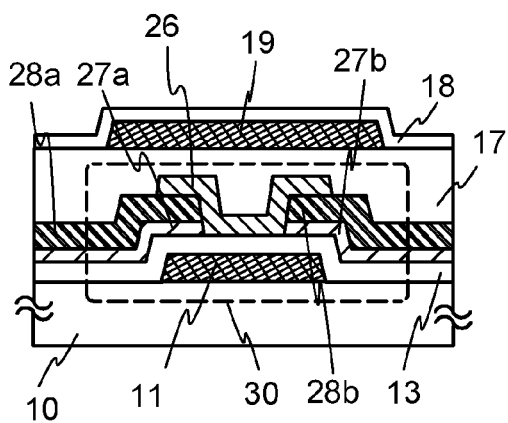

FIG. 32D is partly different from FIG. 32C. In FIG. 32D, the same portions as those of FIG. 32C other than different portions are denoted by the same reference numerals.

FIG. 32D illustrates an example in which the second gate electrode layer 19 and the second protective insulating layer 18 are formed in an order different from FIG. 32C.

As illustrated in FIG. 32D, the second gate electrode layer 19 of a thin film transistor 30 is formed over and in contact with the resin layer 17 that is the first protective insulating film and provided between the resin layer 17 and the second protective insulating layer 18. When the second gate electrode layer 19 is provided between the resin layer 17 and the second protective insulating layer 18, the second gate electrode layer 19 as well as the resin layer 17 has an effect of reducing plasma damage to the oxide semiconductor layer 26.

This embodiment can be implemented in an appropriate combination with any of the structures described in the other embodiments.

Embodiment 10

Figure 33A:
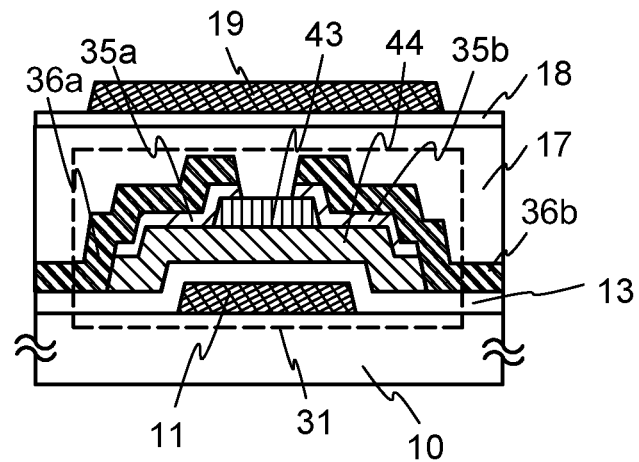
FIGS. 33A and 33B are cross-sectional views each illustrating an embodiment of the present invention.

FIG. 33A is an example of a cross sectional view of a thin film transistor in which an oxide semiconductor layer is sandwiched between two gate electrode provided over and below the oxide semiconductor layer. This embodiment describes an example of a manufacturing method by which thin film transistors used for a pixel portion and a driver circuit are provided over a substrate having an insulating surface.

Note that steps in which a first gate electrode 11 is formed over a substrate having an insulating surface, a gate insulating layer 13 covering the first gate electrode layer 11 is formed, and an oxide semiconductor film is formed are the same as those of Embodiment 8. Therefore, detailed description is omitted and the same portions as those of FIG. 31A are denoted by the same reference numerals.

In this embodiment, an oxide semiconductor film over the gate insulating layer 13 is formed using a Zn—O-based oxide semiconductor target including silicon oxide at 5 wt % to 50 wt % inclusive, preferably 10 wt % to 30 wt % inclusive, so that the Zn—O-based oxide semiconductor film includes silicon oxide ($SiO_x$ (X>0)) which interrupts crystallization.

Then, a channel protective film is formed over the Zn—O-based oxide semiconductor film by a sputtering method without exposure to the air. As a material of the channel protective film, an inorganic material (a silicon oxide film, a silicon nitride film, a silicon oxynitride film, a silicon nitride oxide film, or the like) can be used.

Note that a silicon oxynitride film refers to a film that includes more oxygen than nitrogen in the case where measurements are performed using Rutherford backscattering spectrometry (RBS) and hydrogen forward scattering (HFS). In addition, a silicon nitride oxide film refers to a film that includes more nitrogen than oxygen in the case where measurements are performed using RBS and HFS.

Next, a photolithography step is performed and a resist mask is formed over the channel protective film. Then, unnecessary portions are removed by etching and a channel protective layer 43 is formed. Note that the width of the first gate electrode layer 11 is larger than the width of the channel protective layer 43 (the width in the channel length direction).

As a material of the channel protective layer 43, not only an inorganic insulating material but also an amorphous semiconductor film or a compound thereof obtained by a sputtering method, typically an amorphous silicon film can be used. A compound of an amorphous silicon film used for the channel protective layer refers to a p-type amorphous silicon film formed by a sputtering method, which includes a p-type impurity element such as boron, or an n-type amorphous silicon film formed by a sputtering method, which includes an n-type impurity element such as phosphorus. If a p-type amorphous silicon film is used as the channel protective layer 43, leakage current in an off state can be reduced and carriers (electrons) generated in the oxide semiconductor layer provided in contact with the p-type amorphous silicon film can be cancelled. In the case where an amorphous silicon film is used as the channel protective layer 43, the amorphous silicon film has a blocking function against moisture, hydrogen ions, OH⁻, or the like. In addition, the amorphous silicon film functions as a light-blocking layer for blocking incidence of light to the oxide semiconductor.

In this embodiment, an amorphous silicon film including boron obtained by a sputtering method using a target including boron is used as the channel protective layer 43. The amorphous silicon film including boron is formed in a low power condition or at a substrate temperature of lower than 200° C. Since the channel protective layer 43 is formed in contact with the Zn—O-based non-single-crystal film, damage to the Zn—O-based non-single-crystal film at the time of forming and etching the channel protective layer 43 is preferably reduced as much as possible.

Next, an oxide semiconductor film (an In—Ga—Zn—O—N-based non-single-crystal film in this embodiment) having lower resistance than the Zn—O-based non-single-crystal film is formed over the Zn—O-based non-single-crystal film and the protective layer 43 by a sputtering method. In this embodiment, sputtering is performed in an atmosphere including a nitrogen gas, with use of an oxide semiconductor target including In (indium), Ga (gallium), and Zn (zinc) ($In_2O_3$:$Ga_2O_3$:ZnO=1:1:1), so that an oxynitride film including indium, to gallium, and zinc is formed. The oxynitride film becomes the oxide semiconductor film having low resistance by heat treatment performed later.

Next, a photolithography step is performed and a resist mask is formed over the In—Ga—Zn—O—N-based non-single-crystal film. Then, the Zn—O-based non-single-crystal film and the In—Ga—Zn—O—N-based non-single-crystal film are etched. After the etching, a side surface of an oxide semiconductor layer 44 formed from the Zn—O-based non-single-crystal film is exposed. Note that etching here is not limited to wet etching and dry etching may also be performed.

Then, after the resist mask is removed, a conductive film formed from a metal material is formed over the In—Ga—Zn—O—N-based non-single-crystal film by a sputtering method or a vacuum evaporation method. As a material for the conductive film, an element selected from Al, Cr, Ta, Ti, Mo, and W; an alloy including any of the elements as a component; an alloy film including a combination of any of the elements; and the like can be given. Further, for heat treatment at 200° C. to 600° C., the conductive film preferably has heat resistance for such heat treatment.

A photolithography step is performed and a resist mask is formed over the conductive film. Unnecessary portions are removed by etching, and source and drain electrode layers 36a and 36b are formed. In this etching, the channel protective layer 43 functions as an etching stopper of the oxide semiconductor layer 44. Therefore, the oxide semiconductor layer 44 is not etched. In addition, in this etching, the In—Ga—Zn—O—N-based non-single-crystal film is selectively etched using the same mask and source and drain regions 35a and 35b are formed.

Because of the structure in which the channel protective layer 43 is provided over a channel formation region of the oxide semiconductor layer 44, damage to the channel formation region of the oxide semiconductor layer 44 (for example, reduction in thickness due to plasma or an etchant in etching, or oxidation) in the manufacturing process can be prevented. Therefore, reliability of a thin film transistor 31 can be improved.

Then, after the resist mask is removed, heat treatment at 200° C. to 600° C., typically 300° C. to 500° C., is preferably performed. In this embodiment, heat treatment is performed in a furnace at 350° C. for 1 hour in a nitrogen atmosphere or a nitrogen atmosphere including oxygen.

Next, a resin layer 17 is formed to a thickness of 0.5 μm to 3 μm, which covers the source and drain electrode layers 36a and 36b and the channel protective layer 43. As a photosensitive or non photosensitive organic material used for the resin layer 17, polyimide, acrylic, polyamide, polyimideamide, resist, benzocyclobutene, or a stack of any of these materials is used.

Note that steps after formation of the resin layer 17 are the same as those of Embodiment 8 and therefore, are briefly described here.

Then, a second protective insulating layer 18 is formed to a thickness of 50 nm to 400 nm by a PCVD method or a sputtering method under a low power condition (or at a low substrate temperature of lower than 200° C., preferably a room temperature to 100° C.). Alternatively, the second protective insulating layer 18 may be formed under a low power condition using a high-density plasma apparatus.

After a conductive layer is formed, a photolithography step is performed and a resist mask is formed over the conductive layer. Then, unnecessary portions are removed by etching and wirings and electrodes (wirings including a second gate electrode layer 19 and the like) are formed.

Through the above process, the thin film transistor 31 illustrated in FIG. 33A can be obtained. Note that in the thin film transistor 31, a stack of the channel protective layer 43, the resin layer 17, and the second protective insulating layer 18 functions as the second gate insulating layer.

By making the width of the first gate electrode layer 11 larger than that of the second gate electrode layer 19, a gate voltage can be applied from the second gate electrode layer 19 to the whole oxide semiconductor layer 44. In addition, in the case where parasitic capacitance does not cause a problem, the second gate electrode layer may cover a plurality of thin film transistors in the driver circuit and the area of the second gate electrode layer may be approximately the same as or larger than that of the driver circuit.

In the case where the parasitic capacitance causes a problem, in the structure of FIG. 33A, it is preferable that the width of the first gate electrode layer 11 is set to be smaller than that of the second gate electrode layer 19 so that an area of the first gate electrode layer 11 which overlaps with the source and drain electrode layers is reduced, whereby the parasitic capacitance is reduced. Further, the width of the first gate electrode layer 11 may be set to be larger than the width of the channel protective layer 43 and the width of the second gate electrode layer 19 may be set to be smaller than the width of the channel protective layer 43 so that the second gate electrode layer 19 does not overlap with the source drain electrode layers, whereby more parasitic capacitance may be reduced.

Figure 33B:
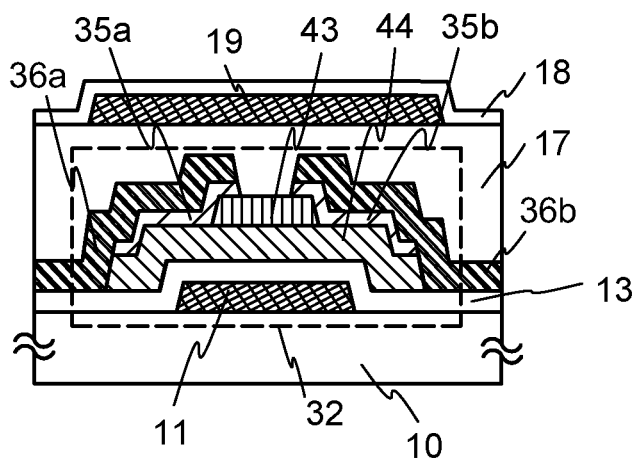

FIG. 33B is partly different from FIG. 33A. In FIG. 33B, the same portions as those of FIG. 33A other than different portions are denoted by the same reference numerals.

FIG. 33B illustrates an example in which the second gate electrode layer 19 and the second protective insulating layer 18 are formed in an order different from FIG. 33A.

As illustrated in FIG. 33B, the second gate electrode layer 19 of a thin film transistor 32 is formed over and in contact with the resin layer 17 that is the first protective insulating film and provided between the resin layer 17 and the second protective insulating layer 18. In the case where the second gate electrode layer 19 is provided between the resin layer 17 and the second protective insulating layer 18, the second gate electrode layer 19 as well as the resin layer 17 has an effect of reducing plasma damage to the oxide semiconductor layer 44.

This embodiment can be implemented in an appropriate combination with any of the structures described in the other embodiments.

Embodiment 11

Figure 34A:
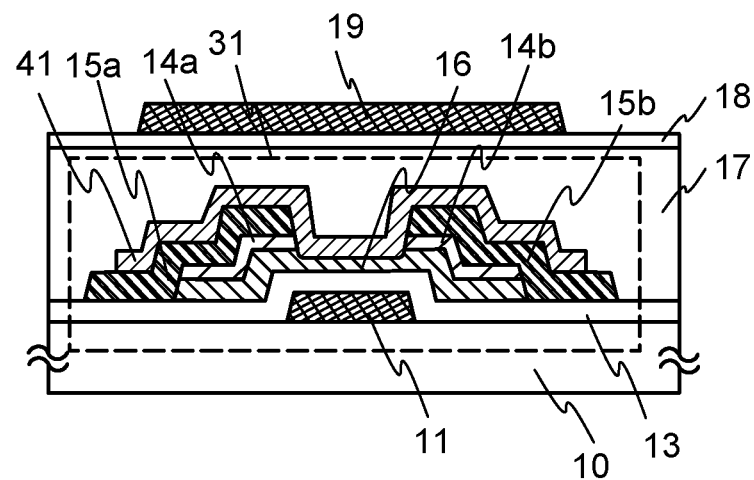
FIGS. 34A and 34B are cross-sectional views each illustrating an embodiment of the present invention.

FIG. 34A is an example of a cross-sectional view of a thin film transistor in which an oxide semiconductor layer is sandwiched between two gate electrode layers provided over and below the oxide semiconductor layer. This embodiment describes an example of a thin film transistor used for a pixel portion and a driver circuit which are provided over a substrate having an insulating surface.

Note that this embodiment is the same as Embodiment 8 except that an amorphous silicon film is provided in contact with an oxide semiconductor layer 16. Therefore, detailed description is omitted here and the same portions as those of FIG. 31A are denoted by the same reference numerals. Steps are the same as those of Embodiment 8 before forming a region with a small thickness in the oxide semiconductor layer 16 by partly etching the oxide semiconductor layer 16 using source and drain electrode layers 15a and 15b as a mask.

According to Embodiment 8, the oxide semiconductor layer 16 including a region with a smaller thickness than a region overlapping with the source and drain electrode layers 15a and 15b is formed.

Then, after removing the resist mask, an amorphous semiconductor film or a compound thereof obtained by a sputtering method, typically an amorphous silicon film is formed. Note that a compound of an amorphous silicon film refers to a p-type amorphous silicon film formed by a sputtering method which includes a p-type impurity element such as boron, or an n-type amorphous silicon film formed by a sputtering method which includes an n-type impurity element such as phosphorus.

In order to reduce damage to the oxide semiconductor layer 16 as much as possible, the film is formed under a low power condition or a condition where a substrate temperature is lower than 200° C. In this embodiment, the amorphous silicon film is formed with a substrate temperature set at room temperature and electric power set at 1 kw.

In addition, before formation of the amorphous silicon film, the exposed region having a small thickness of the oxide semiconductor layer 16 may be subjected to oxygen radical treatment. By the oxygen radical treatment, an exposed surface and its vicinity of the oxide semiconductor layer can be modified into an oxygen-excess region. If the amorphous silicon film is formed on the oxygen-excess region formed by the oxygen radical treatment, a thin film of $SiO_x$ (X>0) is formed at an interface, which can reduce off current.

Oxygen radicals may be produced in a plasma generation apparatus with the use of a gas including oxygen, or in an ozone generation apparatus. By exposing a thin film to the produced oxygen radicals or oxygen, the surface of the film can be modified. The radical treatment is not limited to one using oxygen radicals, and may be performed using argon and oxygen radicals. The treatment using argon and oxygen radicals is treatment in which an argon gas and an oxygen gas are introduced to generate plasma, thereby modifying a surface of a thin film.

Next, a photolithography step is performed to form a resist mask over the amorphous silicon film. Then, unnecessary portions are removed by etching and a channel protective layer 41 is formed. Note that an example in which the amorphous silicon film is selectively etched is described in this embodiment without particular limitations. A photolithography step here may be omitted in order to reduce the number of photomasks and steps. The channel protective layer 41 can be used as an interlayer film which blocks moisture, hydrogen ions, OH−, or the like. In addition, the channel protective layer 41 formed of the amorphous silicon film functions as a light-blocking layer for blocking incidence of light to the oxide semiconductor layer.

Then, the resin layer 17 is formed with a thickness in the range of 0.5 μm to 3 μm to cover the source and drain electrode layers 15a and 15b and the channel protective layer 41. As a photosensitive or non photosensitive organic material for the resin layer 17, polyimide, acrylic, polyamide, polyimideamide, resist, benzocyclobutene, or a stack of any of these materials is used.

Note that steps after formation of the resin layer 17 are the same as those of Embodiment 8 and therefore, are briefly described here.

A second protective insulating layer 18 is formed to a thickness of 50 nm to 400 nm by a PCVD method or a sputtering method under a low power condition (or at a low substrate temperature of lower than 200° C., preferably a room temperature to 100° C.). Alternatively, the second protective insulating layer 18 may be formed under a low power condition using a high-density plasma apparatus.

After a conductive layer is formed, a photolithography step is performed to form a resist mask over the conductive layer and unnecessary portions are removed by etching so that wirings and electrodes (wirings including a second gate electrode layer 19 and the like) are formed.

Through the above process, a thin film transistor 31 illustrated in FIG. 34A can be obtained.

In addition, the channel protective layer 41 formed of the amorphous silicon film also functions as a light-blocking layer for blocking incidence of light to the oxide semiconductor layer. In this embodiment, an example is shown in which an amorphous silicon film is used as the channel protective layer 41. If a p-type amorphous silicon film is used as the channel protective layer 41, leakage current in an off state can be reduced and carriers (electrons) generated in the oxide semiconductor layer provided in contact with the p-type amorphous silicon film can be cancelled.

Figure 34B:
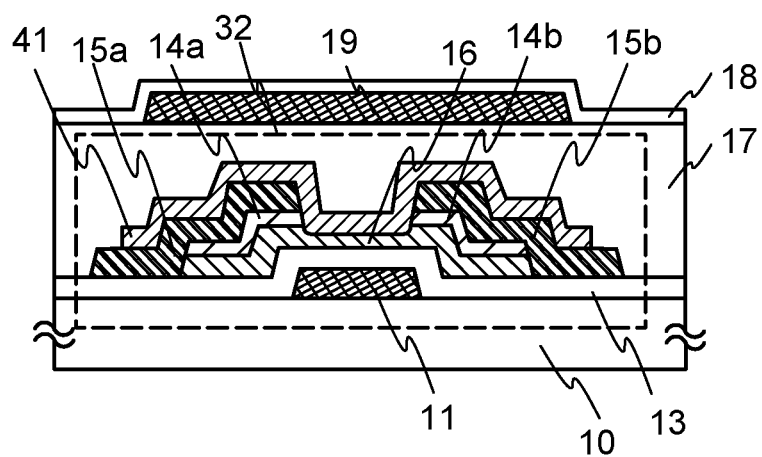

FIG. 34B is partly different from FIG. 34A. In FIG. 34B, the same portions as those of FIG. 34A other than different portions are denoted by the same reference numerals.

FIG. 34B illustrates an example in which the second gate electrode layer 19 and the second protective insulating layer 18 are formed in an order different from FIG. 34A.

As illustrated in FIG. 34B, the second gate electrode layer 19 of a thin film transistor 32 is formed over and in contact with the resin layer 17 that is a first protective insulating film and provided between the resin layer 17 and the second protective insulating layer 18. In the case where the second gate electrode layer 19 is provided between the resin layer 17 and the second protective insulating layer 18, the second gate electrode layer 19 as well as the channel protective layer 41 and the resin layer 17 has an effect of reducing plasma damage to the oxide semiconductor layer 16.

This embodiment can be implemented in an appropriate combination with any of the structures described in the other embodiments.

Embodiment 12

Figure 35A:
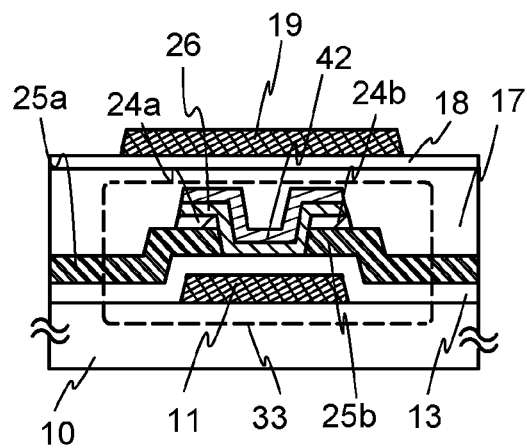
FIGS. 35A to 35D are cross-sectional views each illustrating an embodiment of the present invention.

FIG. 35A is an example of a cross-sectional view of a thin film transistor in which an oxide semiconductor layer is sandwiched between two gate electrode layers provided over and below the oxide semiconductor layer. This embodiment describes an example of a thin film transistor used for a pixel portion and a driver circuit which are provided over a substrate having an insulating surface.

Note that this embodiment is the same as Embodiment 9 except that an amorphous silicon film is provided in contact with an oxide semiconductor layer 26. Therefore, detailed description is omitted here and the same portions as those of FIG. 32A are denoted by the same reference numerals. Steps are the same as those of Embodiment 9 up to formation of the oxide semiconductor layer which is partly in contact with a gate insulating layer 13.

After forming the oxide semiconductor film according to Embodiment 9, an amorphous semiconductor film or a compound thereof obtained by a sputtering method, typically an amorphous silicon film is formed without exposure to the air. Note that a compound of an amorphous silicon film refers to a p-type amorphous silicon film formed by a sputtering method which includes a p-type impurity element such as boron, or an n-type amorphous silicon film formed by a sputtering method which includes an n-type impurity element such as phosphorus.

In order to reduce damage to the oxide semiconductor layer 26 as much as possible, the film is formed under a low power condition or a condition where a substrate temperature is lower than 200° C. In this embodiment, the amorphous silicon film including boron is formed with a substrate temperature set at room temperature and electric power set at 1 kw.

In addition, before formation of the amorphous silicon film including boron, an exposed region of the oxide semiconductor film may be subjected to oxygen radical treatment. By the oxygen radical treatment, a surface and its vicinity of the oxide semiconductor film can be modified into an oxygen-excess region. If the amorphous silicon film is formed on the oxygen-excess region formed by the oxygen radical treatment, a thin film of $SiO_x$ (X>0) is formed at an interface, which can reduce off current.

Oxygen radicals may be produced in a plasma generation apparatus with the use of a gas including oxygen, or in an ozone generation apparatus. By exposing a thin film to the produced oxygen radicals or oxygen, the surface of the film can be modified. The radical treatment is not limited to one using oxygen radicals, and may be performed using argon and oxygen radicals. The treatment using argon and oxygen radicals is treatment in which an argon gas and an oxygen gas are introduced to generate plasma, thereby modifying a surface of a thin film.

Next, a photolithography step is performed to form a resist mask over the amorphous silicon film including boron. Then, unnecessary portions are removed by etching and a channel protective layer 42 is formed. The channel protective layer 42 can be used as an interlayer film which blocks moisture, hydrogen ions, OH$^-$, or the like. In addition, the channel protective layer 42 formed from the amorphous silicon film functions as a light-blocking layer for blocking incidence of light to the oxide semiconductor layer. In addition, unnecessary portions of the oxide semiconductor film are removed using the same resist mask and the oxide semiconductor layer 26 is formed. Further, the buffer layer is selectively etched using the same mask and source and drain regions 24a and 24b are formed.

After the resist mask is removed, heat treatment at 200° C. to 600° C., typically 300° C. to 500° C., is preferably performed. In this embodiment, heat treatment is performed in a furnace at 350° C. for 1 hour in a nitrogen atmosphere including oxygen.

Then, a resin layer 17 is formed with a thickness in the range of 0.5 μm to 3 μm to cover source and drain electrode layers 25a and 25b and the oxide semiconductor layer 26. As a photosensitive or non photosensitive organic material for the resin layer 17, polyimide, acrylic, polyamide, polyimide-amide, resist, benzocyclobutene, or a stack of any of these materials is used.

Note that steps after formation of the resin layer 17 are the same as those of Embodiment 9 and therefore, are briefly described here.

A second protective insulating layer 18 is formed to a thickness of 50 nm to 400 nm by a PCVD method or a sputtering method under a low power condition (or at a low substrate temperature of 200° C., preferably a room temperature to 100° C.). Alternatively, the second protective insulating layer 18 may be formed under a low power condition using a high-density plasma apparatus.

After a conductive layer is formed, a photolithography step is performed to form a resist mask over the conductive layer and unnecessary portions are removed by etching so that wirings and electrodes (wirings including a second gate electrode layer 19 and the like) are formed.

Through the above process, a thin film transistor 33 illustrated in FIG. 35A can be obtained.

Figure 35B:
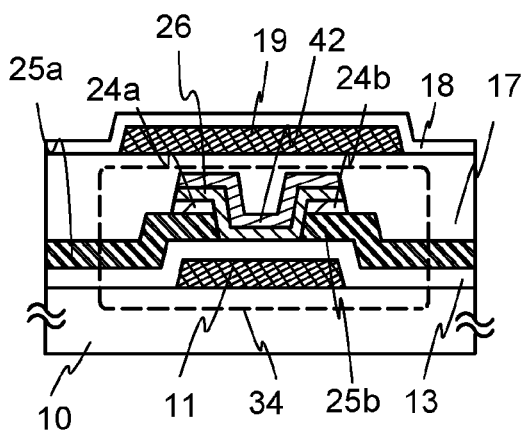

FIG. 35B is partly different from FIG. 35A. In FIG. 35B, the same portions as those of FIG. 35A other than different portions are denoted by the same reference numerals.

FIG. 35B illustrates an example in which the second gate electrode layer 19 and the second protective insulating layer 18 are formed in an order different from FIG. 35A.

As illustrated in FIG. 35B, the second gate electrode layer 19 of a thin film transistor 34 is formed over and in contact with the resin layer 17 that is a first protective insulating film and provided between the resin layer 17 and the second protective insulating layer 18. In the case where the second gate electrode layer 19 is provided between the resin layer 17 and the second protective insulating layer 18, the second gate electrode layer 19 as well as the channel protective layer 42 and the resin layer 17 has an effect of reducing plasma damage to the oxide semiconductor layer 26.

Figure 35C:
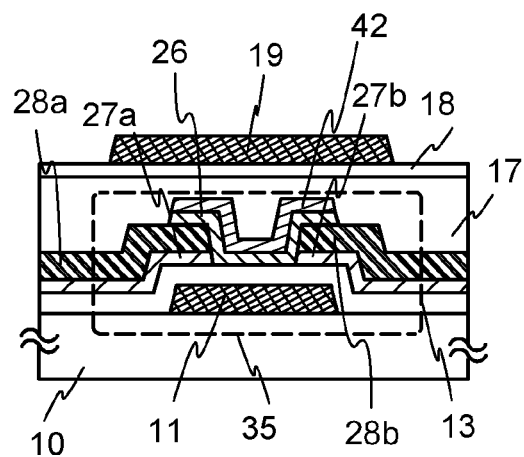

FIG. 35C is partly different from FIG. 35A. In FIG. 35C, the same portions as those of FIG. 35A other than different portions are denoted by the same reference numerals.

FIG. 35C illustrates an example which differs from FIG. 35A in positional relation between source and drain regions 27a and 27b and source and drain electrode layers 28a and 28b. The source and drain regions 27a and 27b are provided below the source and drain layers 28a and 28b. The source and drain layers 28a and 28b have an effect of reducing plasma damage to the source and drain regions 27a and 27b.

In other words, as a blocking layer for reducing plasma damage to the source and drain regions 27a and 27b, four layers (the source and drain electrode layers 28a and 28b, the channel protective layer 42, the resin layer 17, and the second gate electrode layer 19) are formed over the source and drain regions 27a and 27b; therefore, plasma damage to the source and drain regions 27a and 27b is further reduced.

As for a thin film transistor 35 illustrated in FIG. 35C, an oxide semiconductor film having low resistance is formed over and in contact with the gate insulating layer 13 and a conductive film is formed thereover. After that, the oxide semiconductor film having low resistance is etched using the same resist mask as that used for selectively etching the conductive film. Therefore, top surfaces of the source and drain regions 27a and 27b which are formed by etching the oxide semiconductor film having low resistance have approximately the same shape as top surfaces of the source and drain electrode layers 28a and 28b which are formed over the source and drain regions 27a and 27b. The top surfaces and side surfaces of the source and drain electrode layers 28a and 28b are formed in contact with the oxide semiconductor layer 26.

Figure 35D:
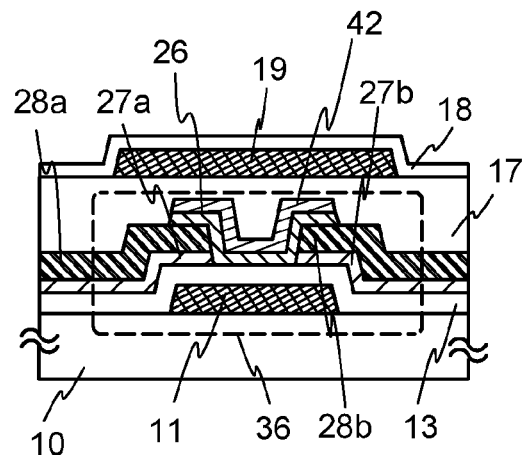

FIG. 35D is partly different from FIG. 35C. In FIG. 35D, the same portions as those of FIG. 35C other than different portions are denoted by the same reference numerals.

FIG. 35D illustrates an example in which the second gate electrode layer 19 and the second protective insulating layer 18 are formed in an order different from FIG. 35C.

As illustrated in FIG. 35D, the second gate electrode layer 19 of a thin film transistor 36 is formed over and in contact with the resin layer 17 that is the first protective insulating film and provided between the resin layer 17 and the second protective insulating layer 18. In the case where the second gate electrode layer 19 is provided between the resin layer 17 and the second protective insulating layer 18, the second gate electrode layer 19 as well as the channel protective layer 42 and the resin layer 17 has an effect of reducing plasma damage to the oxide semiconductor layer 26.

This embodiment can be implemented in an appropriate combination with any of the structures described in the other embodiments.

Embodiment 13

Figure 36A:
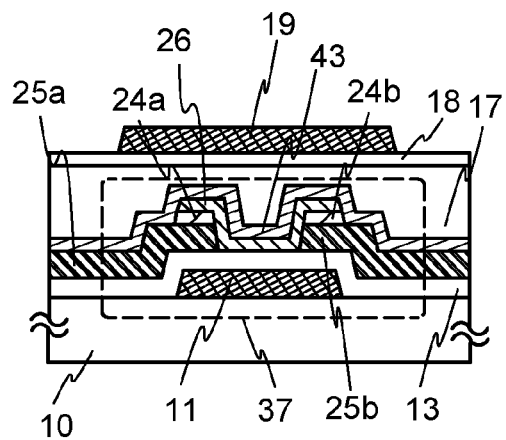
FIGS. 36A to 36D are cross-sectional views each illustrating an embodiment of the present invention.

FIG. 36A is an example of a cross-sectional view of a thin film transistor in which an oxide semiconductor layer is sandwiched between two gate electrode layers provided over and below the oxide semiconductor layer. This embodiment describes an example of a thin film transistor used for a pixel portion and a driver circuit which are provided over a substrate having an insulating surface.

Note that this embodiment is the same as Embodiment 9 except that an amorphous silicon film is provided in contact with an oxide semiconductor layer 26. Therefore, detailed description is omitted here and the same portions as those of FIG. 32A are denoted by the same reference numerals. Steps are the same as those of Embodiment 9 up to formation of the oxide semiconductor layer 26.

Then, after forming the oxide semiconductor layer 26 according to Embodiment 9, an amorphous semiconductor film or a compound thereof obtained by a sputtering method, typically an amorphous silicon film is formed without exposure to the air as a channel protective layer 43 over and in contact with the oxide semiconductor layer 26. Note that a compound of an amorphous silicon film refers to a p-type amorphous silicon film formed by a sputtering method which includes a p-type impurity element such as boron, or an n-type amorphous silicon film formed by a sputtering method which includes an n-type impurity element such as phosphorus.

In order to reduce damage to the oxide semiconductor layer 26 as much as possible, the film is formed under a low power condition or a condition where a substrate temperature is lower than 200° C. In this embodiment, the amorphous silicon film including boron is formed with a substrate temperature set at room temperature and electric power set at 1 kw.

In addition, before formation of the amorphous silicon film including boron, the exposed region of the oxide semiconductor layer may be subjected to oxygen radical treatment. By the oxygen radical treatment, a surface and its vicinity of the oxide semiconductor layer can be modified into an oxygen-excess region. If the amorphous silicon film is formed on the oxygen-excess region formed by the oxygen radical treatment, a thin film of $SiO_x$ (X>0) is formed at an interface, which can reduce off current.

Oxygen radicals may be produced in a plasma generation apparatus with the use of a gas including oxygen, or in an ozone generation apparatus. By exposing a thin film to the produced oxygen radicals or oxygen, the surface of the film can be modified. The radical treatment is not limited to one using oxygen radicals, and may be performed using argon and oxygen radicals. The treatment using argon and oxygen radicals is treatment in which an argon gas and an oxygen gas are introduced to generate plasma, thereby modifying a surface of a thin film.

The channel protective layer 43 can be used as an interlayer film which blocks moisture, hydrogen ions, $OH^-$, or the like. In addition, the channel protective layer 43 formed of the amorphous silicon film functions as a light-blocking layer for blocking incidence of light to the oxide semiconductor layer.

Then, heat treatment at 200° C. to 600° C., typically 300° C. to 500° C., is preferably performed. In this embodiment, heat treatment is performed in a furnace at 350° C. for 1 hour in a nitrogen atmosphere including oxygen.

Then, the resin layer 17 is formed to a thickness of in a range of 0.5 μm to 3 μM to cover the channel protective layer 43. As a photosensitive or non photosensitive organic material for the resin layer 17, polyimide, acrylic, polyamide, polyimideamide, resist, benzocyclobutene, or a stack of any of these materials is used.

Note that steps after formation of the resin layer 17 are the same as those of Embodiment 9 and therefore, are briefly described here.

The second protective insulating layer 18 is formed to a thickness of 50 nm to 400 nm by a PCVD method or a sputtering method under a low power condition (or at a low substrate temperature of lower than 200° C., preferably a room temperature to 100° C.). Alternatively, the second protective insulating layer 18 may be formed under a low power condition using a high-density plasma apparatus.

After a conductive layer is formed, a photolithography step is performed to form a resist mask over the conductive layer and unnecessary portions are removed by etching so that wirings and electrodes (wirings including a second gate electrode layer 19 and the like) are formed.

Through the above process, a thin film transistor 37 illustrated in FIG. 36A can be obtained.

Figure 36B:
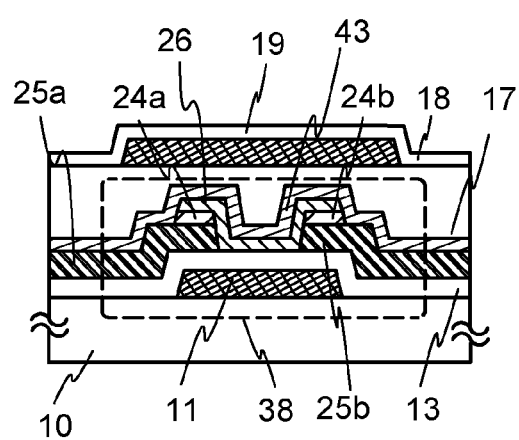

FIG. 36B is partly different from FIG. 36A. In FIG. 36B, the same portions as those of FIG. 36A other than different portions are denoted by the same reference numerals.

FIG. 36B illustrates an example in which the second gate electrode layer 19 and the second protective insulating layer 18 are formed in an order different from FIG. 36A.

As illustrated in FIG. 36B, the second gate electrode layer 19 of a thin film transistor 38 is formed over and in contact with the resin layer 17 that is the first protective insulating film and provided between the resin layer 17 and the second protective insulating layer 18. In the case where the second gate electrode layer 19 is provided between the resin layer 17 and the second protective insulating layer 18, the second gate electrode layer 19 as well as the channel protective layer 43 and the resin layer 17 has an effect of reducing plasma damage to the oxide semiconductor layer 26.

Figure 36C:
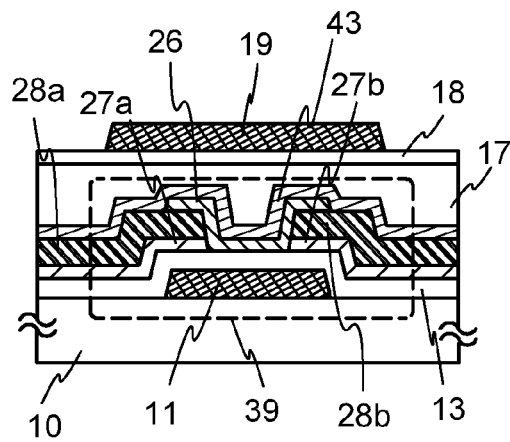

FIG. 36C is partly different from FIG. 36A. In FIG. 36C, the same portions as those of FIG. 36A other than different portions are denoted by the same reference numerals.

FIG. 36C illustrates an example which differs from FIG. 36A in positional relation between source and drain regions and source and drain electrode layers. The source and drain regions 27a and 27b are provided below the source and drain layers 28a and 28b. The source and drain layers 28a and 28b have an effect of reducing plasma damage to the source and drain regions 27a and 27b.

In other words, as a blocking layer for reducing plasma damage to the source and drain regions 27a and 27b, four layers (the source and drain electrode layers 28a and 28b, the channel protective layer 43, the resin layer 17, and the second gate electrode layer 19) are formed over the source and drain regions 27a and 27b; therefore, plasma damage to the source and drain regions 27a and 27b is further reduced.

As for a thin film transistor 39 illustrated in FIG. 36C, an oxide semiconductor film having low resistance is formed over and in contact with the gate insulating layer 13 and a conductive film is formed thereover. After that, the oxide semiconductor film having low resistance is etched using the same resist mask as that used for selectively etching the conductive film. Therefore, top surfaces of the source and drain regions 27a and 27b which are formed by etching the oxide semiconductor film having low resistance have approximately the same shape as top surfaces of the source and drain electrode layers 28*a* and 28*b* which are formed over the source and drain regions 27*a* and 27*b*. The top surfaces and side surfaces of the source and drain electrode layers 28*a* and 28*b* are formed in contact with the oxide semiconductor layer 26.

Figure 36D:
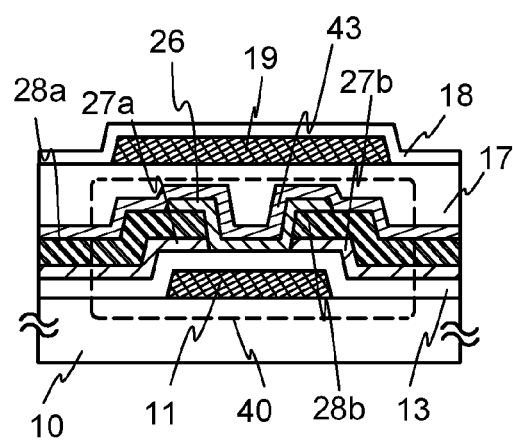

FIG. 36D is partly different from FIG. 36C. In FIG. 36D, the same portions as those of FIG. 36C other than different portions are denoted by the same reference numerals.

FIG. 36D illustrates an example in which the second gate electrode layer 19 and the second protective insulating layer 18 are formed in an order different from FIG. 36C.

As illustrated in FIG. 36D, the second gate electrode layer 19 of a thin film transistor 40 is formed over and in contact with the resin layer 17 that is the first protective insulating film and provided between the resin layer 17 and the second protective insulating layer 18. In the case where the second gate electrode layer 19 is provided between the resin layer 17 and the second protective insulating layer 18, the second gate electrode layer 19 as well as the channel protective layer 43 and the resin layer 17 has an effect of reducing plasma damage to the oxide semiconductor layer 26.

This embodiment can be implemented in an appropriate combination any of with the structures described in the other embodiments.

Embodiment 14

An example of a display device which is one example of a semiconductor device will be described below. In the display device, at least part of a driver circuit and a thin film transistor to be arranged in a pixel portion are formed over one substrate.

The thin film transistor arranged in the pixel portion is formed according to Embodiment 2, a channel formation region is formed using an oxide semiconductor layer including $SiO_x$, and source and drain regions are formed using an oxide semiconductor to which nitrogen is added. The thin film transistor is an n-channel TFT; therefore, part of a driver circuit which can be formed using n-channel TFTs is formed over the same substrate as the thin film transistor in the pixel portion.

Figure 17A:
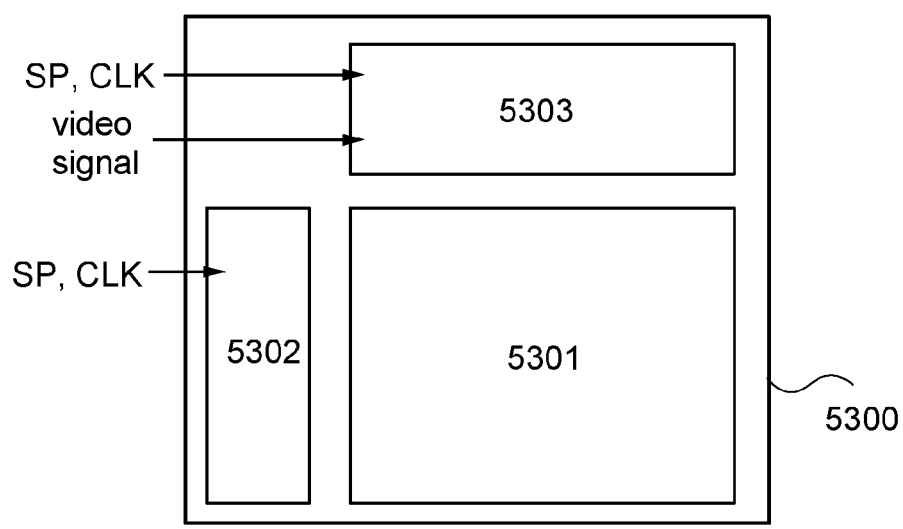
FIGS. 17A and 17B are each a block diagram showing a semiconductor device of an embodiment of the present invention.

FIG. 17A illustrates an example of a block diagram of an active matrix liquid crystal display device which is an example of a semiconductor device. The display device illustrated in FIG. 17A includes, over a substrate 5300, a pixel portion 5301 including a plurality of pixels that are each provided with a display element; a scan line driver circuit 5302 that selects a pixel; and a signal line driver circuit 5303 that controls a video signal input to the selected pixel.

In addition, the thin film transistor described in Embodiment 2 is an n-channel TFT, and a signal line driver circuit including the n-channel TFT is described with reference to FIG. 18.

Figure 18:
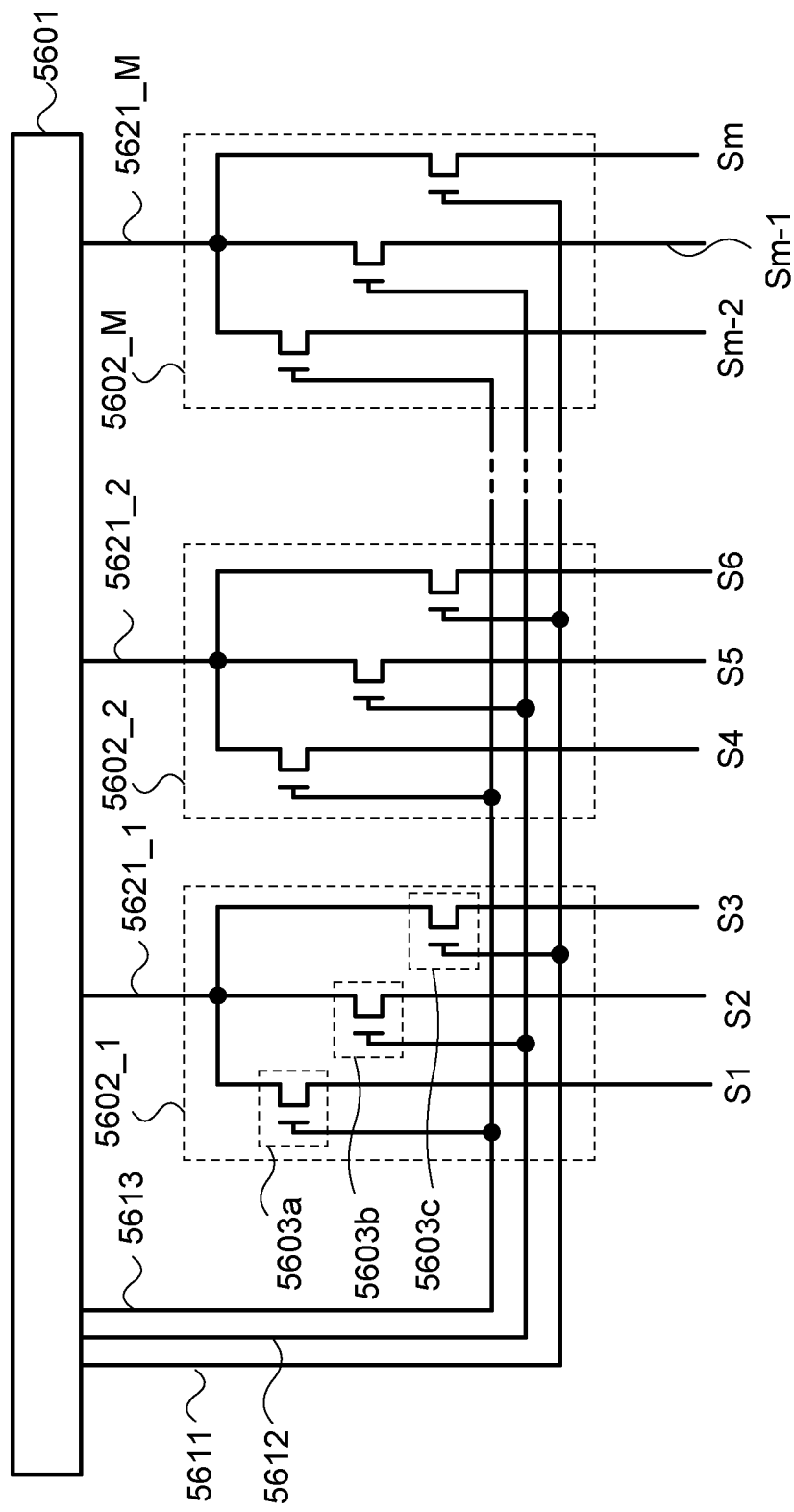
FIG. 18 is a diagram of a structure of a signal line driver circuit illustrating an embodiment of the present invention.

The signal line driver circuit in FIG. 18 includes a driver IC 5601, switch groups 5602_1 to 5602_M, a first wiring 5611, a second wiring 5612, a third wiring 5613, and wirings 5621_1 to 5621_M. Each of the switch groups 5602_1 to 5602_M includes a first thin film transistor 5603*a*, a second thin film transistor 5603*b*, and a third thin film transistor 5603*c*.

The driver IC 5601 is connected to the first wiring 5611, the second wiring 5612, the third wiring 5613, and the wirings 5621_1 to 5621_M. Each of the switch groups 5602_1 to 5602_M is connected to the first wiring 5611, the second wiring 5612, and the third wiring 5613, and the wirings 5621_1 to 5621_M are connected to the switch groups 5602_1 to 5602_M, respectively. Each of the wirings 5621_1 to 5621_M is connected to three signal lines via the first thin film transistor 5603*a*, the second thin film transistor 5603*b*, and the third thin film transistor 5603*c*. For example, the wiring 5621_J of the J-th column (one of the wirings 5621_1 to 5621_M) is connected to a signal line Sj−1, a signal line Sj, and a signal line Sj+1 via the first thin film transistor 5603*a*, the second thin film transistor 5603*b*, and the third thin film transistor 5603*c* which are included in the switch group 5602_J.

A signal is input to each of the first wiring 5611, the second wiring 5612, and the third wiring 5613.

Note that the driver IC 5601 is preferably formed over a single crystalline substrate. Further, the switch groups 5602_1 to 5602_M are preferably formed over the same substrate as the pixel portion is. Therefore, the driver IC 5601 and the switch groups 5602_1 to 5602_M are preferably connected through an FPC or the like.

Figure 19:
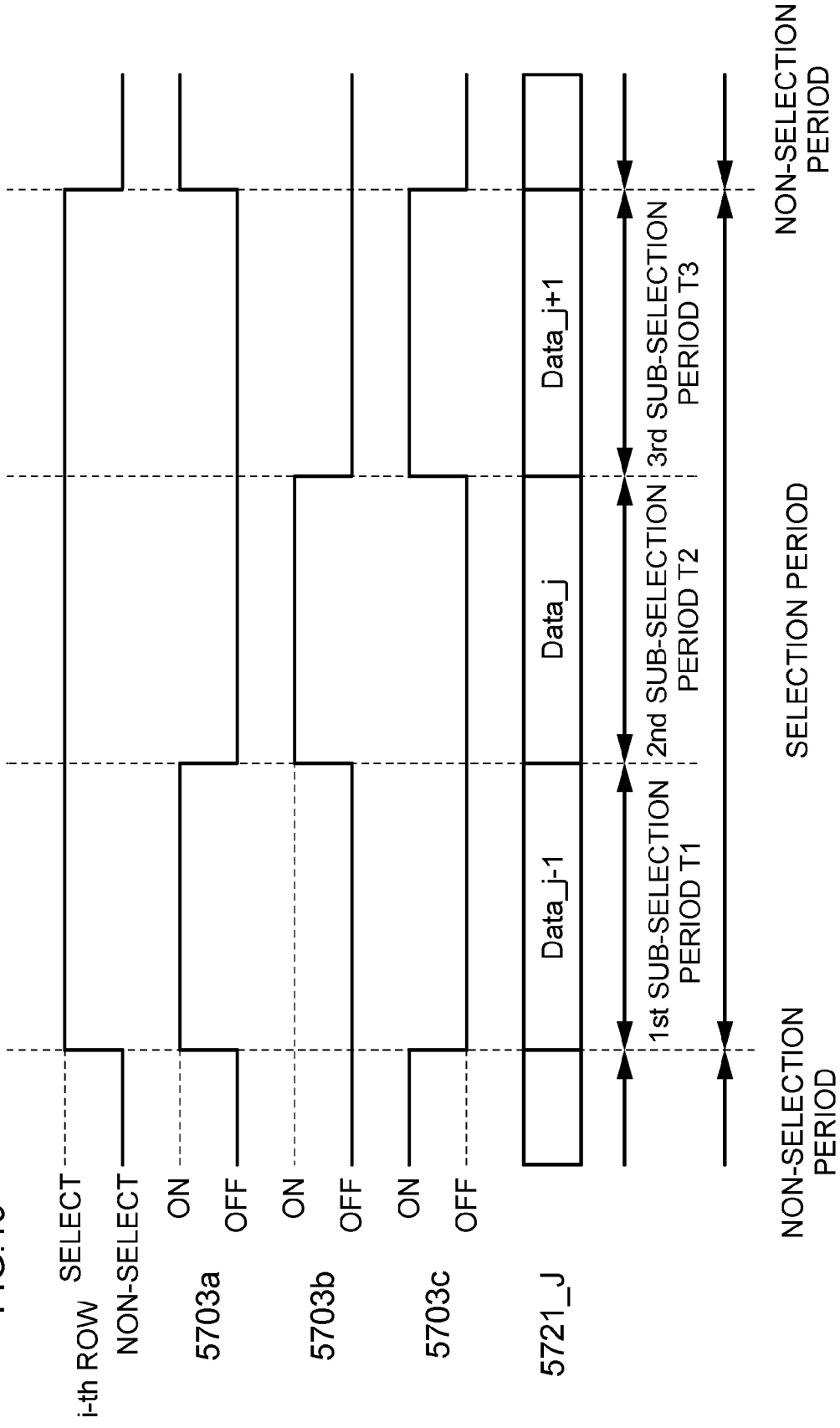
FIG. 19 is a timing chart of an operation of a signal line driver circuit illustrating an embodiment of the present invention.

Next, operation of the signal line driver circuit shown in FIG. 18 is described with reference to a timing chart in FIG. 19. The timing chart in FIG. 19 illustrates a case where the scan line Gi of the i-th row is selected. A selection period of the scan line Gi of the i-th row is divided into a first sub-selection period T1, a second sub-selection period T2, and a third sub-selection period T3. In addition, the signal line driver circuit in FIG. 18 operates similarly to that in FIG. 19 even when a scan line of another row is selected.

Note that the timing chart in FIG. 19 shows a case where the wiring 5621_J of the J-th column is connected to the signal line Sj−1, the signal line Sj, and the signal line Sj+1 via the first thin film transistor 5603*a*, the second thin film transistor 5603*b*, and the third thin film transistor 5603*c*.

The timing chart in FIG. 19 shows timing at which the scan line Gi of the i-th row is selected, timing 5703*a* of on/off of the first thin film transistor 5603*a*, timing 5703*b* of on/off of the second thin film transistor 5603*b*, timing 5703*c* of on/off of the third thin film transistor 5603*c*, and a signal 5721_J input to the wiring 5621_J of the J-th column.

In the first sub-selection period T1, the second sub-selection period T2, and the third sub-selection period T3, different video signals are input to the wirings 5621_1 to 5621_M. For example, a video signal input to the wiring 5621_J in the first sub-selection period T1 is input to the signal line Sj−1, a video signal input to the wiring 5621_J in the second sub-selection period T2 is input to the signal line Sj, and a video signal input to the wiring 5621_J in the third sub-selection period T3 is input to the signal line Sj+1. In addition, the video signals input to the wiring 5621_J in the first sub-selection period T1, the second sub-selection period T2, and the third sub-selection period T3 are denoted by Data_j−1, Data_j, and Data_j+1.

As illustrated in FIG. 19, in the first sub-selection period T1, the first thin film transistor 5603*a* is turned on, and the second thin film transistor 5603*b* and the third thin film transistor 5603*c* are turned off. At this time, Data_j−1 input to the wiring 5621_J is input to the signal line Sj−1 via the first thin film transistor 5603*a*. In the second sub-selection period T2, the second thin film transistor 5603*b* is turned on, and the first thin film transistor 5603*a* and the third thin film transistor 5603*c* are turned off. At this time, Data_j input to the wiring 5621_J is input to the signal line Sj via the second thin film transistor 5603*b*. In the third sub-selection period T3, the third thin film transistor 5603*c* is turned on, and the first thin film transistor 5603*a* and the second thin film transistor 5603*b* are turned off. At this time, Data_j+1 input to the wiring 5621_J is input to the signal line Sj+1 via the third thin film transistor 5603*c*.

As described above, in the signal line driver circuit in FIG. 18, by dividing one gate selection period into three, video signals can be input to three signal lines from one wiring 5621 during one gate selection period. Therefore, in the signal line driver circuit in FIG. 18, the number of connections between the substrate provided with the driver IC 5601 and the substrate provided with the pixel portion can be approximately ⅓ of the number of signal lines. The number of connections is reduced to approximately ⅓ of the number of the signal lines, so that reliability, yield, etc., of the signal line driver circuit in FIG. 18 can be improved.

Note that there are no particular limitations on the arrangement, the number, a driving method, and the like of the thin film transistors, as long as one gate selection period is divided into a plurality of sub-selection periods and video signals are input to a plurality of signal lines from one wiring in the respective sub-selection periods as illustrated in FIG. 18.

For example, when video signals are input to three or more signal lines from one wiring in three or more sub-selection periods, it is only necessary to add a thin film transistor and a wiring for controlling the thin film transistor. Note that when one gate selection period is divided into four or more sub-selection periods, one sub-selection period becomes shorter. Therefore, one gate selection period is preferably divided into two or three sub-selection periods.

Figure 20:
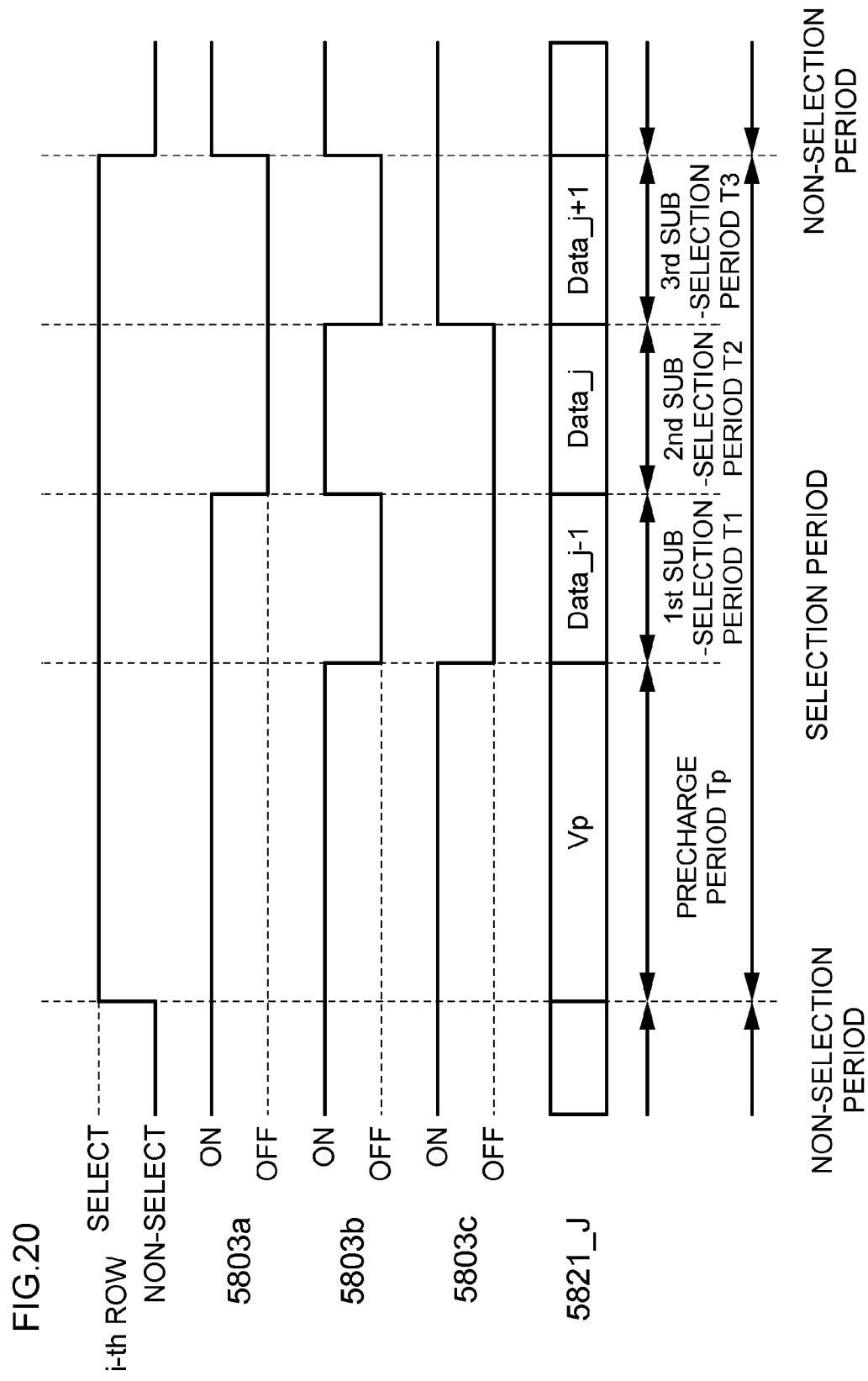
FIG. 20 is a timing chart of an operation of a signal line driver circuit illustrating an embodiment of the present invention.

As another example, one selection period may be divided into a pre-charge period Tp, the first sub-selection period T1, the second sub-selection period T2, and the third sub-selection period T3 as illustrated in a timing chart in FIG. 20. The timing chart in FIG. 20 shows the timing at which the scan line Gi of the i-th row is selected, timing 5803a at which the first thin film transistor 5603a is turned on/off, timing 5803b at which the second thin film transistor 5603b is turned on/off, timing 5803c at which the third thin film transistor 5603c is turned on/off, and a signal 5821_J input to the wiring 5621_J of the J-th column. As illustrated in FIG. 20, the first thin film transistor 5603a, the second thin film transistor 5603b, and the third thin film transistor 5603c are tuned on in the pre-charge period Tp. At this time, precharge voltage Vp input to the wiring 5621_J is input to each of the signal line Sj−1, the signal line Sj, and the signal line Sj+1 via the first thin film transistor 5603a, the second thin film transistor 5603b, and the third thin film transistor 5603c. In the first sub-selection period T1, the first thin film transistor 5603a is turned on, and the second thin film transistor 5603b and the third thin film transistor 5603c are turned off. At this time, Data_j−1 input to the wiring 5621_J is input to the signal line Sj−1 via the first thin film transistor 5603a. In the second sub-selection period T2, the second thin film transistor 5603b is turned on, and the first thin film transistor 5603a and the third thin film transistor 5603c are turned off. At this time, Data_j input to the wiring 5621_J is input to the signal line Sj via the second thin film transistor 5603b. In the third sub-selection period T3, the third thin film transistor 5603c is turned on, and the first thin film transistor 5603a and the second thin film transistor 5603b are turned off. At this time, Data_j+1 input to the wiring 5621_J is input to the signal line Sj+1 via the third thin film transistor 5603c.

As described above, in the signal-line driver circuit of FIG. 18, to which the timing chart of FIG. 20 is applied, a signal line can be pre-charged by providing a pre-charge selection period before sub-selection periods. Thus, a video signal can be written to a pixel at a high speed. Note that portions in FIG. 20 which are similar to those of FIG. 19 are denoted by common reference numerals and detailed description of the portions which are the same and portions which have similar functions is omitted.

Further, a structure of a scan line driver circuit is described. The scan line driver circuit includes a shift register and a buffer. Additionally, the scan line driver circuit may include a level shifter in some cases. In the scan line driver circuit, when the clock signal (CLK) and the start pulse signal (SP) are input to the shift register, a selection signal is generated. The generated selection signal is buffered and amplified by the buffer, and the resulting signal is supplied to a corresponding scan line. Gate electrodes of transistors in pixels of one line are connected to the scan line. Since the transistors in the pixels of one line have to be turned on all at once, a buffer which can supply a large current is used.

One mode of a shift register which is used for part of a scan line driver circuit is described with reference to FIG. 21 and FIG. 22.

Figure 21:
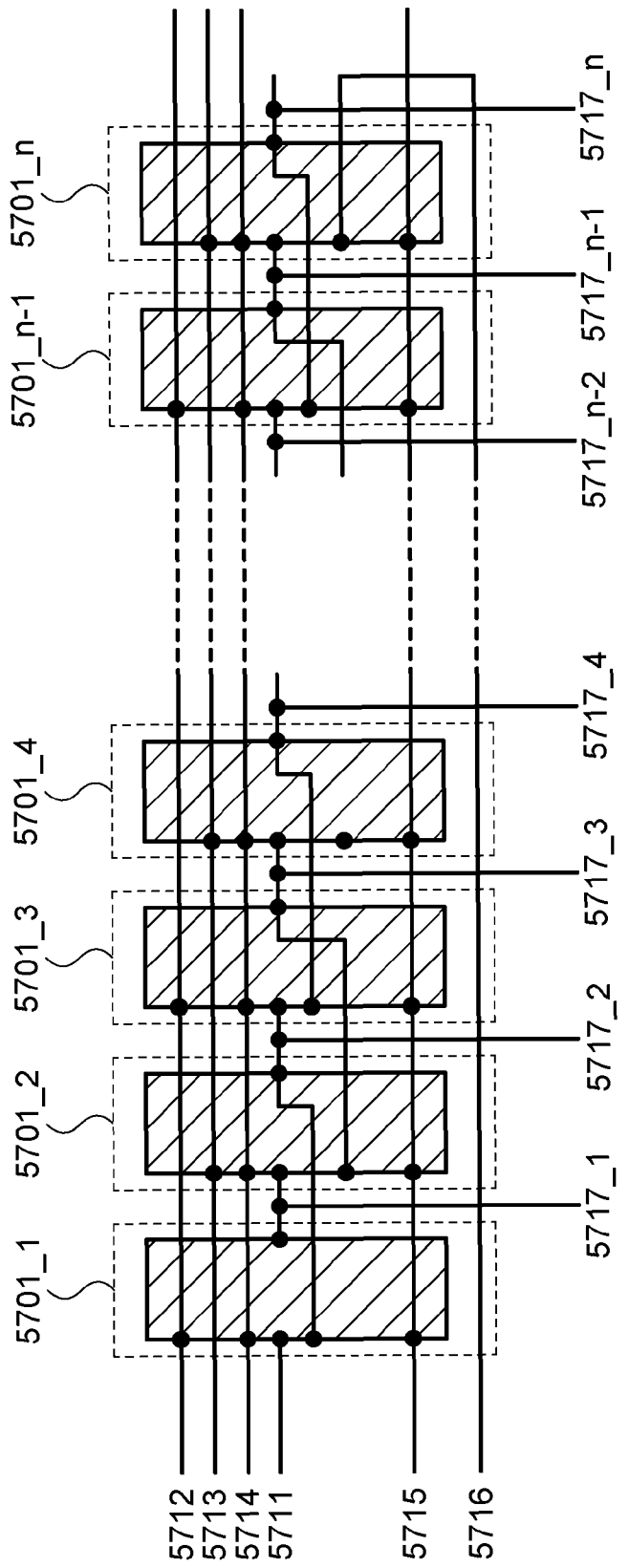
FIG. 21 is a diagram showing one example of a structure of a shift register illustrating an embodiment of the present invention.

FIG. 21 illustrates a circuit configuration of the shift register. The shift register illustrated in FIG. 21 includes a plurality of flip-flops: flip-flops 5701_1 to 5701_n. The shift register is operated with input of a first clock signal, a second clock signal, a start pulse signal, and a reset signal.

Connection relations of the shift register in FIG. 21 are described. In the i-th stage flip-flop 5701_i (one of the flip-flops 5701_1 to 5701_n) in the shift register of FIG. 21, a first wiring 5501 illustrated in FIG. 22 is connected to a seventh wiring 5717_i−1; a second wiring 5502 illustrated in FIG. 22 is connected to a seventh wiring 5717_i+1; a third wiring 5503 illustrated in FIG. 22 is connected to a seventh wiring 5717_i; and a sixth wiring 5506 illustrated in FIG. 22 is connected to a fifth wiring 5715.

Figure 22:
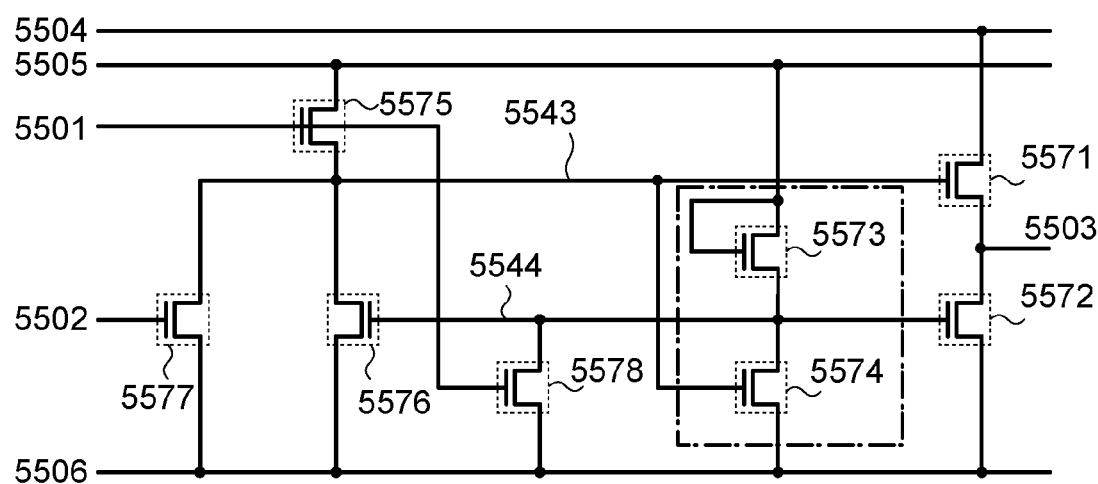
FIG. 22 is a diagram showing a connection structure of a flip-flop shown in FIG. 21.

Further, a fourth wiring 5504 illustrated in FIG. 22 is connected to a second wiring 5712 in flip-flops of odd-numbered stages, and is connected to a third wiring 5713 in flip-flops of even-numbered stages. A fifth wiring 5505 illustrated in FIG. 22 is connected to a fourth wiring 5714.

Note that the first wiring 5501 in FIG. 22, of the first stage flip-flop 5701_1 is connected to a first wiring 5711. Moreover, the second wiring 5502 in FIG. 22, of the n-th stage flip-flop 5701_n is connected to a sixth wiring 5716.

Note that the first wiring 5711, the second wiring 5712, the third wiring 5713, and the sixth wiring 5716 may be referred to as a first signal line, a second signal line, a third signal line, and a fourth signal line, respectively. The fourth wiring 5714 and the fifth wiring 5715 may be referred to as a first power supply line and a second power supply line, respectively.

Next, FIG. 22 illustrates details of the flip-flop illustrated in FIG. 21. A flip-flop illustrated in FIG. 22 includes a first thin film transistor 5571, a second thin film transistor 5572, a third thin film transistor 5573, a fourth thin film transistor 5574, a fifth thin film transistor 5575, a sixth thin film transistor 5576, a seventh thin film transistor 5577, and an eighth thin film transistor 5578. Each of the first thin film transistor 5571, the second thin film transistor 5572, the third thin film transistor 5573, the fourth thin film transistor 5574, the fifth thin film transistor 5575, the sixth thin film transistor 5576, the seventh thin film transistor 5577, and the eighth thin film transistor 5578 is an n-channel transistor and is turned on when the gate-source voltage ($V_{gs}$) exceeds the threshold voltage ($V_{th}$).

In FIG. 22, a gate electrode of the third thin film transistor 5573 is electrically connected to the power supply line. Further, it can be said that a circuit in which the third thin film transistor 5573 is connected to the fourth thin film transistor 5574 (a circuit surrounded by the dotted line in FIG. 22) corresponds to a configuration illustrated in FIG. 14A. Although the example in which all the thin film transistors are enhancement type n-channel transistors is described here, there is no limitation to this example. For example, the driver circuit can be driven even with the use of an n-channel depletion-mode transistor as the third thin film transistor 5573.

Next, connections of the flip-flop shown in FIG. 21 are described below.

A first electrode (one of a source electrode and a drain electrode) of the first thin film transistor 5571 is connected to the fourth wiring 5504. A second electrode (the other of the source electrode and the drain electrode) of the first thin film transistor 5571 is connected to the third wiring 5503.

A first electrode of the second thin film transistor 5572 is connected to the sixth wiring 5506. A second electrode of the second thin film transistor 5572 is connected to the third wiring 5503.

A first electrode of the third thin film transistor 5573 is connected to the fifth wiring 5505, and a second electrode of the third thin film transistor 5573 is connected to a gate electrode of the second thin film transistor 5572. A gate electrode of the third thin film transistor 5573 is connected to the fifth wiring 5505.

A first electrode of the fourth thin film transistor 5574 is connected to the sixth wiring 5506. A second electrode of the fourth thin film transistor 5574 is connected to a gate electrode of the second thin film transistor 5572. A gate electrode of the fourth thin film transistor 5574 is connected to a gate electrode of the first thin film transistor 5571.

A first electrode of the fifth thin film transistor 5575 is connected to the fifth wiring 5505. A second electrode of the fifth thin film transistor 5575 is connected to the gate electrode of the first thin film transistor 5571. A gate electrode of the fifth thin film transistor 5575 is connected to the first wiring 5501.

A first electrode of the sixth thin film transistor 5576 is connected to the sixth wiring 5506. A second electrode of the sixth thin film transistor 5576 is connected to the gate electrode of the first thin film transistor 5571. A gate electrode of the sixth thin film transistor 5576 is connected to the gate electrode of the second thin film transistor 5572.

A first electrode of the seventh thin film transistor 5577 is connected to the sixth wiring 5506. A second electrode of the seventh thin film transistor 5577 is connected to the gate electrode of the first thin film transistor 5571. A gate electrode of the seventh thin film transistor 5577 is connected to the second wiring 5502. A first electrode of the eighth thin film transistor 5578 is connected to the sixth wiring 5506. A second electrode of the eighth thin film transistor 5578 is connected to the gate electrode of the second thin film transistor 5572. A gate electrode of the eighth thin film transistor 5578 is connected to the first wiring 5501.

Note that the points at which the gate electrode of the first thin film transistor 5571, the gate electrode of the fourth thin film transistor 5574, the second electrode of the fifth thin film transistor 5575, the second electrode of the sixth thin film transistor 5576, and the second electrode of the seventh thin film transistor 5577 are connected are each referred to as a node 5543. The points at which the gate electrode of the second thin film transistor 5572, the second electrode of the third thin film transistor 5573, the second electrode of the fourth thin film transistor 5574, the gate electrode of the sixth thin film transistor 5576, and the second electrode of the eighth thin film transistor 5578 are connected are each referred to as a node 5544.

Note that the first wiring 5501, the second wiring 5502, the third wiring 5503, and the fourth wiring 5504 may be referred to as a first signal line, a second signal line, a third signal line, and a fourth signal line, respectively. The fifth wiring 5505 and the sixth wiring 5506 may be referred to as a first power supply line and a second power supply line, respectively.

In addition, when the channel width of the transistor in the scan line driver circuit is increased or a plurality of scan line driver circuits are provided, for example, higher frame frequency can be realized. When a plurality of scan line driver circuits are provided, a scan line driver circuit for driving scan lines of even-numbered rows is provided on one side and a scan line driver circuit for driving scan lines of odd-numbered rows is provided on the opposite side; thus, an increase in frame frequency can be realized. Furthermore, the use of the plurality of scan line driver circuits for output of signals to the same scan line is advantageous in increasing the size of a display device.

Figure 17B:
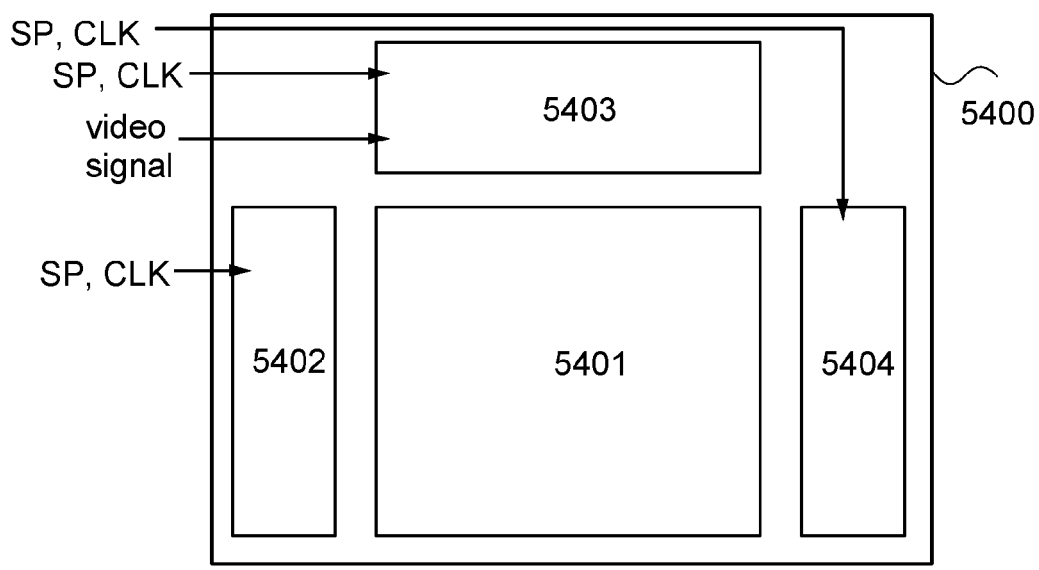

Further, when an active matrix light-emitting display device which is an example of a semiconductor device is manufactured, a plurality of thin film transistors are arranged in at least one pixel, and thus a plurality of scan line driver circuits are preferably arranged. FIG. 17B is a block diagram illustrating an example of an active matrix light-emitting display device.

The light-emitting display device illustrated in FIG. 17B includes, over a substrate 5400, a pixel portion 5401 having a plurality of pixels each provided with a display element, a first scan line driver circuit 5402 and a second scan line driver circuit 5404 that select a pixel, and a signal line driver circuit 5403 that controls input of a video signal to the selected pixel.

When the video signal input to a pixel of the light-emitting display device illustrated in FIG. 17B is a digital signal, a pixel is in a light-emitting state or in a non-light-emitting state by switching of on and off of a transistor. Thus, grayscale can be displayed using an area grayscale method or a time grayscale method. An area grayscale method refers to a driving method in which one pixel is divided into a plurality of subpixels and the respective subpixels are driven independently based on video signals so that grayscale is displayed. Further, a time grayscale method refers to a driving method in which a period during which a pixel emits light is controlled so that grayscale is displayed.

Since the response time of a light-emitting element is higher than that of a liquid crystal element or the like, the light-emitting element is more suitable for a time grayscale method than the liquid crystal element. Specifically, in the case of displaying with a time grayscale method, one frame period is divided into a plurality of subframe periods. Then, in accordance with video signals, the light-emitting element in the pixel is brought into a light-emitting state or a non-light-emitting state in each subframe period. By dividing one frame period into a plurality of subframe periods, the total length of time, in which a pixel actually emits light in one frame period, can be controlled by video signals so that grayscale can be displayed.

In the example of the light-emitting display device illustrated in FIG. 17B, in a case where two switching TFTs are arranged in one pixel, the first scan line driver circuit 5402 generates a signal which is input to a first scan line serving as a gate wiring of one of the switching TFTs, and the second scan line driver circuit 5404 generates a signal which is input to a second scan line serving as a gate wiring of the other of the switching TFTs; however, one scan line driver circuit may generate both the signal which is input to the first scan line and the signal which is input to the second scan line. In addition, for example, there is a possibility that a plurality of scan lines used for controlling the operation of the switching element are provided in each pixel, depending on the number of the switching TFTs included in one pixel. In this case, one scan line driver circuit may generate all signals that are input to the plurality of scan lines, or a plurality of scan line driver circuits may generate signals that are input to the plurality of scan lines.

Also in the light-emitting display device, a part of a driver circuit that can include n-channel TFTs among driver circuits can be formed over the same substrate as the thin film transistors of the pixel portion.

Moreover, the above-described driver circuit can be used for an electronic paper that drives electronic ink using an element electrically connected to a switching element, without being limited to applications to a liquid crystal display device or a light-emitting display device. The electronic paper is also referred to as an electrophoretic display device (an electrophoretic display) and is advantageous in that it has the same level of readability as plain paper, it has lower power consumption than other display devices, and it can be made thin and lightweight.

Electrophoretic displays can have various modes. Electrophoretic displays contain a plurality of microcapsules dispersed in a solvent or a solute, each microcapsule including first particles which are positively charged and second particles which are negatively charged. By applying an electric field to the microcapsules, the particles in the microcapsules move in opposite directions to each other and only the color of the particles gathering on one side is displayed. Note that the first particles and the second particles each include pigment and do not move without an electric field. Moreover, the first particles and the second particles have different colors (which may be colorless).

Thus, an electrophoretic display is a display that utilizes a so-called dielectrophoretic effect by which a substance having a high dielectric constant moves to a high-electric field region. An electrophoretic display device does not need to use a polarizer or a counter substrate, which is required in a liquid crystal display device, and both the thickness and weight of the electrophoretic display device can be reduced to a half of those of a liquid crystal display device.

A solution in which the above microcapsules are dispersed in a solvent is referred to as electronic ink. This electronic ink can be printed on a surface of glass, plastic, cloth, paper, or the like. Furthermore, by using a color filter or particles that have a pigment, color display can also be achieved.

In addition, if a plurality of the above microcapsules is arranged as appropriate over an active matrix substrate so as to be interposed between two electrodes, an active matrix display device can be completed, and display can be performed by application of an electric field to the microcapsules. For example, the active matrix substrate including the thin film transistor (in which an oxide semiconductor layer including $SiO_x$ is used for a channel formation region and an oxide semiconductor to which nitrogen is added is used for source and drain regions) described in Embodiment 2 can be used.

Note that the first particles and the second particles in the microcapsules may each be formed of a single material selected from a conductive material, an insulating material, a semiconductor material, a magnetic material, a liquid crystal material, a ferroelectric material, an electroluminescent material, an electro-chromic material, and a magnetophoretic material, or formed of a composite material of any of these.

Through the above process, a highly reliable display device as a semiconductor device can be manufactured.

This embodiment can be implemented in an appropriate combination with any of the structures described in the other embodiments.

Embodiment 15

This embodiment describes an example of a light-emitting display device as a semiconductor device. As a display element included in a display device, a light-emitting element utilizing electroluminescence is described here. Light-emitting elements utilizing electroluminescence are classified according to whether a light emitting material is an organic compound or an inorganic compound. The former is referred to as an organic EL element and the latter is referred to as an inorganic EL element.

In an organic EL element, by application of voltage to a light-emitting element, electrons and holes are separately injected from a pair of electrodes into a layer including a light-emitting organic compound, and current flows. The carriers (electrons and holes) are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that an example of an organic EL element as a light-emitting element is described here.

Figure 23:
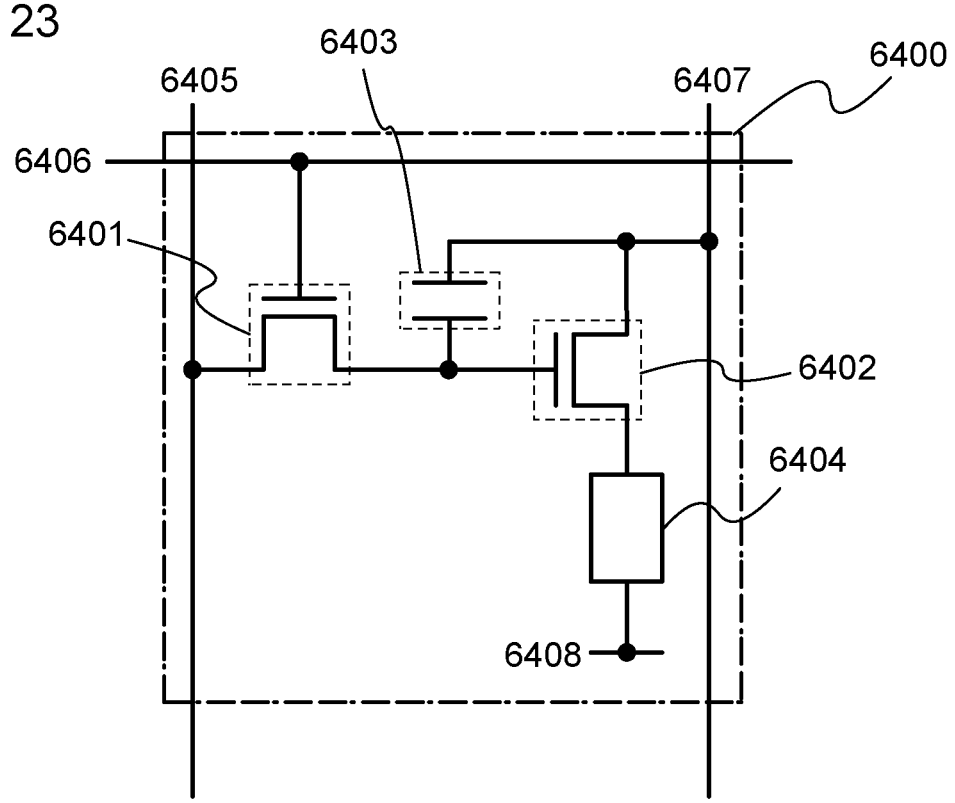
FIG. 23 is a diagram of an equivalent circuit of a pixel of a semiconductor device illustrating an embodiment of the present invention.

FIG. 23 illustrates an example of a pixel structure to which digital time grayscale driving can be applied, as an example of a semiconductor device.

A structure and operation of a pixel to which digital time grayscale driving can be applied are described. Here, one pixel includes two n-channel transistors in each of which an oxide semiconductor layer including $SiO_x$ (typically, a Zn—O-based non-single-crystal film) is used for a channel formation region and a Zn—O-based oxide semiconductor to which nitrogen is added is used for source and drain regions.

A pixel 6400 includes a switching transistor 6401, a driver transistor 6402, a light-emitting element 6404, and a capacitor 6403. A gate of the switching transistor 6401 is connected to a scan line 6406, a first electrode (one of a source electrode and a drain electrode) of the switching transistor 6401 is connected to a signal line 6405, and a second electrode (the other of the source electrode and the drain electrode) of the switching transistor 6401 is connected to a gate of the driver transistor 6402. The gate of the driver transistor 6402 is connected to a power supply line 6407 via the capacitor 6403, a first electrode of the driver transistor 6402 is connected to the power supply line 6407, and a second electrode of the driver transistor 6402 is connected to a first electrode (pixel electrode) of the light-emitting element 6404. A second electrode of the light-emitting element 6404 corresponds to a common electrode 6408. The common electrode 6408 is electrically connected to a common potential line provided over the same substrate, and the connection portion may be used as a common connection portion.

The second electrode (common electrode 6408) of the light-emitting element 6404 is set to a low power supply potential. Note that the low power supply potential is a potential satisfying the low power supply potential<a high power supply potential with reference to the high power supply potential that is set to the power supply line 6407. As the low power supply potential, GND, 0 V, or the like may be employed, for example. A potential difference between the high power supply potential and the low power supply potential is applied to the light-emitting element 6404 and current is supplied to the light-emitting element 6404, so that the light-emitting element 6404 emits light. Here, in order to make the light-emitting element 6404 emit light, each potential is set so that the potential difference between the high power supply potential and the low power supply potential is a forward threshold voltage or higher of the light-emitting element 6404.

Note that gate capacitor of the driver transistor 6402 may be used as a substitute for the capacitor 6403, so that the capacitor 6403 can be omitted. The gate capacitor of the driver transistor 6402 may be formed between the channel region and the gate electrode.

In the case of a voltage-input voltage driving method, a video signal is input to the gate of the driver transistor 6402 so that the driver transistor 6402 is in either of two states of being sufficiently turned on or turned off. That is, the driver transistor 6402 operates in a linear region. Since the driver transistor 6402 operates in the linear region, a voltage higher than the voltage of the power supply line 6407 is applied to the gate of the driver transistor 6402. Note that a voltage higher than or equal to (voltage of the power supply line+Vth of the driver transistor 6402) is applied to the signal line 6405.

Further, in the case of using analog grayscale driving instead of the digital time ratio grayscale driving, the pixel structure the same as that of FIG. 23 can be employed by inputting signals in a different way.

In the case of performing analog grayscale driving, a voltage higher than or equal to (forward voltage of the light-emitting element 6404+Vth of the driver transistor 6402) is applied to the gate of the driver transistor 6402. The forward voltage of the light-emitting element 6404 indicates a voltage at which a desired luminance is obtained, and includes at least forward threshold voltage. The video signal by which the driver transistor 6402 operates in a saturation region is input, so that current can be supplied to the light-emitting element 6404. In order for the driver transistor 6402 to operate in the saturation region, the potential of the power supply line 6407 is set higher than the gate potential of the driver transistor 6402. When an analog video signal is used, it is possible to feed current to the light-emitting element 6404 in accordance with the video signal and perform analog grayscale driving.

Note that a pixel structure of the present invention is not limited to that shown in FIG. 23. For example, a switch, a resistor, a capacitor, a transistor, a logic circuit, or the like may be added to the pixel shown in FIG. 23.

Next, structures of the light-emitting element will be described with reference to FIGS. 24A to 24C. Here, a cross-sectional structure of a pixel will be described by taking an n-channel driving TFT as an example. Driving TFTs 7001, 7011, and 7021 used for semiconductor devices illustrated in FIGS. 24A to 24C can be formed in a manner similar to formation of the thin film transistor 170 described in Embodiment 2 and are thin film transistors in each of which an oxide semiconductor layer including $SiO_x$ for a channel formation region and an oxide semiconductor to which nitrogen is added is used for source and drain regions.

In order to extract light emitted from the light-emitting element, at least one of an anode and a cathode is required to transmit light. A thin film transistor and a light-emitting element are formed over a substrate. A light-emitting element can have a top emission structure, in which light emission is extracted through the surface opposite to the substrate; a bottom emission structure, in which light emission is extracted through the surface on the substrate side; or a dual emission structure, in which light emission is extracted through the surface opposite to the substrate and the surface on the substrate side. The pixel structure can be applied to a light-emitting element having any of these emission structures.

A light-emitting element having a top emission structure will be described with reference to FIG. 24A.

Figure 24A:
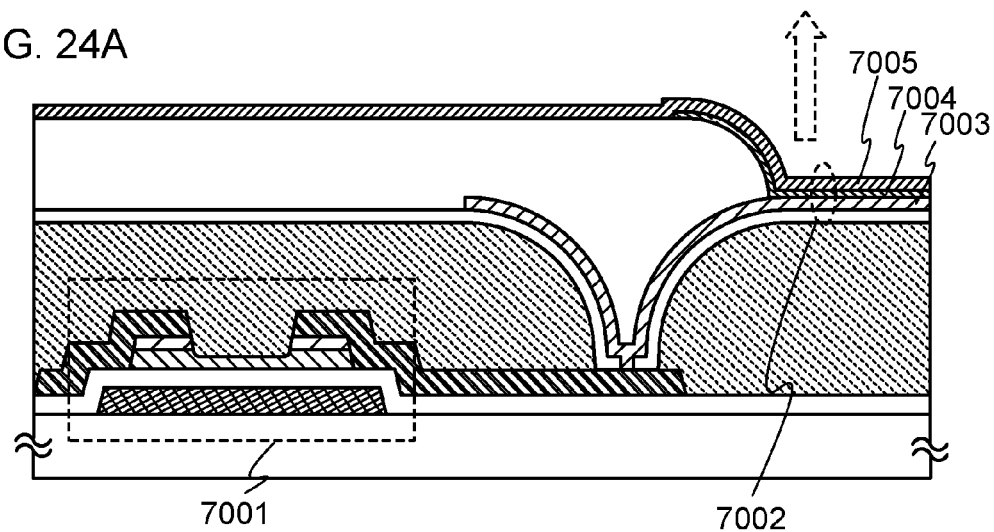
FIGS. 24A to 24C are each a cross-sectional view of a semiconductor device illustrating an embodiment of the present invention.
Figure 24B:
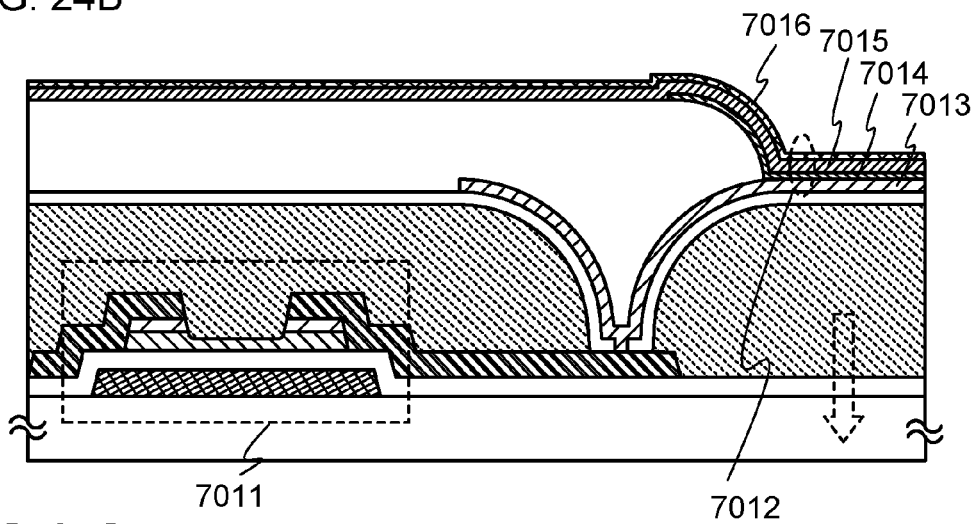
Figure 24C:
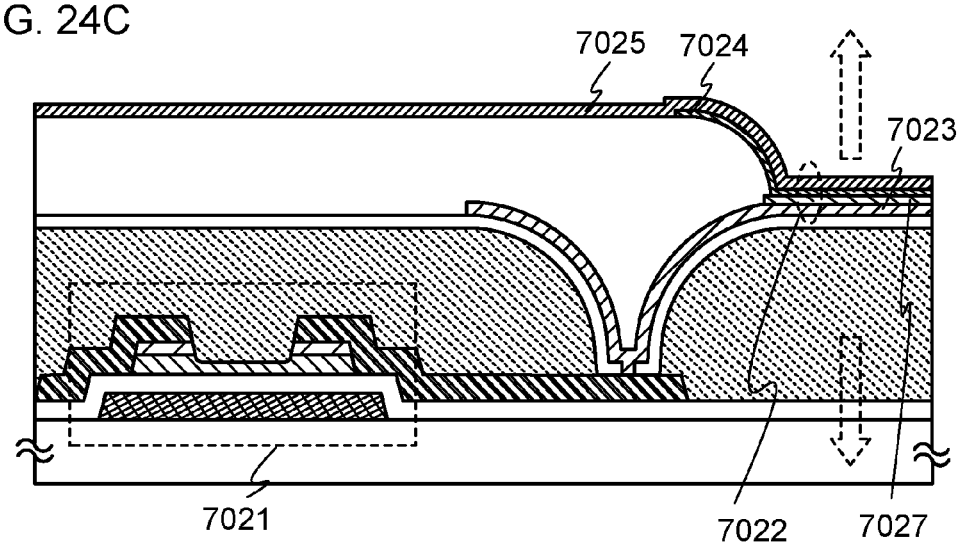

FIG. 24A is a cross-sectional view of a pixel in the case where the driving TFT 7001 is an n-channel TFT and light is emitted from a light-emitting element 7002 to an anode 7005 side. In the TFT 7001, a Zn—O-based oxide semiconductor to which silicon oxide is added is used for a semiconductor layer and a Zn—O-based oxide semiconductor to which nitrogen is added is used for source and drain regions. In FIG. 24A, a cathode 7003 of the light-emitting element 7002 is electrically connected to the driving TFT 7001, and a light-emitting layer 7004 and the anode 7005 are stacked in this order over the cathode 7003. The cathode 7003 can be formed using a variety of conductive materials as long as they have a low work function and reflect light. For example, Ca, Al, MgAg, AlLi, or the like is preferably used. The light-emitting layer 7004 may be formed using a single layer or a plurality of layers stacked. When the light-emitting layer 7004 is formed using a plurality of layers, the light-emitting layer 7004 is formed by stacking an electron-injecting layer, an electron-transporting layer, a light-emitting layer, a hole-transporting layer, and a hole-injecting layer in this order over the cathode 7003. It is not necessary to form all of these layers. The anode 7005 is formed using a light-transmitting conductive film such as a film of indium oxide including tungsten oxide, indium zinc oxide including tungsten oxide, indium oxide including titanium oxide, indium tin oxide including titanium oxide, indium tin oxide (hereinafter referred to as ITO), indium zinc oxide, or indium tin oxide to which silicon oxide is added.

The light-emitting element 7002 corresponds to a region where the light-emitting layer 7004 is sandwiched between the cathode 7003 and the anode 7005. In the case of the pixel illustrated in FIG. 24A, light is emitted from the light-emitting element 7002 to the anode 7005 side as indicated by an arrow.

Next, a light-emitting element having a bottom emission structure will be described with reference to FIG. 24B. FIG. 21B is a cross-sectional view of a pixel in the case where the driving TFT 7011 is of an n-type and light is emitted from a light-emitting element 7012 to a cathode 7013 side. In the TFT 7011, an In—Zn—O-based oxide semiconductor to which silicon oxide is added is used for a semiconductor layer and an In—Zn—O-based oxide semiconductor to which nitrogen is added is used for source and drain regions. In FIG. 24B, the cathode 7013 of the light-emitting element 7012 and the TFT 7011 that is a driving TFT are electrically connected to each other, and a light-emitting layer 7014 and an anode 7015 are stacked in this order over the cathode 7013. A light-blocking film 7016 for reflecting or blocking light may be formed to cover the anode 7015 when the anode 7015 has a light-transmitting property. For the cathode 7013, a variety of materials can be used as in the case of FIG. 24A as long as they are conductive materials having a low work function. The cathode 7013 is formed to have a thickness that can transmit light (preferably, approximately 5 nm to 30 nm). For example, an aluminum film with a thickness of 20 nm can be used as the cathode 7013. Similar to the case of FIG. 24A, the light-emitting layer 7014 may be formed using either a single layer or a plurality of layers stacked. The anode 7015 is not required to transmit light, but can be formed using a light-transmitting conductive material as in the case of FIG. 24A.

As the light-blocking film 7016, a metal or the like that reflects light can be used for example; however, it is not limited to a metal film. For example, a resin or the like to which black pigments are added can also be used.

The light-emitting element 7012 corresponds to a region where the light-emitting layer 7014 is sandwiched between the cathode 7013 and the anode 7015. In the case of the pixel illustrated in FIG. 24B, light is emitted from the light-emitting element 7012 to the cathode 7013 side as indicated by an arrow.

Next, a light-emitting element having a dual emission structure will be described with reference to FIG. 24C. In FIG. 24C, a cathode 7023 of a light-emitting element 7022 is formed over a light-transmitting conductive film 7027 which is electrically connected to the driving TFT 7021, and a light-emitting layer 7024 and an anode 7025 are stacked in this order over the cathode 7023. In the TFT 7021, a Zn—O-based oxide semiconductor to which silicon oxide is added is used for a semiconductor layer and a Zn—O-based oxide semiconductor to which nitrogen is added is used for source and drain regions. As in the case of FIG. 24A, the cathode 7023 can be formed using a variety of conductive materials as long as they have a low work function. The cathode 7023 is formed to have a thickness that can transmit light. For example, a film of Al having a thickness of 20 nm can be used as the cathode 7023. As in FIG. 24A, the light-emitting layer 7024 may be formed using either a single layer or a plurality of layers stacked. The anode 7025 can be formed using a light-transmitting conductive material as in the case of FIG. 24A.

The light-emitting element 7022 corresponds to a region where the cathode 7023, the light-emitting layer 7024, and the anode 7025 overlap with one another. In the case of the pixel illustrated in FIG. 24C, light is emitted from the light-emitting element 7022 to both the anode 7025 side and the cathode 7023 side as indicated by arrows.

Note that, although the organic EL elements are described here as the light-emitting elements, an inorganic EL element can also be provided as a light-emitting element.

In this embodiment, the example is described in which a thin film transistor (a driving TFT) which controls the driving of a light-emitting element is electrically connected to the light-emitting element; however, a structure may be employed in which a TFT for current control is connected between the driving TFT and the light-emitting element.

Next, the appearance and cross section of a light-emitting display panel (also referred to as a light-emitting panel) which corresponds to one mode of a semiconductor device are described with reference to FIGS. 25A and 25B. FIG. 25A is a top view of a panel in which thin film transistors and a light-emitting element, which are formed over a first substrate, are sealed between the first substrate and a second substrate with a sealant. FIG. 25B corresponds to a cross-sectional view taken along line H-I of FIG. 25A.

A sealant 4505 is provided so as to surround a pixel portion 4502, signal line driver circuits 4503a and 4503b, and scan line driver circuits 4504a and 4504b which are provided over a first substrate 4501. In addition, a second substrate 4506 is provided over the pixel portion 4502, the signal line driver circuits 4503a and 4503b, and the scan line driver circuits 4504a and 4504b. Accordingly, the pixel portion 4502, the signal line driver circuits 4503a and 4503b, and the scan line driver circuits 4504a and 4504b are sealed together with a filler 4507, by the first substrate 4501, the sealant 4505, and the second substrate 4506. It is preferable that a panel be packaged (sealed) with a protective film (such as a laminate film or an ultraviolet curable resin film) or a cover material with high air-tightness and little degasification so that the panel is not exposed to the outside air, in this manner.

The pixel portion 4502, the signal line driver circuits 4503a and 4503b, and the scan line driver circuits 4504a and 4504b formed over the first substrate 4501 each include a plurality of thin film transistors, and the thin film transistor 4510 included in the pixel portion 4502 and the thin film transistor 4509 included in the signal line driver circuit 4503a are illustrated as an example in FIG. 25B.

In each of the thin film transistors 4509 and 4510, a Zn—O-based oxide semiconductor to which silicon oxide is added is used, and a Zn—O-based oxide semiconductor to which nitrogen is added is used for source and drain regions. In this embodiment, the thin film transistors 4509 and 4510 are n-channel thin film transistors.

Moreover, reference numeral 4511 denotes a light-emitting element. A first electrode layer 4517 which is a pixel electrode included in the light-emitting element 4511 is electrically connected to a source electrode layer or a drain electrode layer of the thin film transistor 4510. Note that a structure of the light-emitting element 4511 is a stacked-layer structure of the first electrode layer 4517, the electroluminescent layer 4512, and the second electrode layer 4513, but there is no particular limitation on the structure. The structure of the light-emitting element 4511 can be changed as appropriate depending on the direction in which light is extracted from the light-emitting element 4511, or the like.

A partition 4520 is formed using an organic resin film, an inorganic insulating film, or organic polysiloxane. It is particularly preferable that the partition 4520 be formed using a photosensitive material and an opening be formed over the first electrode layer 4517 so that a sidewall of the opening is formed as an inclined surface with continuous curvature.

The electroluminescent layer 4512 may be formed with a single layer or a plurality of layers stacked.

A protective film may be formed over the second electrode layer 4513 and the partition 4520 in order to prevent entry of oxygen, hydrogen, moisture, carbon dioxide, or the like into the light-emitting element 4511. As the protective film, a silicon nitride film, a silicon nitride oxide film, a DLC film, or the like can be formed.

In addition, a variety of signals and potentials are supplied to the signal line driver circuits 4503a and 4503b, the scan line driver circuits 4504a and 4504b, or the pixel portion 4502 from FPCs 4518a and 4518b.

In this embodiment, a connection terminal electrode 4515 is formed from the same conductive film as the first electrode layer 4517 included in the light-emitting element 4511, and a terminal electrode 4516 is formed from the same conductive film as the source and drain electrode layers included in the thin film transistors 4509 and 4510.

The connection terminal electrode 4515 is electrically connected to a terminal included in the FPC 4518a via an anisotropic conductive film 4519.

As the second substrate located in the direction in which light is extracted from the light-emitting element 4511 needs to have a light-transmitting property. In that case, a light-transmitting material such as a glass plate, a plastic plate, a polyester film, or an acrylic film is used for the second substrate.

As the filler 4507, an ultraviolet curable resin or a thermosetting resin can be used, in addition to an inert gas such as nitrogen or argon. For example, PVC (polyvinyl chloride), acrylic, polyimide, an epoxy resin, a silicone resin, PVB (polyvinyl butyral), or EVA (ethylene vinyl acetate) can be used. In this embodiment, nitrogen is used for the filler.

In addition, if needed, an optical film, such as a polarizing plate, a circularly polarizing plate (including an elliptically polarizing plate), a retardation plate (a quarter-wave plate or a half-wave plate), or a color filter, may be provided as appropriate on a light-emitting surface of the light-emitting element. Further, the polarizing plate or the circularly polarizing plate may be provided with an anti-reflection film. For example, anti-glare treatment by which reflected light can be diffused by projections and depressions on the surface so as to reduce the glare can be performed.

The signal line driver circuits 4503a and 4503b and the scanning line driver circuits 4504a and 4504b may be mounted as driver circuits formed using a single crystal semiconductor film or a polycrystalline semiconductor film over a substrate separately prepared. In addition, only the signal line driver circuits or part thereof, or the scan line driver circuits or part thereof may be separately formed and mounted. This embodiment is not limited to the structure illustrated in FIGS. 25A and 25B.

Through the above process, a highly reliable light-emitting display device (display panel) as a semiconductor device can be manufactured.

This embodiment can be implemented in an appropriate combination with any of the structures described in the other embodiments.

Embodiment 16

Thin film transistors in each of which an oxide semiconductor layer including silicon oxide ($SiO_x$) is used for a channel formation region and an oxide semiconductor to which nitrogen is added is used for source and drain regions are formed, and a liquid crystal display device having a display function, in which the thin film transistors are included in a driver circuit and a pixel portion, can be manufactured. Further, part or whole of a driver circuit can be formed over the same substrate as a pixel portion, using a thin film transistor, whereby a system-on-panel can be obtained.

The liquid crystal display device includes a liquid crystal element (also referred to as a liquid crystal display element) as a display element.

Further, a liquid crystal display device includes a panel in which a liquid crystal display element is sealed, and a module in which an IC or the like including a controller is mounted to the panel. An embodiment of the present invention also relates to an element substrate, which corresponds to one mode before the display element is completed in a manufacturing process of the liquid crystal display device, and the element substrate is provided with means for supplying current to the display element in each of a plurality of pixels. Specifically, the element substrate may be in a state in which only a pixel electrode of the display element is provided, a state after formation of a conductive film to be a pixel electrode and before etching of the conductive film to form the pixel electrode, or any other states.

Note that a liquid crystal display device in this specification means an image display device, a display device, or a light source (including a lighting device). Further, the liquid crystal display device includes any of the following modules in its category: a module to which a connector such as an FPC (flexible printed circuit), TAB (tape automated bonding) tape, or a TCP (tape carrier package) is attached; a module having TAB tape or a TCP which is provided with a printed wiring board at the end thereof; and a module having an IC (integrated circuit) directly mounted on a substrate provided with a display element by a COG (chip on glass) method.

Figures 1, 26A:
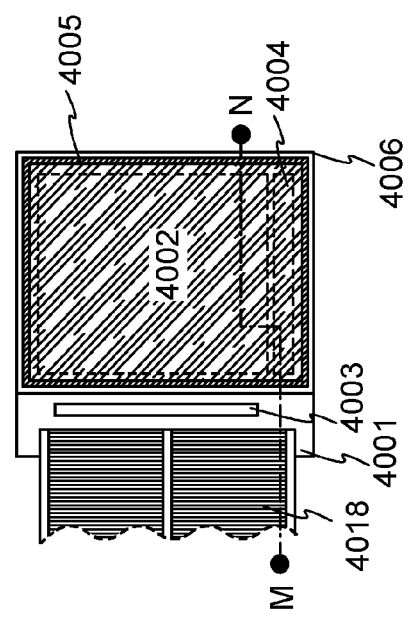
Figures 2, 26A:
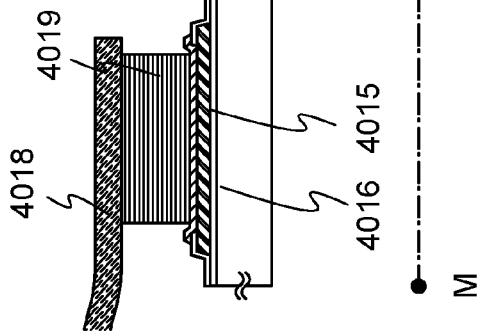
Figure 26B:
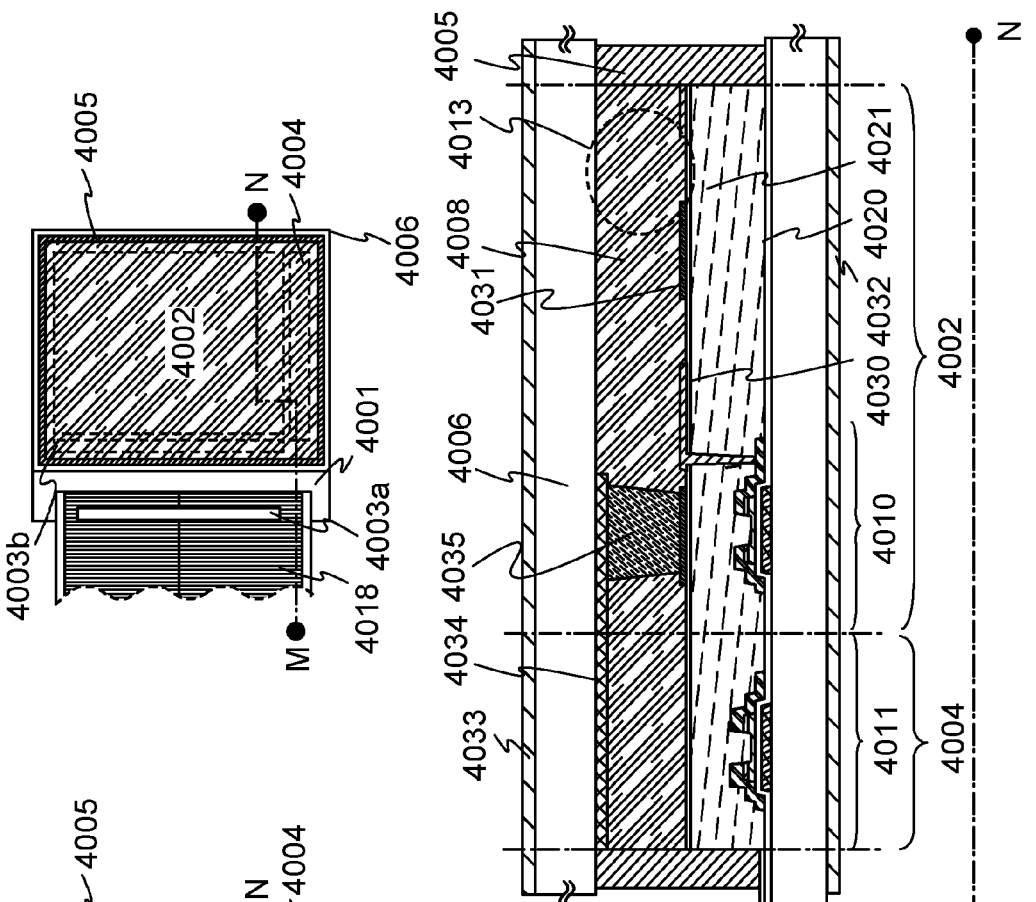

The appearance and a cross section of a liquid crystal display panel, which is one embodiment of a liquid crystal display device, will be described with reference to FIGS. 26A-1, 26A-2, and 26B. FIGS. 26A-1 and 26A-2 are top views of panels in which a liquid crystal element 4013 is sealed with a sealant 4005 between a first substrate 4001 and a second substrate 4006. FIG. 26B is a cross-sectional view taken along M-N of FIGS. 26A-1 and 26A-2.

The sealant 4005 is provided so as to surround a pixel portion 4002 and a scan line driver circuit 4004 which are provided over the first substrate 4001. The second substrate 4006 is provided over the pixel portion 4002 and the scan line driver circuit 4004. Therefore, the pixel portion 4002 and the scan line driver circuit 4004 are sealed together with a liquid crystal layer 4008, by the first substrate 4001, the sealant 4005, and the second substrate 4006. A blue-phase liquid crystal material is used for the liquid crystal layer 4008 in this embodiment without particular limitation. A liquid crystal material exhibiting a blue phase has a short response time of 1 millisecond or less from the state of applying no voltage to the state of applying voltage, whereby short-time response is possible. The liquid crystal material exhibiting a blue phase includes a liquid crystal and a chiral agent. The chiral agent is employed to align the liquid crystal in a helical structure and to make the liquid crystal exhibit a blue phase. For example, a liquid crystal material into which a chiral agent is mixed at 5 wt % or more may be used for the liquid crystal layer. As a liquid crystal, a thermotropic liquid crystal, a low molecular liquid crystal, a high molecular liquid crystal, a ferroelectric liquid crystal, an anti-ferroelectric liquid crystal, or the like is used.

In FIG. 26A-1, a signal line driver circuit 4003 that is formed using a single crystal semiconductor film or a polycrystalline semiconductor film over a substrate separately prepared is mounted in a region that is different from the region surrounded by the sealant 4005 over the first substrate 4001. In contrast, FIG. 26A-2 illustrates an example in which part of a signal line driver circuit 4003 is formed over the first substrate 4001. A signal line driver circuit 4003b is formed over the first substrate 4001 and a signal line driver circuit 4003a which is formed using a single crystal semiconductor film or a polycrystalline semiconductor film is mounted on the substrate separately prepared.

Note that the connection method of a driver circuit which is separately formed is not particularly limited, and a COG method, a wire bonding method, a TAB method, or the like can be used. FIG. 26A-1 illustrates an example of mounting the signal line driver circuit 4003 by a COG method, and FIG. 26A-2 illustrates an example of mounting the signal line driver circuit 4003 by a TAB method.

Each of the pixel portion 4002 and the scan line driver circuit 4004 which are provided over the first substrate 4001 includes a plurality of thin film transistors. FIG. 26B illustrates a thin film transistor 4010 included in the pixel portion 4002 and a thin film transistor 4011 included in the scan line driver circuit 4004. Over the thin film transistors 4010 and 4011, insulating layers 4020 and 4021 are provided. The thin film transistors 4010 and 4011 can be each a thin film transistor in which an oxide semiconductor layer including silicon oxide ($SiO_x$) is used for a channel formation region and an oxide semiconductor to which nitrogen is added is used for source and drain regions. In this embodiment, the thin film transistors 4010 and 4011 are n-channel thin film transistors.

A pixel electrode layer 4030 and a common electrode layer 4031 are provided over the first substrate 4001, and the pixel electrode layer 4030 is electrically connected to the thin film transistor 4010. The liquid crystal element 4013 includes the pixel electrode layer 4030, the common electrode layer 4031, and the liquid crystal layer 4008. In this embodiment, a method is used in which grayscale is controlled by generating an electric field which is substantially parallel to a substrate (i.e., in a lateral direction) to move liquid crystal molecules in a plane parallel to the substrate. In such a method, an electrode structure used in an in plane switching (IPS) mode or a fringe field switching (FFS) mode can be used. Note that a polarizing plate 4032 and a polarizing plate 4033 are provided on the outer sides of the first substrate 4001 and the second substrate 4006, respectively.

As the first substrate 4001 and the second substrate 4006, glass, plastic, or the like having a light-transmitting property can be used. As plastic, a fiberglass-reinforced plastics (FRP) plate, a polyvinyl fluoride (PVF) film, a polyester film, or an acrylic resin film can be used. In addition, a sheet with a structure in which an aluminum foil is sandwiched between PVF films or polyester films can be used.

A columnar spacer denoted by reference numeral 4035 is obtained by selective etching of an insulating film and is provided in order to control the thickness (a cell gap) of the liquid crystal layer 4008. Alternatively, a spherical spacer may also be used.

FIGS. 26A-1 and 26A-2, and 26B illustrate examples of liquid crystal display devices in which a polarizing plate is provided on the outer side (the view side) of a substrate; however, the polarizing plate may be provided on the inner side of the substrate. The position of the polarizing plate may be determined as appropriate depending on the material of the polarizing plate and conditions of the manufacturing process. Furthermore, a light-blocking layer serving as a black matrix may be provided.

The insulating layer 4021 that is an interlayer film is a light-transmitting resin layer. Part of the interlayer film 4021 may be a light-blocking layer. It is preferable that the light-blocking layer is provided to cover the thin film transistors 4010 and 4011. In FIGS. 26A-1 and 26A-2, and 26B, a light-blocking layer 4034 is provided on the second substrate 4006 side so as to cover the thin film transistors 4010 and 4011. By the light-blocking layer 4012 and the light-blocking layer 4034, further improvement in contrast and in stabilization of the thin film transistors can be achieved.

When the light-blocking layer 4034 is provided, the intensity of incident light on the semiconductor layers of the thin film transistors can be attenuated. Accordingly, electric characteristics of the thin film transistors can be stabilized and prevented from being varied due to photosensitivity of the oxide semiconductor.

The thin film transistors may be covered with the insulating layer 4020 which serves as a protective film of the thin film transistors; however, there is no particular limitation to such a structure.

Note that the protective film is provided to prevent entry of contaminant impurities such as organic substance, metal, or moisture existing in air and is preferably a dense film. The protective film may be formed with a single layer or a stacked layer of a silicon oxide film, a silicon nitride film, a silicon oxynitride film, a silicon nitride oxide film, an aluminum oxide film, an aluminum nitride film, aluminum oxynitride film, and/or an aluminum nitride oxide film by a sputtering method.

Further, in the case of further forming a light-transmitting insulating layer as a planarizing insulating film, the light-transmitting insulating layer can be formed using an organic material having heat resistance, such as polyimide, acrylic, benzocyclobutene, polyamide, or epoxy. Other than such organic materials, it is also possible to use a low-dielectric constant material (a low-k material), a siloxane-based resin, PSG (phosphosilicate glass), BPSG (borophosphosilicate glass), or the like. The insulating layer may be formed by stacking a plurality of insulating films formed of these materials.

There is no particular limitation on the formation method of the insulating layer having a stacked structure, and the following method can be employed in accordance with the material: sputtering, an SOG method, spin coating, dip coating, spray coating, droplet discharging (for example, ink jetting, screen printing, or offset printing), doctor knife, roll coating, curtain coating, knife coating, or the like. In the case where the insulating layer is formed using a material solution, the semiconductor layers may be annealed (at 200° C. to 400° C.) at the same time of a baking step. The baking step of the insulating layer also serves as the annealing step of the semiconductor layer, whereby a liquid crystal display device can be manufactured efficiently.

The pixel electrode layer 4030 and the common electrode layer 4031 can be formed using a light-transmitting conductive material such as indium oxide including tungsten oxide, indium zinc oxide including tungsten oxide, indium oxide including titanium oxide, indium tin oxide including titanium oxide, indium tin oxide (hereinafter referred to as ITO), indium zinc oxide, or indium tin oxide to which silicon oxide is added.

A conductive composition including a conductive high molecule (also referred to as a conductive polymer) can be used for the pixel electrode layer 4030 and the common electrode layer 4031.

Further, a variety of signals and a potential are supplied to the signal line driver circuit 4003 which is formed separately, the scan line driver circuit 4004, and the pixel portion 4002 from an FPC 4018.

Since a thin film transistor is easily broken due to static electricity or the like, a protective circuit for protecting the driver circuit is preferably provided over the same substrate for a gate line or a source line. The protective circuit is preferably formed with a non-linear element including an oxide semiconductor.

In FIGS. 26A-1 and 26A-2 and FIG. 26B, a connecting terminal electrode 4015 is formed using the same conductive film as the pixel electrode layer 4030, and a terminal electrode 4016 is formed using the same conductive film as source and drain electrode layers of the thin film transistors 4010 and 4011.

The connection terminal electrode 4015 is electrically connected to a terminal included in the FPC 4018 via an anisotropic conductive film 4019.

Further, FIGS. 26A-1 and 26A-2 and FIG. 26B illustrate an example in which the signal line driver circuit 4003 is formed separately and mounted on the first substrate 4001; however, this embodiment is not limited to this structure. The scan line driver circuit may be separately formed and then mounted, or only part of the signal line driver circuit or part of the scan line driver circuit may be separately formed and then mounted.

Figure 27:
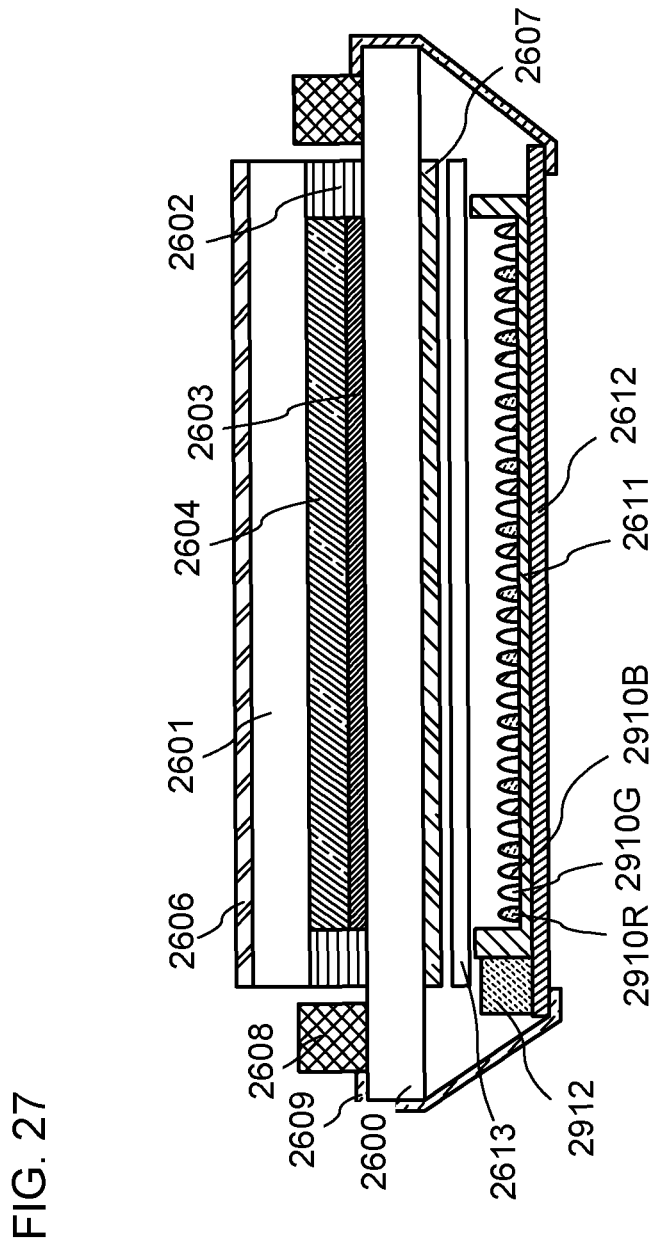
FIG. 27 is a cross-sectional view of a semiconductor device illustrating an embodiment of the present invention.

FIG. 27 illustrates an example of a cross-sectional structure of a liquid crystal display device in which an element layer 2603 including TFTs and the like and a liquid crystal layer 2604 are provided between an element substrate 2600 and a counter substrate 2601 which are bonded with a sealant 2602.

In the case where color display is performed, light-emitting diodes which emit light of plural colors are arranged in a backlight portion. In the case of an RGB mode, a red light-emitting diode 2910R, a green light-emitting diode 2910G, and a blue light-emitting diode 2910B are disposed in each of the regions into which a display area of the liquid crystal display device is divided.

A polarizing plate 2606 is provided on the outer side of the counter substrate 2601, and a polarizing plate 2607 and an optical sheet 2613 are provided on the outer side of the element substrate 2600. A light source is formed using the red light-emitting diode 2910R, the green light-emitting diode 2910G, the blue light-emitting diode 2910B, and a reflective plate 2611. An LED control circuit 2912 provided for a circuit substrate 2612 is connected to a wiring circuit portion 2608 of the element substrate 2600 through a flexible wiring board 2609 and further includes an external circuit such as a control circuit or a power source circuit.

This embodiment describes a field-sequential liquid crystal display device in which the LEDs are individually made to emit light by this LED control circuit 2912 without particular limitation. It is also possible to use a cold cathode fluorescent lamp or a white LED as a light source of the backlight and to provide a color filter.

Further, this embodiment employs an electrode structure used in an in plane switching (IPS) mode without particular limitation. A twisted nematic (TN) mode, a multi-domain vertical alignment (MVA) mode, a patterned vertical alignment (PVA) mode, an axially symmetric aligned micro-cell (ASM) mode, an optical compensated birefringence (OCB) mode, a ferroelectric liquid crystal (FLC) mode, an antiferroelectric liquid crystal (AFLC) mode, or the like can be used.

This embodiment can be implemented in an appropriate combination with any of the structures described in the other embodiments.

Embodiment 17

This embodiment describes an example of electronic paper as a semiconductor device.

Figure 28A:
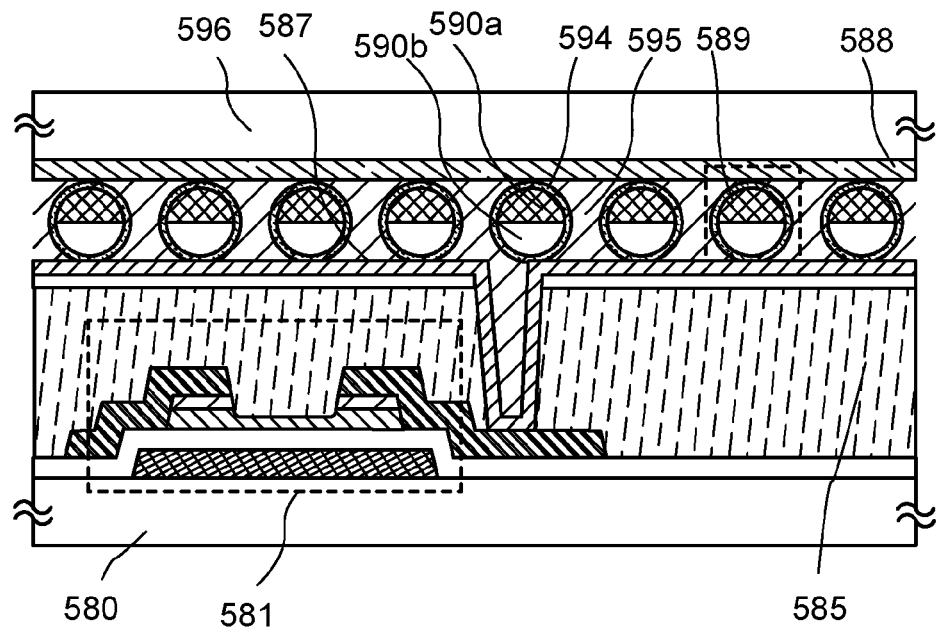
FIGS. 28A and 28B are a cross-sectional view and an external view of an electronic appliance which illustrate a semiconductor device of an embodiment of the present invention.

FIG. 28A is a cross-sectional view of active-matrix electronic paper. A thin film transistor 581 provided in a display portion of a semiconductor device can be manufactured in a manner similar to the thin film transistor described in Embodiment 2, in which an oxide semiconductor layer including silicon oxide ($SiO_x$) is used for a channel formation region and an oxide semiconductor to which nitrogen is added is used for source and drain regions.

The electronic paper in FIG. 28A is an example of a display device using a twisting ball display method. The twisting ball display system refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

The thin film transistor 581 sealed between the substrate 580 and the substrate 596 is a thin film transistor with a bottom-gate structure, and a source or drain electrode layer thereof is in contact with a first electrode layer 587 through an opening formed in insulating layer 585, whereby the thin film transistor 581 is electrically connected to the first electrode layer 587. Between the first electrode layer 587 and a second electrode layer 588, spherical particles 589 each having a black region 590a, a white region 590b, and a cavity 594 around the regions which is filled with liquid are provided. A space around the spherical particles 589 is filled with a filler 595 such as a resin (see FIG. 28A). In this embodiment, the first electrode layer 587 corresponds to a pixel electrode, and the second electrode layer 588 corresponds to a common electrode. The second electrode layer 588 is electrically connected to a common potential line provided over the same substrate as the thin film transistor 581. With the use of a common connection portion, the second electrode layer 588 can be electrically connected to the common potential line through conductive particles provided between a pair of substrates.

Further, instead of the twisting ball, an electrophoretic element can also be used. A microcapsule having a diameter of approximately 10 μm to 200 μm in which transparent liquid, positively charged white microparticles, and negatively charged black microparticles are encapsulated, is used. In the microcapsule which is provided between the first electrode layer and the second electrode layer, when an electric field is applied by the first electrode layer and the second electrode layer, the white microparticles and the black microparticles move to opposite sides, so that white or black can be displayed. A display element using this principle is an electrophoretic display element, and is generally called an electronic paper. The electrophoretic display element has higher reflectance than a liquid crystal display element, and thus, an auxiliary light is unnecessary, power consumption is low, and a display portion can be recognized in a dim place. In addition, even when power is not supplied to the display portion, an image which has been displayed once can be maintained. Accordingly, a displayed image can be stored even when a semiconductor device having a display function (which may be referred to simply as a display device or a semiconductor device provided with a display device) is distanced from an electric wave source.

With use of the thin film transistor formed by the steps described in Embodiment 2, in which an oxide semiconductor layer including silicon oxide is used for a channel formation region and an oxide semiconductor to which nitrogen is added is used for source and drain regions, electronic paper can be manufactured with reduced manufacturing cost, as a semiconductor device. Electronic paper can be used for electronic appliances of a variety of fields as long as they can display data. For example, electronic paper can be applied to an e-book reader (electronic book), a poster, an advertisement in a vehicle such as a train, or displays of various cards such as a credit card. An example of the electronic apparatus is illustrated in FIG. 28B.

Figure 28B:
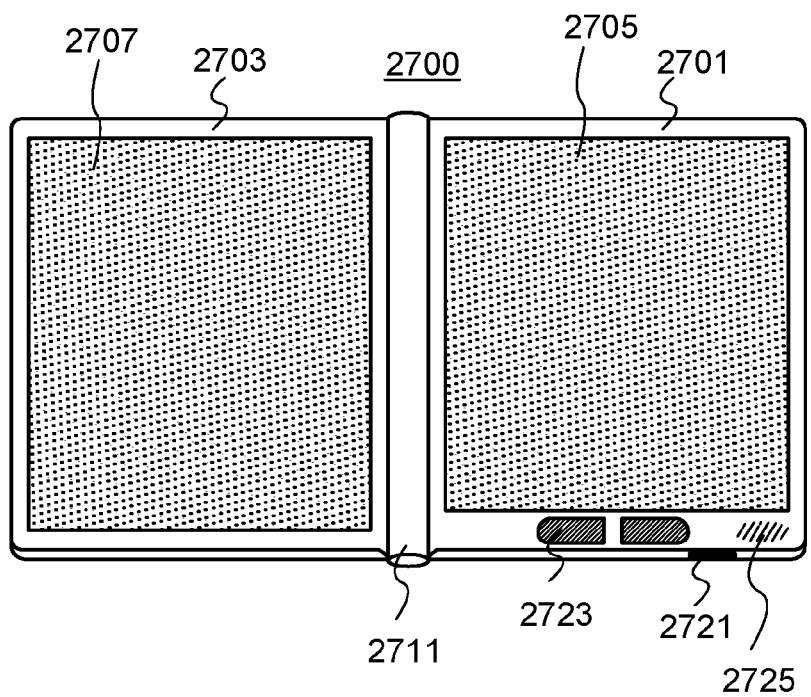

FIG. 28B illustrates an example of an e-book 2700. For example, the e-book reader 2700 includes two housings, a housing 2701 and a housing 2703. The housing 2701 and the housing 2703 are combined with a hinge 2711 so that the e-book reader 2700 can be opened and closed with the hinge 2711 as an axis. With such a structure, the e-book reader 2700 can operate like a paper book.

A display portion 2705 and a display portion 2707 are incorporated in the housing 2701 and the housing 2703, respectively. The display portion 2705 and the display portion 2707 may display one image or different images. In the case where the display portion 2705 and the display portion 2707 display different images, for example, a display portion on the right side (the display portion 2705 in FIG. 28B) can display text whereas a display portion on the left side (the display portion 2707 in FIG. 28B) can display graphics.

In the example illustrated in FIG. 28B, the housing 2701 is provided with an operation portion and the like. For example, the housing 2701 is provided with a power switch 2721, an operation key 2723, a speaker 2725, and the like. With the operation key 2723, pages can be turned. Note that a keyboard, a pointing device, and the like may be provided on the same surface as the display portion of the housing. Furthermore, an external connection terminal (an earphone terminal, a USB terminal, a terminal that can be connected to various cables such as an AC adapter and a USB cable, or the like), a recording medium insertion portion, and the like may be provided on the back surface or the side surface of the housing. Moreover, the e-book reader 2700 may have a function of an electronic dictionary.

The e-book reader 2700 may have a structure capable of wirelessly transmitting and receiving data. Through wireless communication, desired book data or the like can be purchased and downloaded from an electronic book server.

This embodiment can be implemented in an appropriate combination with any of the structures described in the other embodiments.

Embodiment 18

A semiconductor device including a thin film transistor in which an oxide semiconductor layer including silicon oxide (SiO$_x$) is used for a channel formation region and an oxide semiconductor to which nitrogen is added is used for source and drain regions can be applied to a variety of electronic appliances (including amusement machines). Examples of electronic devices are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game console, a portable information terminal, an audio reproducing device, a large-sized game machine such as a pachinko machine, and the like.

FIG. 29A illustrates an example of a television set 9600. In the television set 9600, a display portion 9603 is incorporated in a housing 9601. The display portion 9603 can display images. Here, the back of the housing 9601 is supported so that the television set 9600 is fixed to a wall.

The television set 9600 can be operated with an operation switch of the housing 9601 or a separate remote controller 9610. Channels and volume can be controlled with an operation key 9609 of the remote controller 9610 so that an image displayed on the display portion 9603 can be controlled. Furthermore, the remote controller 9610 may be provided with a display portion 9607 for displaying data output from the remote controller 9610.

Note that the television set 9600 is provided with a receiver, a modem, and the like. With the use of the receiver, general television broadcasting can be received. Moreover, when the display device is connected to a communication network with or without wires via the modem, one-way (from a sender to a receiver) or two-way (between a sender and a receiver or between receivers) information communication can be performed.

FIG. 29B is a portable amusement machine and includes two housings, a housing 9881 and a housing 9891, which are connected with a joint portion 9893 so that the portable amusement machine can be opened or folded. A display portion 9882 and a display portion 9883 are incorporated in the housing 9881 and the housing 9891, respectively. In addition, the portable amusement machine illustrated in FIG. 29B includes a speaker portion 9884, a recording medium insert portion 9886, an LED lamp 9890, an input means (an operation key 9885, a connection terminal 9887, a sensor 9888 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), or a microphone 9889), and the like. Needless to say, the structure of the portable amusement machine is not limited to the above and other structures provided with at least a semiconductor device may be employed. The portable amusement machine may include other accessory equipment, as appropriate. The portable amusement machine illustrated in FIG. 29B has a function of reading a program or data stored in a recording medium to display it on the display portion, and a function of sharing information with another portable amusement machine via wireless communication. The portable amusement machine in FIG. 29B can have various functions such as, but not limited to, a function to the above.

Figure 30A:
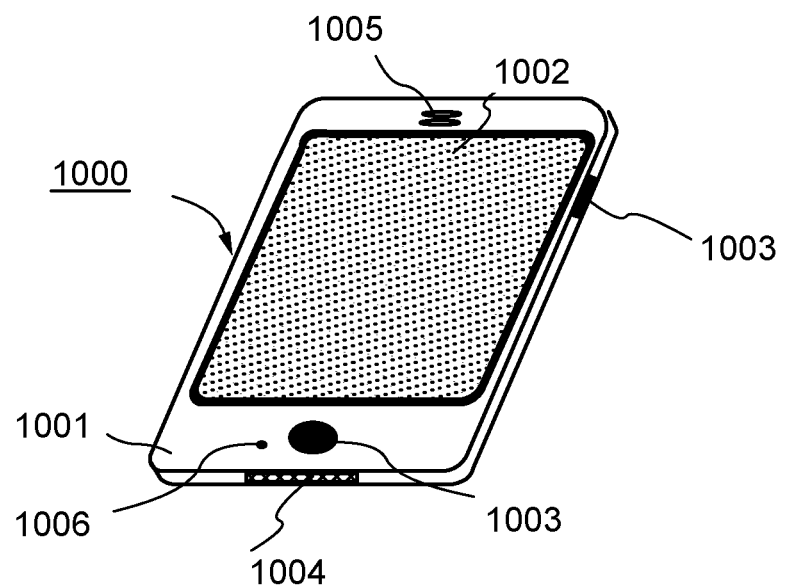
FIGS. 30A and 30B each illustrate an electronic appliance of an embodiment of the present invention.

FIG. 30A illustrates an example of a mobile phone 1000. The mobile phone 1000 includes a display portion 1002 incorporated in a housing 1001, an operation button 1003, an external connection port 1004, a speaker 1005, a microphone 1006 and the like.

Data can be input to the mobile phone 1000 illustrated in FIG. 30A by touching the display portion 1002 with a finger or the like. Furthermore, operations such as making calls and composing mails can be performed by touching the display portion 1002 with a finger or the like.

There are mainly three screen modes of the display portion 1002. The first mode is a display mode mainly for displaying images. The second mode is an input mode mainly for inputting data such as text. The third mode is a display-and-input mode in which two modes of the display mode and the input mode are combined.

For example, in a case of making a call or composing a mail, a text input mode mainly for inputting text is selected for the display portion 1002 so that text displayed on a screen can be input. In that case, it is preferable to display a keyboard or number buttons on almost all area of the screen of the display portion 1002.

When a detection device including a sensor for detecting inclination, such as a gyroscope or an acceleration sensor, is provided inside the mobile phone 1000, display in the screen of the display portion 1002 can be automatically switched by determining the installation direction of the mobile phone 1000 (whether the mobile phone 1000 is placed horizontally or vertically for a landscape mode or a portrait mode).

The screen modes are switched by touching the display portion 1002 or operating the operation button 1003 of the housing 1001. Alternatively, the screen modes may be switched in accordance with the kind of the image displayed on the display portion 1002. For example, when a signal of an image displayed on the display portion is a signal of moving image data, the screen mode is switched to the display mode. When the signal is a signal of text data, the screen mode is switched to the input mode.

Further, in the input mode, when input by touching the display portion 1002 is not performed for a certain period while a signal detected by the optical sensor in the display portion 1002 is detected, the screen mode may be controlled so as to be switched from the input mode to the display mode.

The display portion 1002 may function as an image sensor. For example, an image of a palm print, a fingerprint, or the like is taken when the display portion 1002 is touched with a palm or a finger, whereby personal identification can be performed. Further, by provision of a backlight or a sensing light source which emits a near-infrared light in the display portion, an image of a finger vein, a palm vein, or the like can be taken.

Figure 30B:
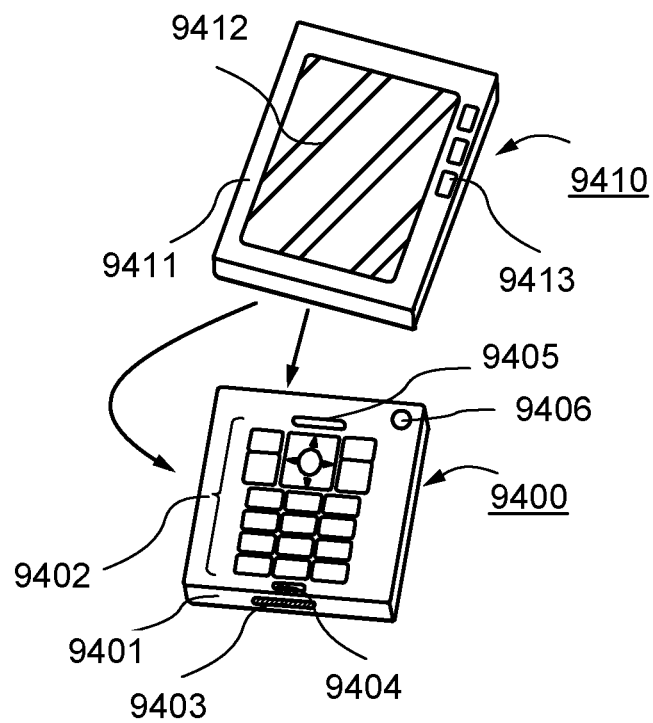

FIG. 30B also illustrates an example of a mobile phone. The mobile phone illustrated in FIG. 30B is provided with a display device 9410 having a display portion 9412 and operation buttons 9413 in a housing 9411 and a communication device 9400 having an operation buttons 9402, an external input terminal 9403, a microphone 9404, a speaker 9405, and a light-emitting portion 9406 which emits light when receiving a call in a housing 9401. The display device 9410 having a display function can be detached from or attached to the communication device 9400 having a telephone function in two directions indicated by arrows. Accordingly, the display device 9410 and the communication device 9400 can be attached to each other along their short sides or long sides. When only the display function is needed, the display device 9410 can be detached from the communication device 9400 and used alone. Images or input information can be transmitted or received by wireless or wired communication between the communication device 9400 and the display device 9410, each of which has a rechargeable battery.

This embodiment can be implemented in an appropriate combination with any of the structures described in the other embodiments.

This application is based on Japanese Patent Application serial No. 2009-077386 filed with Japan Patent Office on Mar. 26, 2009, the entire contents of which are hereby incorporated by reference.

What is claimed is:

1. A method for manufacturing a semiconductor device comprising:
    forming a gate electrode over an insulating surface;
    forming an insulating layer over the gate electrode;
    forming an oxide semiconductor layer including silicon oxide over the insulating layer by a sputtering method using a first oxide semiconductor target including silicon oxide at 2.5 wt % to 20 wt % inclusive; and
    forming an oxynitride layer over the oxide semiconductor layer including silicon oxide in an atmosphere including nitrogen using a second oxide semiconductor target to form a source region and a drain region.

2. The method for manufacturing a semiconductor device according to claim 1, further comprising a step of removing part of the oxynitride layer, which overlaps with the gate electrode so that part of the oxide semiconductor layer including silicon oxide is exposed, after forming the oxynitride layer.

3. The method for manufacturing a semiconductor device according to claim 1, wherein the semiconductor device is one selected from the group consisting of an electronic book, a television set, an amusement machine, and a phone.

4. A method for manufacturing a semiconductor device comprising:
    forming an oxide semiconductor layer over an insulating surface by a sputtering method using a first oxide semiconductor target including silicon oxide at 2.5 wt % to 20 wt % inclusive;
    forming an oxynitride layer over the oxide semiconductor layer including silicon oxide by a sputtering method using a second oxide semiconductor target in an atmosphere including nitrogen to form a source region and a drain region;
    forming an insulating layer covering the oxynitride layer; and
    forming a gate electrode over the insulating layer.

5. The method for manufacturing a semiconductor device according to claim 4, wherein the semiconductor device is one selected from the group consisting of an electronic book, a television set, an amusement machine, and a phone.

* * * * *